US010177312B2

(12) United States Patent
Parham et al.

(10) Patent No.: US 10,177,312 B2
(45) Date of Patent: Jan. 8, 2019

(54) COMPOUNDS FOR ELECTRONIC DEVICES

(75) Inventors: Amir Hossain Parham, Frankfurt am Main (DE); Arne Buesing, Frankfurt am Main (DE); Christof Pflumm, Darmstadt-Arheilgen (DE); Teresa Mujica-Fernaud, Darmstadt (DE); Philipp Stoessel, Frankfurt am Main (DE); Thomas Eberle, Landau (DE)

(73) Assignee: Merck Patent GmbH, Darmstadt (DE)

( * ) Notice: Subject to any disclaimer, the term of this patent is extended or adjusted under 35 U.S.C. 154(b) by 870 days.

(21) Appl. No.: 14/115,107

(22) PCT Filed: Apr. 12, 2012

(86) PCT No.: PCT/EP2012/001600
§ 371 (c)(1),
(2), (4) Date: Nov. 1, 2013

(87) PCT Pub. No.: WO2012/149999
PCT Pub. Date: Nov. 8, 2012

(65) Prior Publication Data
US 2014/0070146 A1    Mar. 13, 2014

(30) Foreign Application Priority Data
May 5, 2011   (EP) ..................... 11003705

(51) Int. Cl.
*H01L 51/00* (2006.01)
*C09B 17/02* (2006.01)
*C09B 19/00* (2006.01)
*C09B 21/00* (2006.01)
*C09B 57/00* (2006.01)
*C09B 57/10* (2006.01)
*H01L 51/50* (2006.01)

(52) U.S. Cl.
CPC .......... *H01L 51/0036* (2013.01); *C09B 17/02* (2013.01); *C09B 19/00* (2013.01); *C09B 21/00* (2013.01); *C09B 57/00* (2013.01); *C09B 57/10* (2013.01); *H01L 51/0035* (2013.01); *H01L 51/0067* (2013.01); *H01L 51/0071* (2013.01); *H01L 51/0072* (2013.01); *H01L 51/0094* (2013.01); *H01L 51/0081* (2013.01); *H01L 51/0085* (2013.01); *H01L 51/5012* (2013.01); *H01L 51/5016* (2013.01); *H01L 51/5072* (2013.01); *Y02E 10/549* (2013.01)

(58) Field of Classification Search
CPC .................................. H01L 51/0072
See application file for complete search history.

(56) References Cited

U.S. PATENT DOCUMENTS 8,597,802 B2   12/2013   Kim et al.
9,818,949 B2   11/2017   Yokoyama et al.
2002/0055014 A1*  5/2002   Okada ................. C09K 11/06
                                                          257/40
2008/0008907 A1   1/2008   Cho et al.
2008/0018238 A1   1/2008   Gessner et al.
2010/0066241 A1   3/2010   Cho et al.
2010/0171417 A1*  7/2010   Kitamura ............ C07D 401/10
                                                          313/504
2011/0108820 A1*  5/2011   Kobayashi ............ C07C 39/15
                                                          257/40

FOREIGN PATENT DOCUMENTS

| JP | 03-190870 A | 8/1991 | |
| JP | 11-199565 A | 7/1999 | |
| JP | 2007-070620 A | 3/2007 | |
| JP | 2008-522389 A | 6/2008 | |
| JP | 2010-013444 A | 1/2010 | |
| JP | 2010045301 A | 2/2010 | |
| JP | 2010128458 A | 6/2010 | |
| JP | 2011026376 A | 2/2011 | |
| JP | 2011-210749 A | 10/2011 | |
| KR | 20110111692 A | 10/2011 | |
| KR | 20110113469 A | 10/2011 | |
| KR | 20130112850 A | 10/2013 | |
| WO | WO 2010001982 A1 * | 1/2010 | ............ C07C 39/15 |
| WO | WO-2010001982 A1 | 1/2010 | |
| WO | WO-2010147319 A2 | 12/2010 | |

OTHER PUBLICATIONS

U.S. Appl. No. 14/115,118.
International Preliminary Report on Patentability for PCT/EP2012/001600, dated Nov. 5, 2013.
Hauck et al., "Luminescent, Redox-Active Diphenothiazine Dumbbells Expanded by Conjugated Arenes and Heteroarenes", Journal of Organic Chemistry, vol. 75, No. 24, pp. 8591-8603 (2010).
Saller et al., "Practical Synthesis of Iodo Phenothiazines. A Facile Access to Electrophore Building Blocks", Journal of Organic Chemistry, vol. 68, No. 19, pp. 7509-7512 (2013).
Hellwinkel et al., "Zweifach ortho-verbrückte Triphenylamine-Derivatives", Chemische Berichte, vol. 113, No. 1, pp. 358-384 (1980).
Japanese Office Action for Japanese Application No. 2014-508701 dated Jan. 12, 2016.
International Search Report for PCT/EP2012/001600 dated May 29, 2012.
Choi, J., et al., "Synthesis and electroluminescent properties of π-conjugated based on 10-hexylphenothiazine and aromatic 1,2,4-triazole", Synthetic Metals, 2009, vol. 159, 1922-1927.
Narule, M., et al., "Synthesis of 2-[4-(10H-substituted phenothiazine-3-yl)-6-pyrimidin-2-phenylthiol/ol/amine/thiol] pyrroles", E-Journal of Chemistry, 2007, vol. 4, No. 1, pp. 53-59.

\* cited by examiner

*Primary Examiner* — Alex A Rolland
(74) *Attorney, Agent, or Firm* — Drinker Biddle & Reath LLP

(57) ABSTRACT

The present application relates to a compound of a formula (I), to the use of this compound in an electronic device, and to an electronic device comprising one or more compounds of the formula (I). The invention furthermore relates to the preparation of the compound of the formula (I) and to a formulation comprising one or more compounds of the formula (I).

16 Claims, No Drawings

COMPOUNDS FOR ELECTRONIC DEVICES

CROSS-REFERENCE TO RELATED APPLICATIONS

This application is a national stage application (under 35 U.S.C. § 371) of PCT/EP2012/001600, filed Apr. 12, 2012, which claims benefit of European application 11003705.8, filed May 5, 2011.

The invention relates to a compound of the formula (I), to the use of this compound in an electronic device, and to an electronic device comprising one or more compounds of the formula (I). The invention furthermore relates to the preparation of the compound of the formula (I) and to a formulation comprising one or more compounds of the formula (I).

The development of novel functional compounds for use in electronic devices is currently the subject of intensive research. The aim here is the development and investigation of compounds which have hitherto not yet been employed in electronic devices and the development of compounds which enable an improved property profile of the devices.

In accordance with the present invention, the term electronic device is taken to mean, inter alia, organic integrated circuits (OICS), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and organic electroluminescent devices (OLEDs).

The structure of the above-mentioned organic electroluminescent devices (OLEDs) is known to the person skilled in the art and is described, inter alia, in U.S. Pat. No. 4,539,507, U.S. Pat. No. 5,151,629, EP 0676461 and WO 1998/27136.

Further improvements are still necessary with respect to the performance data of the organic electroluminescent devices, in particular in view of broad commercial use. Of particular importance in this connection are the lifetime, the efficiency and the operating voltage of the organic electroluminescent devices and the colour values achieved. In particular in the case of blue-emitting electroluminescent devices, there is potential for improvement with respect to the lifetime of the devices. In addition, it is desirable for the compounds for use as functional materials in electronic devices to have high thermal stability and a high glass-transition temperature and to be sublimable without decomposition.

In the area of electronic devices comprising organic materials, there is a need for matrix materials, in particular for matrix materials for phosphorescent emitters, which simultaneously result in good efficiency, a long lifetime and low operating voltage of the electronic devices. In particular, the properties of the matrix materials are frequently limiting for the lifetime and the efficiency of the organic electroluminescent device. In the case of matrix materials for phosphorescent emitters, it is desirable for them to have a high $T_1$ level (triplet level). This is particularly relevant in the case of matrix materials for blue-emitting phosphorescent emitters.

Furthermore, the provision of novel electron-transport materials is desirable, since, in particular, the properties of the electron-transport material also have a significant influence on the above-mentioned properties of the organic electroluminescent device. In particular, there is a need for electron-transport materials which simultaneously result in good efficiency, a long lifetime and low operating voltage.

In accordance with the prior art, carbazole derivatives, for example bis(carbazolyl)biphenyl, are frequently used as matrix materials for phosphorescent emitters. Ketones (WO 2004/093207), phosphine oxides, sulfones (WO 2005/003253), triazine compounds, such as triazinylspiro-bifluorene (cf. WO 2010/015306), and metal complexes, for example BAlq or zinc(II) bis[2-(2-benzothiazole)phenolate], are likewise used in this function.

The applications WO 2006/067976 and WO 2008/123189 disclose carbazole derivatives which have been derivatised with electron-deficient heterocycles, such as, for example, triazine, for use in electronic devices. However, there continues to be a need for novel compounds for use as functional materials for electronic devices. In particular, there is a need for compounds for use as matrix materials or as electron-transport materials in organic electroluminescent devices. Again in particular, there is a need for compounds with which an improvement in the performance data of the electronic device can be achieved.

The present invention is thus based on the technical object of providing compounds which are suitable for use in electronic devices, such as, for example, OLEDs, and which can be employed, in particular, as matrix materials for phosphorescent emitters and/or as electron-transport materials.

In the course of the present invention, it has now been found that compounds of the formula (I) indicated below are highly suitable for use in electronic devices, particularly as matrix materials for phosphorescent emitters and as electron-transport materials. These compounds are characterised in that they contain an electron-deficient group A which is bonded to a dihydroacridine derivative via an aromatic six-membered ring as spacer group.

The invention thus relates to a compound of a formula (I)

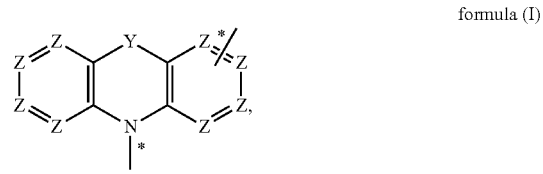

formula (I)

where a group of the formula (II)

formula (II)

is bonded via at least one of the bonds denoted by *, where * in formula (II) in turn denotes the bond to the unit of the formula (I), and where, in formula (I), for the case where no group of the formula (II) is bonded to the bond denoted by *, a radical $R^2$ is bonded there, and where the following applies to the symbols and indices occurring:

A is on each occurrence, identically or differently,
    a heteroaryl group having 5 to 20 aromatic ring atoms, which may be substituted by one or more radicals $R^1$ and which contains at least one heteroaromatic five-membered ring having two or more heteroatoms selected from N, O and S or contains at least one heteroaromatic six-membered ring having one or more heteroatoms selected from N, O and S, or a keto group, which may be substituted by one or more radicals $R^1$, or a phosphorus oxide group, which may be substituted by one or more radicals $R^1$, or a sulfur oxide group, which may be substituted by one or more radicals $R^1$;

Y is a divalent group selected from $BR^2$, $C(R^2)_2$, C=O, $Si(R^2)_2$, $NR^2$, O, S, S=O and $S(=O)_2$;

X is on each occurrence, identically or differently, $CR^1$ or N, or is C with group A bonded thereto;

Z is on each occurrence, identically or differently, $CR^2$ or N;

$Ar^1$ is an aromatic or heteroaromatic ring system having 5 to 30 aromatic ring atoms, which may be substituted by one or more radicals $R^1$;

$R^1$ is on each occurrence, identically or differently, H, D, F, Cl, Br, I, $B(OR^3)_2$, CHO, $C(=O)R^3$, $CR^3=C(R^3)_2$, CN, $C(=O)OR^3$, $C(=O)N(R^3)_2$, $Si(R^3)_3$, $NO_2$, $P(=O)(R^3)_2$, $OSO_2R^3$, $OR^3$, $S(=O)R^3$, $S(=O)_2R^3$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^3$ and where one or more $CH_2$ groups in the above-mentioned groups may be replaced by $-R^3C=CR^3-$, $-C\equiv C-$, $Si(R^3)_2$, C=O, C=S, $C=NR^3$, $-C(=O)O-$, $-C(=O)NR^3-$, $NR^3$, $P(=O)(R^3)$, $-O-$, $-S-$, SO or $SO_2$ and where one or more H atoms in the above-mentioned groups may be replaced by D, F, Cl, Br, I, CN or $NO_2$, or an aromatic ring system having 6 to 30 aromatic ring atoms, which may in each case be substituted by one or more radicals $R^3$, or an aryloxy group having 6 to 30 aromatic ring atoms, which may be substituted by one or more radicals $R^3$, where two or more radicals $R^1$ may be linked to one another and may form a ring;

$R^2$ is on each occurrence, identically or differently, H, D, F, Cl, Br, I, $B(OR^3)_2$, CHO, $C(=O)R^3$, $CR^3=C(R^3)_2$, CN, $C(=O)OR^3$, $C(=O)N(R^3)_2$, $Si(R^3)_3$, $N(R^3)_2$, $NO_2$, $P(=O)(R^3)_2$, $OSO_2R^3$, $OR^3$, $S(=O)R^3$, $S(=O)_2R^3$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^3$ and where one or more $CH_2$ groups in the above-mentioned groups may be replaced by $-R^3C=CR^3-$, $-C\equiv C-$, $Si(R^3)_2$, C=O, C=S, $C=NR^3$, $-C(=O)O-$, $-C(=O)NR^3-$, $NR^3$, $P(=O)(R^3)$, $-O-$, $-S-$, SO or $SO_2$ and where one or more H atoms in the above-mentioned groups may be replaced by D, F, Cl, Br, I, CN or $NO_2$, or an aromatic or heteroaromatic ring system having 5 to 30 aromatic ring atoms, which may in each case be substituted by one or more radicals $R^3$, or an aryloxy or heteroaryloxy group having 5 to 60 aromatic ring atoms, which may be substituted by one or more radicals $R^3$, where two or more radicals $R^2$ may be linked to one another and may form a ring;

$R^3$ is on each occurrence, identically or differently, H, D, F, Cl, Br, I, $B(OR^4)_2$, CHO, $C(=O)R^4$, $CR^4=C(R^4)_2$, CN, $C(=O)OR^4$, $C(=O)N(R^4)_2$, $Si(R^4)_3$, $N(R^4)_2$, $NO_2$, $P(=O)(R^4)_2$, $OSO_2R^4$, $OR^4$, $S(=O)R^4$, $S(=O)_2R^4$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^4$ and where one or more $CH_2$ groups in the above-mentioned groups may be replaced by $-R^4C=CR^4-$, $-C\equiv C-$, $Si(R^4)_2$, C=O, C=S, C=Se, $C=NR^4$, $-C(=O)O-$, $-C(=O)NR^4-$, $NR^4$, $P(=O)(R^4)$, $-O-$, $-S-$, SO or $SO_2$ and where one or more H atoms in the above-mentioned groups may be replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which may be substituted by one or more radicals $R^4$, where two or more radicals $R^3$ may be linked to one another and may form a ring;

$R^4$ is on each occurrence, identically or differently, H, D, F or an aliphatic, aromatic or heteroaromatic organic radical having 1 to 20 C atoms, in which, in addition, one or more H atoms may be replaced by D or F; two or more substituents $R^4$ here may be linked to one another and may form a ring;

n is on each occurrence, identically or differently, 0, 1, 2 or 3;

where radicals $R^2$ as constituents of groups Z must not form any rings condensed onto the ring system of formula (I); and where furthermore the group A is bonded to the aromatic six-membered ring in the meta- or ortho-position if the group of the formula (II) is bonded to the nitrogen atom in formula (I);

and where furthermore the following compounds are excluded:

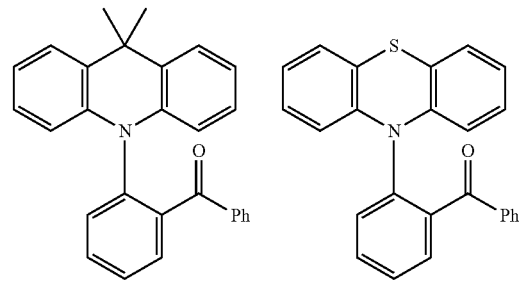

An aryl group in the sense of this invention contains 6 to 60 aromatic ring atoms; a heteroaryl group in the sense of this invention contains 5 to 60 aromatic ring atoms, at least one of which is a heteroatom. The heteroatoms are preferably selected from N, O and S. This represents the basic definition. If further preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another. It should be pointed out at this point that, in accordance with this definition, a heteroaryl group is, in particular, not taken to mean a group in which one or more non-conjugated (non-heteroaromatic) rings, such as, for example, a piperidine ring, are condensed with aromatic or heteroaromatic rings.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

For the purposes of the present invention, a keto group is taken to mean a group of the following formula (K):

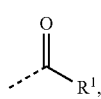

formula (K)

where $R^1$ is as defined above and the dashed bond represents the bond to the unit of formula (II). $R^1$ in formula (K) preferably represents an aromatic ring system having 6 to 30 aromatic ring atoms, which may be substituted by one or more radicals R³, or an alkyl group having 1 to 20 C atoms, in which one or more CH₂ groups may be replaced by —R³C=CR³—, —C≡C—, Si(R³)₂, C=O, C=S, C=NR³, —C(=O)O—, —C(=O)NR³—, NR³, P(=O)(R³), —O—, —S—, SO or SO₂ and in which one or more H atoms may be replaced by D, F, Cl, Br, I, CN or NO₂. R¹ in formula (K) particularly preferably represents an aromatic ring system having 6 to 24 aromatic ring atoms, which may be substituted by one or more radicals R³.

For the purposes of the present invention, a phosphorus oxide group is taken to mean a group of the following formula (P):

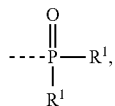

formula (P)

where R¹ is as defined above and the dashed bond represents the bond to the unit of formula (II). R¹ in formula (P) preferably represents on each occurrence, identically or differently, an aromatic ring system having 6 to 30 aromatic ring atoms, which may be substituted by one or more radicals R³, or an alkyl group having 1 to 20 C atoms, in which one or more CH₂ groups may be replaced by —R³C=CR³—, —C≡C—, Si(R³)₂, C=O, C=S, C=NR³, —C(=O)O—, —C(=O)NR³—, NR³, P(=O)(R³), —O—, —S—, SO or SO₂ and in which one or more H atoms may be replaced by D, F, Cl, Br, I, CN or NO₂. R¹ in formula (P) particularly preferably represents an aromatic ring system having 6 to 24 aromatic ring atoms, which may be substituted by one or more radicals R³.

For the purposes of the present invention, a sulfur oxide group is taken to mean a group of the following formula (S):

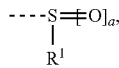

formula (S)

where R¹ is as defined above, the index a can be equal to 1 or 2 and the dashed bond represents the bond to the unit of formula (II). R¹ in formula (S) preferably represents an aromatic ring system having 6 to 30 aromatic ring atoms, which may be substituted by one or more radicals R³, or an alkyl group having 1 to 20 C atoms, in which one or more CH₂ groups may be replaced by —R³C=CR³—, —C≡C—, Si(R³)₂, C=O, C=S, C=NR³, —C(=O)O—, —C(=O) NR³—, NR³, P(=O)(R³), —O—, —S—, SO or SO₂ and in which one or more H atoms may be replaced by D, F, Cl, Br, I, CN or NO₂. R¹ in formula (S) particularly preferably represents an aromatic ring system having 6 to 24 aromatic ring atoms, which may be substituted by one or more radicals R³.

The formulation that two or more radicals may form a ring with one another is, for the purposes of the present description, intended to be taken to mean, inter alia, that the two radicals are linked to one another by a chemical bond. This is illustrated by the following scheme:

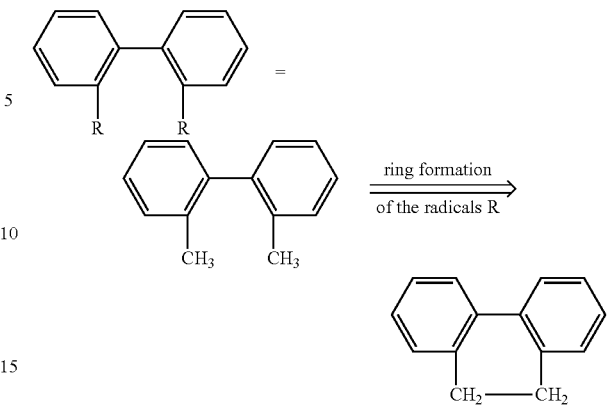

Furthermore, however, the above-mentioned formulation is also intended to be taken to mean that, in the case where one of the two radicals represents hydrogen, the second radical is bonded at the position to which the hydrogen atom was bonded, with formation of a ring. This is illustrated by the following scheme:

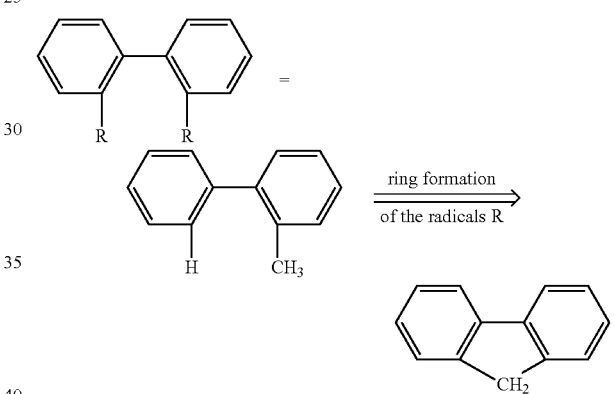

The formulation that radicals R² as constituents of groups Z cannot form rings which are condensed onto the ring system of formula (I) is, for the purposes of the present invention, taken to mean, in particular, that the ring system of formula (I) cannot be expanded by condensed-on heterocycles, such as, for example, pyrrole, indole and piperidine rings.

According to a preferred embodiment, the compound according to the invention contains no further arylamino group in addition to the arylamino group shown in formula (I). The compound according to the invention particularly preferably contains no further amino group in addition to the amino group shown in formula (I).

According to a further preferred embodiment, n has a value of 0 or 1, particularly preferably 0.

It is furthermore preferred for the group Ar¹ to represent an aromatic ring system having 6 to 18 aromatic ring atoms or a heteroaromatic ring system having 5 to 18 aromatic ring atoms, each of which may be substituted by one or more radicals R¹. The group Ar¹ particularly preferably represents an arylene group having 6 to 14 aromatic ring atoms, which may be substituted by one or more radicals R¹, very particularly preferably phenylene or naphthylene, each of which may be substituted by one or more radicals R¹.

It is furthermore preferred for the group Y to be selected from C(R²)₂, Si(R²)₂, NR², O and S. The group Y is particularly preferably equal to C(R²)₂.

It is furthermore preferred for no, one, two or three groups X per group of the formula (II) to be equal to N, where not more than two adjacent groups X are simultaneously equal to N. Particularly preferably, not more than one group X per group of the formula (II) is equal to N, very particularly preferably no group X is equal to N.

It is furthermore preferred for no, one, two or three groups Z per aromatic six-membered ring to be equal to N, where not more than two adjacent groups Z are simultaneously equal to N. Particularly preferably, not more than one group Z per aromatic six-membered ring is equal to N, very particularly preferably no group Z is equal to N.

Furthermore, $R^1$ is preferably selected on each occurrence, identically or differently, from H, D, F, CN, $Si(R^3)_3$ or a straight-chain alkyl or alkoxy group having 1 to 10 C atoms or a branched or cyclic alkyl or alkoxy group having 3 to 10 C atoms, where the above-mentioned groups may each be substituted by one or more radicals $R^3$ and where one or more $CH_2$ groups in the above-mentioned groups may be replaced by —C≡C—, —$R^3$C=C$R^3$—, $Si(R^3)_2$, C=O, C=N$R^3$, —N$R^3$—, —O—, —S—, —C(=O)O— or —C(=O)N$R^3$—, or an aromatic ring system having 6 to 24 aromatic ring atoms, which may be substituted by one or more radicals $R^3$, where two or more radicals $R^1$ may be linked to one another and may form a ring.

Furthermore, the groups $R^1$ which are not bonded to a group A are preferably equal to H.

According to a preferred embodiment, one or more of the groups $R^1$ in formula (II) which are a constituent of a group X or are bonded to a group $Ar^1$ are additionally bonded to an adjacent ring with formation of a ring.

$R^2$ is preferably selected on each occurrence, identically or differently, from H, D, F, CN, $Si(R^3)_3$, $N(R^3)_2$ or a straight-chain alkyl or alkoxy group having 1 to 10 C atoms or a branched or cyclic alkyl or alkoxy group having 3 to 10 C atoms, where the above-mentioned groups may each be substituted by one or more radicals $R^3$ and where one or more $CH_2$ groups in the above-mentioned groups may be replaced by —C≡C—, —$R^3$C=C$R^3$—, $Si(R^3)_2$, C=O, C=N$R^3$, —N$R^3$—, —O—, —S—, —C(=O)O— or —C(=O)N$R^3$—, or an aromatic or heteroaromatic ring system having 5 to 24 aromatic ring atoms, which may in each case be substituted by one or more radicals $R^3$, where two or more radicals $R^2$ may be linked to one another and may form a ring.

$R^3$ is preferably selected on each occurrence, identically or differently, from H, D, F, CN, $Si(R^4)_3$, $N(R^4)_2$ or a straight-chain alkyl or alkoxy group having 1 to 10 C atoms or a branched or cyclic alkyl or alkoxy group having 3 to 10 C atoms, where the above-mentioned groups may each be substituted by one or more radicals $R^4$ and where one or more $CH_2$ groups in the above-mentioned groups may be replaced by —C≡C—, —$R^4$C=C$R^4$—, $Si(R^4)_2$, C=O, C=N$R^4$, —N$R^4$—, —O—, —S—, —C(=O)O— or —C(=O)N$R^4$—, or an aromatic or heteroaromatic ring system having 5 to 20 aromatic ring atoms, which may in each case be substituted by one or more radicals $R^4$, where two or more radicals $R^3$ may be linked to one another and may form a ring.

In a preferred embodiment, the group of the formula (II) has a structure of the following formula (II-1):

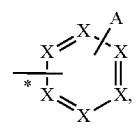

formula (II-1)

where A, $R^1$ and X are as defined above. In this case, the group A is preferably bonded to the aromatic six-membered ring in the meta- or ortho-position.

Particularly preferred embodiments of the groups of the formula (II-1) are the following formulae (II-1-1) and (II-1-2):

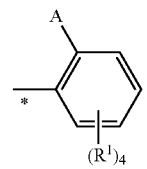

formula (II-1-1)

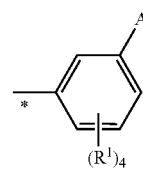

formula (II-1-2)

where A and $R^1$ are as defined above.

In a further preferred embodiment, the group of the formula (II) has a structure of the following formula (II-2):

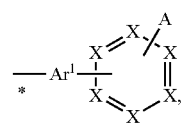

formula (II-2)

where A, $Ar^1$, $R^1$ and X are as defined above. In this case, the group A is preferably bonded to the aromatic six-membered ring in the meta- or ortho-position.

Particularly preferred embodiments of the groups of the formula (II-2) are the following formulae (II-2-1) and (II-2-2):

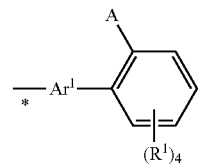

formula (II-2-1)

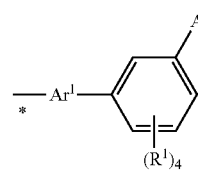

formula (II-2-2)

where A, $Ar^1$ and $R^1$ are as defined above.

In a further preferred embodiment, the group of the formula (II) has a structure of the following formula (II-3):

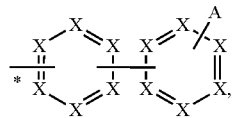

formula (II-3)

where A, $R^1$ and X are as defined above and where one or more groups $R^1$ which are bonded to one of the six-membered rings may additionally be bonded to an adjacent ring with formation of a ring. The group A in formula (II-3) is preferably bonded to the aromatic six-membered ring in the meta- or ortho-position.

Particularly preferred embodiments of the groups of the formula (II-3) are the following formulae (II-3-1) to (II-3-6):

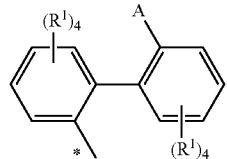

formula (II-3-1)

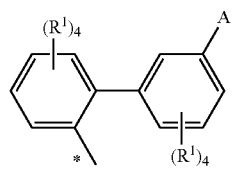

formula (II-3-2)

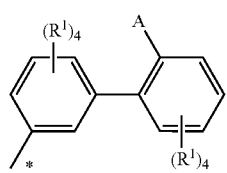

formula (II-3-3)

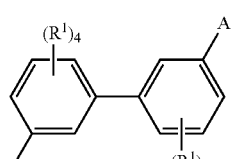

formula (II-3-4)

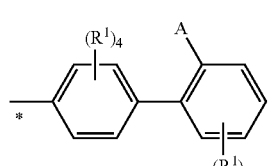

formula (II-3-5)

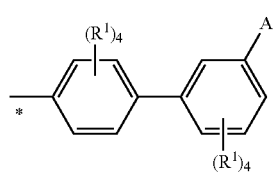

formula (II-3-6)

where A and $R^1$ are as defined above.

In a further preferred embodiment, the group of the formula (II) has a structure of the following formula (II-4):

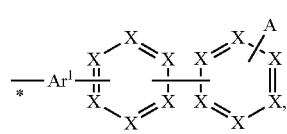

formula (II-4)

where A, $Ar^1$, $R^1$ and X are as defined above and where one or more groups $R^1$ which are bonded to one of the six-membered rings may additionally be bonded to an adjacent ring with formation of a ring. The group A in formula (II-4) is preferably bonded to the aromatic six-membered ring in the meta- or ortho-position.

Particularly preferred embodiments of the groups of the formula (II-4) are the following formulae (II-4-1) to (II-4-6):

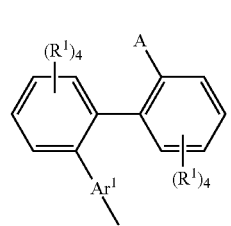

formula (II-4-1)

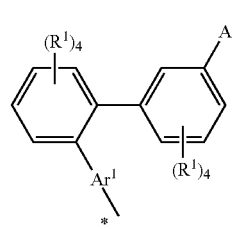

formula (II-4-2)

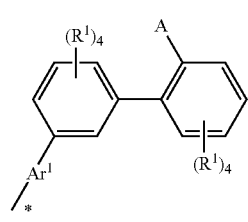

formula (II-4-3)

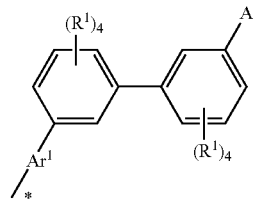

formula (II-4-4)

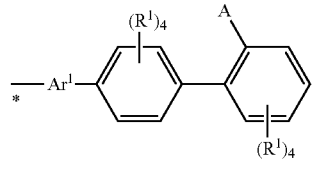

formula (II-4-5)

formula (II-4-6)

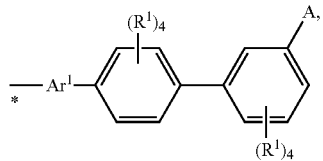

where A and Ar¹ and R¹ are as defined above.

In a further preferred embodiment, the group of the formula (II) has a structure of the following formula (II-5):

formula (II-5)

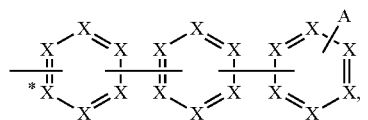

where A, R¹ and X are as defined above and where one or more groups R¹ which are bonded to one of the six-membered rings may additionally be bonded to an adjacent ring with formation of a ring. The group A in formula (II-5) is preferably bonded to the aromatic six-membered ring in the meta- or ortho-position.

Particularly preferred embodiments of the groups of the formula (II-5) are the following formulae (II-5-1) to (II-5-18):

formula (II-5-1)

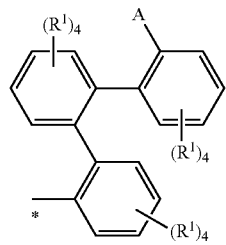

formula (II-5-2)

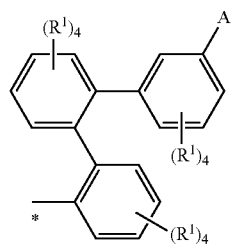

formula (II-5-3)

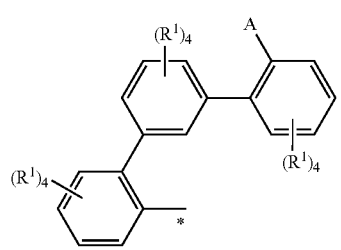

formula (II-5-4)

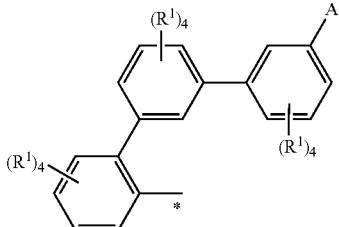

formula (II-5-5)

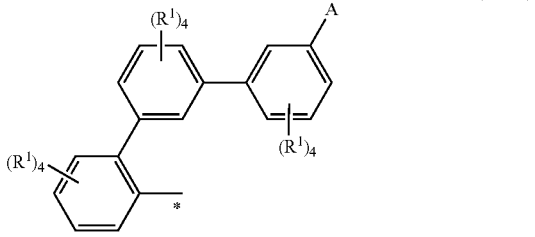

formula (II-5-6)

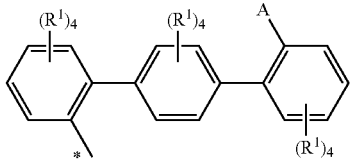

formula (II-5-7)

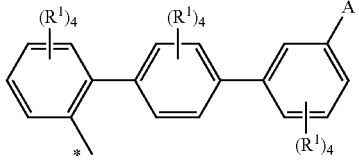

formula (II-5-8)

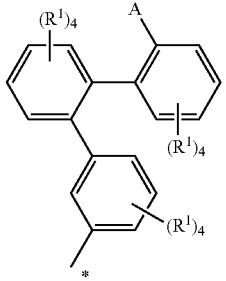

formula (II-5-9)

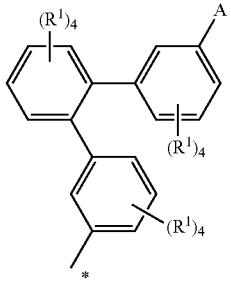

formula (II-5-10)
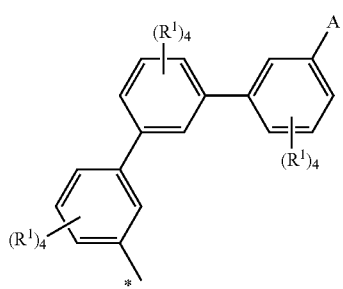
formula (II-5-11)
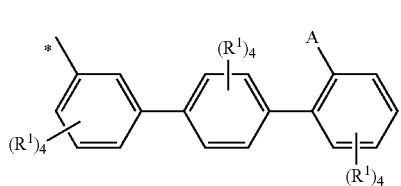
formula (II-5-12)
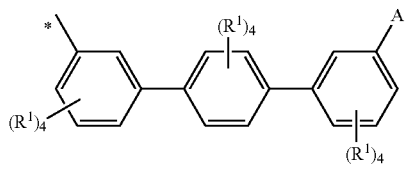
formula (II-5-13)
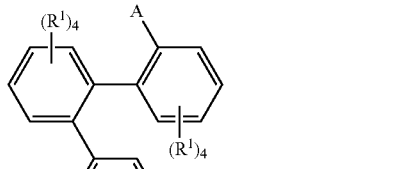
formula (II-5-14)
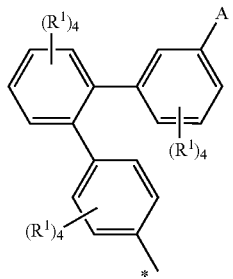
formula (II-5-15)
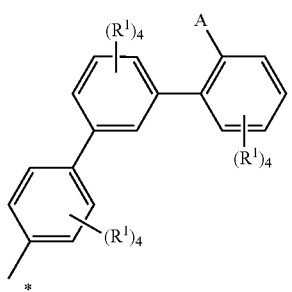
formula (II-5-16)
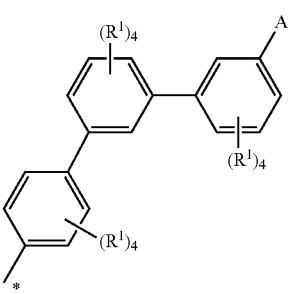
formula (II-5-17)
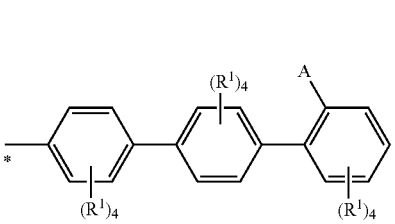
formula (II-5-18)
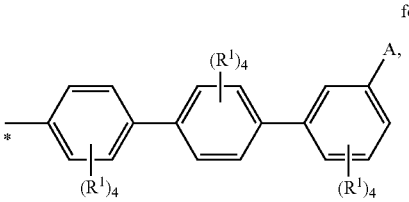
where A and R¹ are as defined above.
The group A preferably represents a group of the formulae (K), (P) or (S) defined above or a group of the formula (A-1) to (A-9):
formula (A-1)
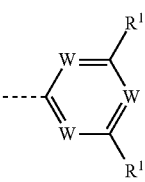
formula (A-2)
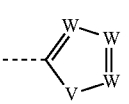
formula (A-3)
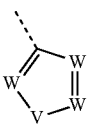
formula (A-4)
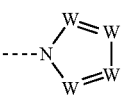
formula (A-5)
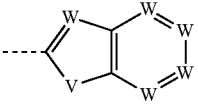

-continued

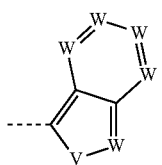
formula (A-6)

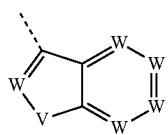
formula (A-7)

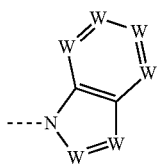
formula (A-8)

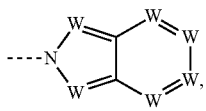
formula (A-9)

where the dashed bond represents the bond to the unit of the formula (II), $R^1$ is as defined above and W represents on each occurrence, identically or differently, $CR^1$ or N, and V represents $NR^1$, O or S, and where at least one group W is equal to N.

Furthermore, the compound according to the invention preferably has a structure of one of the following formulae (I-1) to (I-10):

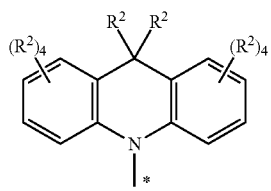
formula (I-1)

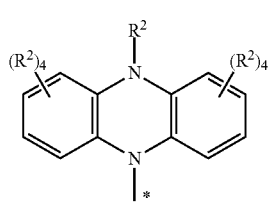
formula (I-2)

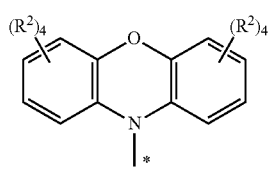
formula (I-3)

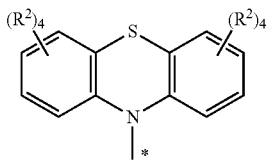
formula (I-4)

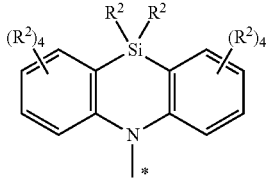
formula (I-5)

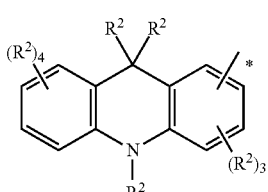
formula (I-6)

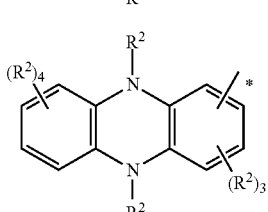
formula (I-7)

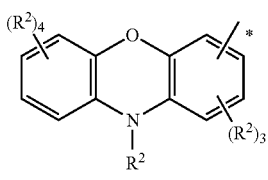
formula (I-8)

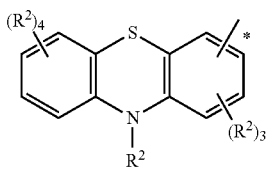
formula (I-9)

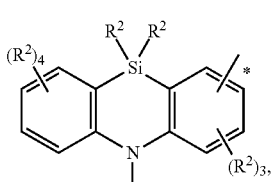
formula (I-10)

where a group of the formula (II) is bonded via the bond denoted by *, preferably in one of the preferred embodiments indicated above, and where furthermore $R^2$ is as defined above.

For the units of the formula (I-6) to (I-10), the group of the formula (II) is particularly preferably bonded in the para-position to the group $NR^2$.

Preference is furthermore given to the combination of all above-mentioned preferred embodiments of the individual variable groups.

Preference is furthermore given to the embodiments of compounds according to the invention shown in the following table which have a structure of the formula (I-1) to (I-10), which contain a group of the formula (II-1), (II-2), (II-3), (II-4) or (II-5) as group of the formula (II), and which contain a unit of the formula (P), (K), (S) or (A-1) to (A-9) as group A, where A is bonded in the meta- or ortho-position.

|  | Compound of the formula | Group of the formula (II) | Group A |
|---|---|---|---|
| (I-1-1) | (I-1) | (II-1) | (P) |
| (I-1-2) | (I-1) | (II-1) | (K) |
| (I-1-3) | (I-1) | (II-1) | (S) |
| (I-1-4) | (I-1) | (II-1) | (A-1) |
| (I-1-5) | (I-1) | (II-1) | (A-2) |
| (I-1-6) | (I-1) | (II-1) | (A-3) |
| (I-1-7) | (I-1) | (II-1) | (A-4) |
| (I-1-8) | (I-1) | (II-1) | (A-5) |
| (I-1-9) | (I-1) | (II-1) | (A-6) |
| (I-1-10) | (I-1) | (II-1) | (A-7) |
| (I-1-11) | (I-1) | (II-1) | (A-8) |
| (I-1-12) | (I-1) | (II-1) | (A-9) |
| (I-1-13) | (I-1) | (II-2) | (P) |
| (I-1-14) | (I-1) | (II-2) | (K) |
| (I-1-15) | (I-1) | (II-2) | (S) |
| (I-1-16) | (I-1) | (II-2) | (A-1) |
| (I-1-17) | (I-1) | (II-2) | (A-2) |
| (I-1-18) | (I-1) | (II-2) | (A-3) |
| (I-1-19) | (I-1) | (II-2) | (A-4) |
| (I-1-20) | (I-1) | (II-2) | (A-5) |
| (I-1-21) | (I-1) | (II-2) | (A-6) |
| (I-1-22) | (I-1) | (II-2) | (A-7) |
| (I-1-23) | (I-1) | (II-2) | (A-8) |
| (I-1-24) | (I-1) | (II-2) | (A-9) |
| (I-1-25) | (I-1) | (II-3) | (P) |
| (I-1-26) | (I-1) | (II-3) | (K) |
| (I-1-27) | (I-1) | (II-3) | (S) |
| (I-1-28) | (I-1) | (II-3) | (A-1) |
| (I-1-29) | (I-1) | (II-3) | (A-2) |
| (I-1-30) | (I-1) | (II-3) | (A-3) |
| (I-1-31) | (I-1) | (II-3) | (A-4) |
| (I-1-32) | (I-1) | (II-3) | (A-5) |
| (I-1-33) | (I-1) | (II-3) | (A-6) |
| (I-1-34) | (I-1) | (II-3) | (A-7) |
| (I-1-35) | (I-1) | (II-3) | (A-8) |
| (I-1-36) | (I-1) | (II-3) | (A-9) |
| (I-1-37) | (I-1) | (II-4) | (P) |
| (I-1-38) | (I-1) | (II-4) | (K) |
| (I-1-39) | (I-1) | (II-4) | (S) |
| (I-1-40) | (I-1) | (II-4) | (A-1) |
| (I-1-41) | (I-1) | (II-4) | (A-2) |
| (I-1-42) | (I-1) | (II-4) | (A-3) |
| (I-1-43) | (I-1) | (II-4) | (A-4) |
| (I-1-44) | (I-1) | (II-4) | (A-5) |
| (I-1-45) | (I-1) | (II-4) | (A-6) |
| (I-1-46) | (I-1) | (II-4) | (A-7) |
| (I-1-47) | (I-1) | (II-4) | (A-8) |
| (I-1-48) | (I-1) | (II-4) | (A-9) |
| (I-1-49) | (I-1) | (II-5) | (P) |
| (I-1-50) | (I-1) | (II-5) | (K) |
| (I-1-51) | (I-1) | (II-5) | (S) |
| (I-1-52) | (I-1) | (II-5) | (A-1) |
| (I-1-53) | (I-1) | (II-5) | (A-2) |
| (I-1-54) | (I-1) | (II-5) | (A-3) |
| (I-1-55) | (I-1) | (II-5) | (A-4) |
| (I-1-56) | (I-1) | (II-5) | (A-5) |
| (I-1-57) | (I-1) | (II-5) | (A-6) |
| (I-1-58) | (I-1) | (II-5) | (A-7) |
| (I-1-59) | (I-1) | (II-5) | (A-8) |
| (I-1-60) | (I-1) | (II-5) | (A-9) |
| (I-2-1) | (I-2) | (II-1) | (P) |
| (I-2-2) | (I-2) | (II-1) | (K) |
| (I-2-3) | (I-2) | (II-1) | (S) |
| (I-2-4) | (I-2) | (II-1) | (A-1) |
| (I-2-5) | (I-2) | (II-1) | (A-2) |
| (I-2-6) | (I-2) | (II-1) | (A-3) |
| (I-2-7) | (I-2) | (II-1) | (A-4) |
| (I-2-8) | (I-2) | (II-1) | (A-5) |
| (I-2-9) | (I-2) | (II-1) | (A-6) |
| (I-2-10) | (I-2) | (II-1) | (A-7) |
| (I-2-11) | (I-2) | (II-1) | (A-8) |
| (I-2-12) | (I-2) | (II-1) | (A-9) |
| (I-2-13) | (I-2) | (II-2) | (P) |
| (I-2-14) | (I-2) | (II-2) | (K) |
| (I-2-15) | (I-2) | (II-2) | (S) |
| (I-2-16) | (I-2) | (II-2) | (A-1) |
| (I-2-17) | (I-2) | (II-2) | (A-2) |
| (I-2-18) | (I-2) | (II-2) | (A-3) |
| (I-2-19) | (I-2) | (II-2) | (A-4) |
| (I-2-20) | (I-2) | (II-2) | (A-5) |
| (I-2-21) | (I-2) | (II-2) | (A-6) |
| (I-2-22) | (I-2) | (II-2) | (A-7) |
| (I-2-23) | (I-2) | (II-2) | (A-8) |
| (I-2-24) | (I-2) | (II-2) | (A-9) |
| (I-2-25) | (I-2) | (II-3) | (P) |
| (I-2-26) | (I-2) | (II-3) | (K) |
| (I-2-27) | (I-2) | (II-3) | (S) |
| (I-2-28) | (I-2) | (II-3) | (A-1) |
| (I-2-29) | (I-2) | (II-3) | (A-2) |
| (I-2-30) | (I-2) | (II-3) | (A-3) |
| (I-2-31) | (I-2) | (II-3) | (A-4) |
| (I-2-32) | (I-2) | (II-3) | (A-5) |
| (I-2-33) | (I-2) | (II-3) | (A-6) |
| (I-2-34) | (I-2) | (II-3) | (A-7) |
| (I-2-35) | (I-2) | (II-3) | (A-8) |
| (I-2-36) | (I-2) | (II-3) | (A-9) |
| (I-2-37) | (I-2) | (II-4) | (P) |
| (I-2-38) | (I-2) | (II-4) | (K) |
| (I-2-39) | (I-2) | (II-4) | (S) |
| (I-2-40) | (I-2) | (II-4) | (A-1) |
| (I-2-41) | (I-2) | (II-4) | (A-2) |
| (I-2-42) | (I-2) | (II-4) | (A-3) |
| (I-2-43) | (I-2) | (II-4) | (A-4) |
| (I-2-44) | (I-2) | (II-4) | (A-5) |
| (I-2-45) | (I-2) | (II-4) | (A-6) |
| (I-2-46) | (I-2) | (II-4) | (A-7) |
| (I-2-47) | (I-2) | (II-4) | (A-8) |
| (I-2-48) | (I-2) | (II-4) | (A-9) |
| (I-2-49) | (I-2) | (II-5) | (P) |
| (I-2-50) | (I-2) | (II-5) | (K) |
| (I-2-51) | (I-2) | (II-5) | (S) |
| (I-2-52) | (I-2) | (II-5) | (A-1) |
| (I-2-53) | (I-2) | (II-5) | (A-2) |
| (I-2-54) | (I-2) | (II-5) | (A-3) |
| (I-2-55) | (I-2) | (II-5) | (A-4) |
| (I-2-56) | (I-2) | (II-5) | (A-5) |
| (I-2-57) | (I-2) | (II-5) | (A-6) |
| (I-2-58) | (I-2) | (II-5) | (A-7) |
| (I-2-59) | (I-2) | (II-5) | (A-8) |
| (I-2-60) | (I-2) | (II-5) | (A-9) |
| (I-3-1) | (I-3) | (II-1) | (P) |
| (I-3-2) | (I-3) | (II-1) | (K) |
| (I-3-3) | (I-3) | (II-1) | (S) |
| (I-3-4) | (I-3) | (II-1) | (A-1) |
| (I-3-5) | (I-3) | (II-1) | (A-2) |
| (I-3-6) | (I-3) | (II-1) | (A-3) |
| (I-3-7) | (I-3) | (II-1) | (A-4) |
| (I-3-8) | (I-3) | (II-1) | (A-5) |
| (I-3-9) | (I-3) | (II-1) | (A-6) |
| (I-3-10) | (I-3) | (II-1) | (A-7) |
| (I-3-11) | (I-3) | (II-1) | (A-8) |
| (I-3-12) | (I-3) | (II-1) | (A-9) |
| (I-3-13) | (I-3) | (II-2) | (P) |
| (I-3-14) | (I-3) | (II-2) | (K) |
| (I-3-15) | (I-3) | (II-2) | (S) |
| (I-3-16) | (I-3) | (II-2) | (A-1) |
| (I-3-17) | (I-3) | (II-2) | (A-2) |
| (I-3-18) | (I-3) | (II-2) | (A-3) |
| (I-3-19) | (I-3) | (II-2) | (A-4) |
| (I-3-20) | (I-3) | (II-2) | (A-5) |
| (I-3-21) | (I-3) | (II-2) | (A-6) |
| (I-3-22) | (I-3) | (II-2) | (A-7) |
| (I-3-23) | (I-3) | (II-2) | (A-8) |
| (I-3-24) | (I-3) | (II-2) | (A-9) |
| (I-3-25) | (I-3) | (II-3) | (P) |
| (I-3-26) | (I-3) | (II-3) | (K) |
| (I-3-27) | (I-3) | (II-3) | (S) |

-continued

| Compound of the formula | Group of the formula (II) | Group A |
|---|---|---|
| (I-3-28) | (I-3) | (II-3) | (A-1) |
| (I-3-29) | (I-3) | (II-3) | (A-2) |
| (I-3-30) | (I-3) | (II-3) | (A-3) |
| (I-3-31) | (I-3) | (II-3) | (A-4) |
| (I-3-32) | (I-3) | (II-3) | (A-5) |
| (I-3-33) | (I-3) | (II-3) | (A-6) |
| (I-3-34) | (I-3) | (II-3) | (A-7) |
| (I-3-35) | (I-3) | (II-3) | (A-8) |
| (I-3-36) | (I-3) | (II-3) | (A-9) |
| (I-3-37) | (I-3) | (II-4) | (P) |
| (I-3-38) | (I-3) | (II-4) | (K) |
| (I-3-39) | (I-3) | (II-4) | (S) |
| (I-3-40) | (I-3) | (II-4) | (A-1) |
| (I-3-41) | (I-3) | (II-4) | (A-2) |
| (I-3-42) | (I-3) | (II-4) | (A-3) |
| (I-3-43) | (I-3) | (II-4) | (A-4) |
| (I-3-44) | (I-3) | (II-4) | (A-5) |
| (I-3-45) | (I-3) | (II-4) | (A-6) |
| (I-3-46) | (I-3) | (II-4) | (A-7) |
| (I-3-47) | (I-3) | (II-4) | (A-8) |
| (I-3-48) | (I-3) | (II-4) | (A-9) |
| (I-3-49) | (I-3) | (II-5) | (P) |
| (I-3-50) | (I-3) | (II-5) | (K) |
| (I-3-51) | (I-3) | (II-5) | (S) |
| (I-3-52) | (I-3) | (II-5) | (A-1) |
| (I-3-53) | (I-3) | (II-5) | (A-2) |
| (I-3-54) | (I-3) | (II-5) | (A-3) |
| (I-3-55) | (I-3) | (II-5) | (A-4) |
| (I-3-56) | (I-3) | (II-5) | (A-5) |
| (I-3-57) | (I-3) | (II-5) | (A-6) |
| (I-3-58) | (I-3) | (II-5) | (A-7) |
| (I-3-59) | (I-3) | (II-5) | (A-8) |
| (I-3-60) | (I-3) | (II-5) | (A-9) |
| (I-4-1) | (I-4) | (II-1) | (P) |
| (I-4-2) | (I-4) | (II-1) | (K) |
| (I-4-3) | (I-4) | (II-1) | (S) |
| (I-4-4) | (I-4) | (II-1) | (A-1) |
| (I-4-5) | (I-4) | (II-1) | (A-2) |
| (I-4-6) | (I-4) | (II-1) | (A-3) |
| (I-4-7) | (I-4) | (II-1) | (A-4) |
| (I-4-8) | (I-4) | (II-1) | (A-5) |
| (I-4-9) | (I-4) | (II-1) | (A-6) |
| (I-4-10) | (I-4) | (II-1) | (A-7) |
| (I-4-11) | (I-4) | (II-1) | (A-8) |
| (I-4-12) | (I-4) | (II-1) | (A-9) |
| (I-4-13) | (I-4) | (II-2) | (P) |
| (I-4-14) | (I-4) | (II-2) | (K) |
| (I-4-15) | (I-4) | (II-2) | (S) |
| (I-4-16) | (I-4) | (II-2) | (A-1) |
| (I-4-17) | (I-4) | (II-2) | (A-2) |
| (I-4-18) | (I-4) | (II-2) | (A-3) |
| (I-4-19) | (I-4) | (II-2) | (A-4) |
| (I-4-20) | (I-4) | (II-2) | (A-5) |
| (I-4-21) | (I-4) | (II-2) | (A-6) |
| (I-4-22) | (I-4) | (II-2) | (A-7) |
| (I-4-23) | (I-4) | (II-2) | (A-8) |
| (I-4-24) | (I-4) | (II-2) | (A-9) |
| (I-4-25) | (I-4) | (II-3) | (P) |
| (I-4-26) | (I-4) | (II-3) | (K) |
| (I-4-27) | (I-4) | (II-3) | (S) |
| (I-4-28) | (I-4) | (II-3) | (A-1) |
| (I-4-29) | (I-4) | (II-3) | (A-2) |
| (I-4-30) | (I-4) | (II-3) | (A-3) |
| (I-4-31) | (I-4) | (II-3) | (A-4) |
| (I-4-32) | (I-4) | (II-3) | (A-5) |
| (I-4-33) | (I-4) | (II-3) | (A-6) |
| (I-4-34) | (I-4) | (II-3) | (A-7) |
| (I-4-35) | (I-4) | (II-3) | (A-8) |
| (I-4-36) | (I-4) | (II-3) | (A-9) |
| (I-4-37) | (I-4) | (II-4) | (P) |
| (I-4-38) | (I-4) | (II-4) | (K) |
| (I-4-39) | (I-4) | (II-4) | (S) |
| (I-4-40) | (I-4) | (II-4) | (A-1) |
| (I-4-41) | (I-4) | (II-4) | (A-2) |
| (I-4-42) | (I-4) | (II-4) | (A-3) |
| (I-4-43) | (I-4) | (II-4) | (A-4) |
| (I-4-44) | (I-4) | (II-4) | (A-5) |
| (I-4-45) | (I-4) | (II-4) | (A-6) |
| (I-4-46) | (I-4) | (II-4) | (A-7) |
| (I-4-47) | (I-4) | (II-4) | (A-8) |
| (I-4-48) | (I-4) | (II-4) | (A-9) |
| (I-4-49) | (I-4) | (II-5) | (P) |
| (I-4-50) | (I-4) | (II-5) | (K) |
| (I-4-51) | (I-4) | (II-5) | (S) |
| (I-4-52) | (I-4) | (II-5) | (A-1) |
| (I-4-53) | (I-4) | (II-5) | (A-2) |
| (I-4-54) | (I-4) | (II-5) | (A-3) |
| (I-4-55) | (I-4) | (II-5) | (A-4) |
| (I-4-56) | (I-4) | (II-5) | (A-5) |
| (I-4-57) | (I-4) | (II-5) | (A-6) |
| (I-4-58) | (I-4) | (II-5) | (A-7) |
| (I-4-59) | (I-4) | (II-5) | (A-8) |
| (I-4-60) | (I-4) | (II-5) | (A-9) |
| (I-5-1) | (I-5) | (II-1) | (P) |
| (I-5-2) | (I-5) | (II-1) | (K) |
| (I-5-3) | (I-5) | (II-1) | (S) |
| (I-5-4) | (I-5) | (II-1) | (A-1) |
| (I-5-5) | (I-5) | (II-1) | (A-2) |
| (I-5-6) | (I-5) | (II-1) | (A-3) |
| (I-5-7) | (I-5) | (II-1) | (A-4) |
| (I-5-8) | (I-5) | (II-1) | (A-5) |
| (I-5-9) | (I-5) | (II-1) | (A-6) |
| (I-5-10) | (I-5) | (II-1) | (A-7) |
| (I-5-11) | (I-5) | (II-1) | (A-8) |
| (I-5-12) | (I-5) | (II-1) | (A-9) |
| (I-5-13) | (I-5) | (II-2) | (P) |
| (I-5-14) | (I-5) | (II-2) | (K) |
| (I-5-15) | (I-5) | (II-2) | (S) |
| (I-5-16) | (I-5) | (II-2) | (A-1) |
| (I-5-17) | (I-5) | (II-2) | (A-2) |
| (I-5-18) | (I-5) | (II-2) | (A-3) |
| (I-5-19) | (I-5) | (II-2) | (A-4) |
| (I-5-20) | (I-5) | (II-2) | (A-5) |
| (I-5-21) | (I-5) | (II-2) | (A-6) |
| (I-5-22) | (I-5) | (II-2) | (A-7) |
| (I-5-23) | (I-5) | (II-2) | (A-8) |
| (I-5-24) | (I-5) | (II-2) | (A-9) |
| (I-5-25) | (I-5) | (II-3) | (P) |
| (I-5-26) | (I-5) | (II-3) | (K) |
| (I-5-27) | (I-5) | (II-3) | (S) |
| (I-5-28) | (I-5) | (II-3) | (A-1) |
| (I-5-29) | (I-5) | (II-3) | (A-2) |
| (I-5-30) | (I-5) | (II-3) | (A-3) |
| (I-5-31) | (I-5) | (II-3) | (A-4) |
| (I-5-32) | (I-5) | (II-3) | (A-5) |
| (I-5-33) | (I-5) | (II-3) | (A-6) |
| (I-5-34) | (I-5) | (II-3) | (A-7) |
| (I-5-35) | (I-5) | (II-3) | (A-8) |
| (I-5-36) | (I-5) | (II-3) | (A-9) |
| (I-5-37) | (I-5) | (II-4) | (P) |
| (I-5-38) | (I-5) | (II-4) | (K) |
| (I-5-39) | (I-5) | (II-4) | (S) |
| (I-5-40) | (I-5) | (II-4) | (A-1) |
| (I-5-41) | (I-5) | (II-4) | (A-2) |
| (I-5-42) | (I-5) | (II-4) | (A-3) |
| (I-5-43) | (I-5) | (II-4) | (A-4) |
| (I-5-44) | (I-5) | (II-4) | (A-5) |
| (I-5-45) | (I-5) | (II-4) | (A-6) |
| (I-5-46) | (I-5) | (II-4) | (A-7) |
| (I-5-47) | (I-5) | (II-4) | (A-8) |
| (I-5-48) | (I-5) | (II-4) | (A-9) |
| (I-5-49) | (I-5) | (II-5) | (P) |
| (I-5-50) | (I-5) | (II-5) | (K) |
| (I-5-51) | (I-5) | (II-5) | (S) |
| (I-5-52) | (I-5) | (II-5) | (A-1) |
| (I-5-53) | (I-5) | (II-5) | (A-2) |
| (I-5-54) | (I-5) | (II-5) | (A-3) |
| (I-5-55) | (I-5) | (II-5) | (A-4) |
| (I-5-56) | (I-5) | (II-5) | (A-5) |
| (I-5-57) | (I-5) | (II-5) | (A-6) |
| (I-5-58) | (I-5) | (II-5) | (A-7) |
| (I-5-59) | (I-5) | (II-5) | (A-8) |

-continued

| Compound of the formula | Group of the formula (II) | Group A |
|---|---|---|
| (I-5-60) | (I-5) | (II-5) | (A-9) |
| (I-6-1) | (I-6) | (II-1) | (P) |
| (I-6-2) | (I-6) | (II-1) | (K) |
| (I-6-3) | (I-6) | (II-1) | (S) |
| (I-6-4) | (I-6) | (II-1) | (A-1) |
| (I-6-5) | (I-6) | (II-1) | (A-2) |
| (I-6-6) | (I-6) | (II-1) | (A-3) |
| (I-6-7) | (I-6) | (II-1) | (A-4) |
| (I-6-8) | (I-6) | (II-1) | (A-5) |
| (I-6-9) | (I-6) | (II-1) | (A-6) |
| (I-6-10) | (I-6) | (II-1) | (A-7) |
| (I-6-11) | (I-6) | (II-1) | (A-8) |
| (I-6-12) | (I-6) | (II-1) | (A-9) |
| (I-6-13) | (I-6) | (II-2) | (P) |
| (I-6-14) | (I-6) | (II-2) | (K) |
| (I-6-15) | (I-6) | (II-2) | (S) |
| (I-6-16) | (I-6) | (II-2) | (A-1) |
| (I-6-17) | (I-6) | (II-2) | (A-2) |
| (I-6-18) | (I-6) | (II-2) | (A-3) |
| (I-6-19) | (I-6) | (II-2) | (A-4) |
| (I-6-20) | (I-6) | (II-2) | (A-5) |
| (I-6-21) | (I-6) | (II-2) | (A-6) |
| (I-6-22) | (I-6) | (II-2) | (A-7) |
| (I-6-23) | (I-6) | (II-2) | (A-8) |
| (I-6-24) | (I-6) | (II-2) | (A-9) |
| (I-6-25) | (I-6) | (II-3) | (P) |
| (I-6-26) | (I-6) | (II-3) | (K) |
| (I-6-27) | (I-6) | (II-3) | (S) |
| (I-6-28) | (I-6) | (II-3) | (A-1) |
| (I-6-29) | (I-6) | (II-3) | (A-2) |
| (I-6-30) | (I-6) | (II-3) | (A-3) |
| (I-6-31) | (I-6) | (II-3) | (A-4) |
| (I-6-32) | (I-6) | (II-3) | (A-5) |
| (I-6-33) | (I-6) | (II-3) | (A-6) |
| (I-6-34) | (I-6) | (II-3) | (A-7) |
| (I-6-35) | (I-6) | (II-3) | (A-8) |
| (I-6-36) | (I-6) | (II-3) | (A-9) |
| (I-6-37) | (I-6) | (II-4) | (P) |
| (I-6-38) | (I-6) | (II-4) | (K) |
| (I-6-39) | (I-6) | (II-4) | (S) |
| (I-6-40) | (I-6) | (II-4) | (A-1) |
| (I-6-41) | (I-6) | (II-4) | (A-2) |
| (I-6-42) | (I-6) | (II-4) | (A-3) |
| (I-6-43) | (I-6) | (II-4) | (A-4) |
| (I-6-44) | (I-6) | (II-4) | (A-5) |
| (I-6-45) | (I-6) | (II-4) | (A-6) |
| (I-6-46) | (I-6) | (II-4) | (A-7) |
| (I-6-47) | (I-6) | (II-4) | (A-8) |
| (I-6-48) | (I-6) | (II-4) | (A-9) |
| (I-6-49) | (I-6) | (II-5) | (P) |
| (I-6-50) | (I-6) | (II-5) | (K) |
| (I-6-51) | (I-6) | (II-5) | (S) |
| (I-6-52) | (I-6) | (II-5) | (A-1) |
| (I-6-53) | (I-6) | (II-5) | (A-2) |
| (I-6-54) | (I-6) | (II-5) | (A-3) |
| (I-6-55) | (I-6) | (II-5) | (A-4) |
| (I-6-56) | (I-6) | (II-5) | (A-5) |
| (I-6-57) | (I-6) | (II-5) | (A-6) |
| (I-6-58) | (I-6) | (II-5) | (A-7) |
| (I-6-59) | (I-6) | (II-5) | (A-8) |
| (I-6-60) | (I-6) | (II-5) | (A-9) |
| (I-7-1) | (I-7) | (II-1) | (P) |
| (I-7-2) | (I-7) | (II-1) | (K) |
| (I-7-3) | (I-7) | (II-1) | (S) |
| (I-7-4) | (I-7) | (II-1) | (A-1) |
| (I-7-5) | (I-7) | (II-1) | (A-2) |
| (I-7-6) | (I-7) | (II-1) | (A-3) |
| (I-7-7) | (I-7) | (II-1) | (A-4) |
| (I-7-8) | (I-7) | (II-1) | (A-5) |
| (I-7-9) | (I-7) | (II-1) | (A-6) |
| (I-7-10) | (I-7) | (II-1) | (A-7) |
| (I-7-11) | (I-7) | (II-1) | (A-8) |
| (I-7-12) | (I-7) | (II-1) | (A-9) |
| (I-7-13) | (I-7) | (II-2) | (P) |
| (I-7-14) | (I-7) | (II-2) | (K) |
| (I-7-15) | (I-7) | (II-2) | (S) |
| (I-7-16) | (I-7) | (II-2) | (A-1) |
| (I-7-17) | (I-7) | (II-2) | (A-2) |
| (I-7-18) | (I-7) | (II-2) | (A-3) |
| (I-7-19) | (I-7) | (II-2) | (A-4) |
| (I-7-20) | (I-7) | (II-2) | (A-5) |
| (I-7-21) | (I-7) | (II-2) | (A-6) |
| (I-7-22) | (I-7) | (II-2) | (A-7) |
| (I-7-23) | (I-7) | (II-2) | (A-8) |
| (I-7-24) | (I-7) | (II-2) | (A-9) |
| (I-7-25) | (I-7) | (II-3) | (P) |
| (I-7-26) | (I-7) | (II-3) | (K) |
| (I-7-27) | (I-7) | (II-3) | (S) |
| (I-7-28) | (I-7) | (II-3) | (A-1) |
| (I-7-29) | (I-7) | (II-3) | (A-2) |
| (I-7-30) | (I-7) | (II-3) | (A-3) |
| (I-7-31) | (I-7) | (II-3) | (A-4) |
| (I-7-32) | (I-7) | (II-3) | (A-5) |
| (I-7-33) | (I-7) | (II-3) | (A-6) |
| (I-7-34) | (I-7) | (II-3) | (A-7) |
| (I-7-35) | (I-7) | (II-3) | (A-8) |
| (I-7-36) | (I-7) | (II-3) | (A-9) |
| (I-7-37) | (I-7) | (II-4) | (P) |
| (I-7-38) | (I-7) | (II-4) | (K) |
| (I-7-39) | (I-7) | (II-4) | (S) |
| (I-7-40) | (I-7) | (II-4) | (A-1) |
| (I-7-41) | (I-7) | (II-4) | (A-2) |
| (I-7-42) | (I-7) | (II-4) | (A-3) |
| (I-7-43) | (I-7) | (II-4) | (A-4) |
| (I-7-44) | (I-7) | (II-4) | (A-5) |
| (I-7-45) | (I-7) | (II-4) | (A-6) |
| (I-7-46) | (I-7) | (II-4) | (A-7) |
| (I-7-47) | (I-7) | (II-4) | (A-8) |
| (I-7-48) | (I-7) | (II-4) | (A-9) |
| (I-7-49) | (I-7) | (II-5) | (P) |
| (I-7-50) | (I-7) | (II-5) | (K) |
| (I-7-51) | (I-7) | (II-5) | (S) |
| (I-7-52) | (I-7) | (II-5) | (A-1) |
| (I-7-53) | (I-7) | (II-5) | (A-2) |
| (I-7-54) | (I-7) | (II-5) | (A-3) |
| (I-7-55) | (I-7) | (II-5) | (A-4) |
| (I-7-56) | (I-7) | (II-5) | (A-5) |
| (I-7-57) | (I-7) | (II-5) | (A-6) |
| (I-7-58) | (I-7) | (II-5) | (A-7) |
| (I-7-59) | (I-7) | (II-5) | (A-8) |
| (I-7-60) | (I-7) | (II-5) | (A-9) |
| (I-8-1) | (I-8) | (II-1) | (P) |
| (I-8-2) | (I-8) | (II-1) | (K) |
| (I-8-3) | (I-8) | (II-1) | (S) |
| (I-8-4) | (I-8) | (II-1) | (A-1) |
| (I-8-5) | (I-8) | (II-1) | (A-2) |
| (I-8-6) | (I-8) | (II-1) | (A-3) |
| (I-8-7) | (I-8) | (II-1) | (A-4) |
| (I-8-8) | (I-8) | (II-1) | (A-5) |
| (I-8-9) | (I-8) | (II-1) | (A-6) |
| (I-8-10) | (I-8) | (II-1) | (A-7) |
| (I-8-11) | (I-8) | (II-1) | (A-8) |
| (I-8-12) | (I-8) | (II-1) | (A-9) |
| (I-8-13) | (I-8) | (II-2) | (P) |
| (I-8-14) | (I-8) | (II-2) | (K) |
| (I-8-15) | (I-8) | (II-2) | (S) |
| (I-8-16) | (I-8) | (II-2) | (A-1) |
| (I-8-17) | (I-8) | (II-2) | (A-2) |
| (I-8-18) | (I-8) | (II-2) | (A-3) |
| (I-8-19) | (I-8) | (II-2) | (A-4) |
| (I-8-20) | (I-8) | (II-2) | (A-5) |
| (I-8-21) | (I-8) | (II-2) | (A-6) |
| (I-8-22) | (I-8) | (II-2) | (A-7) |
| (I-8-23) | (I-8) | (II-2) | (A-8) |
| (I-8-24) | (I-8) | (II-2) | (A-9) |
| (I-8-25) | (I-8) | (II-3) | (P) |
| (I-8-26) | (I-8) | (II-3) | (K) |
| (I-8-27) | (I-8) | (II-3) | (S) |
| (I-8-28) | (I-8) | (II-3) | (A-1) |
| (I-8-29) | (I-8) | (II-3) | (A-2) |
| (I-8-30) | (I-8) | (II-3) | (A-3) |
| (I-8-31) | (I-8) | (II-3) | (A-4) |

| Compound of the formula | Group of the formula (II) | Group A |
| --- | --- | --- |
| (I-8-32) | (I-8) | (II-3) | (A-5) |
| (I-8-33) | (I-8) | (II-3) | (A-6) |
| (I-8-34) | (I-8) | (II-3) | (A-7) |
| (I-8-35) | (I-8) | (II-3) | (A-8) |
| (I-8-36) | (I-8) | (II-3) | (A-9) |
| (I-8-37) | (I-8) | (II-4) | (P) |
| (I-8-38) | (I-8) | (II-4) | (K) |
| (I-8-39) | (I-8) | (II-4) | (S) |
| (I-8-40) | (I-8) | (II-4) | (A-1) |
| (I-8-41) | (I-8) | (II-4) | (A-2) |
| (I-8-42) | (I-8) | (II-4) | (A-3) |
| (I-8-43) | (I-8) | (II-4) | (A-4) |
| (I-8-44) | (I-8) | (II-4) | (A-5) |
| (I-8-45) | (I-8) | (II-4) | (A-6) |
| (I-8-46) | (I-8) | (II-4) | (A-7) |
| (I-8-47) | (I-8) | (II-4) | (A-8) |
| (I-8-48) | (I-8) | (II-4) | (A-9) |
| (I-8-49) | (I-8) | (II-5) | (P) |
| (I-8-50) | (I-8) | (II-5) | (K) |
| (I-8-51) | (I-8) | (II-5) | (S) |
| (I-8-52) | (I-8) | (II-5) | (A-1) |
| (I-8-53) | (I-8) | (II-5) | (A-2) |
| (I-8-54) | (I-8) | (II-5) | (A-3) |
| (I-8-55) | (I-8) | (II-5) | (A-4) |
| (I-8-56) | (I-8) | (II-5) | (A-5) |
| (I-8-57) | (I-8) | (II-5) | (A-6) |
| (I-8-58) | (I-8) | (II-5) | (A-7) |
| (I-8-59) | (I-8) | (II-5) | (A-8) |
| (I-8-60) | (I-8) | (II-5) | (A-9) |
| (I-9-1) | (I-9) | (II-1) | (P) |
| (I-9-2) | (I-9) | (II-1) | (K) |
| (I-9-3) | (I-9) | (II-1) | (S) |
| (I-9-4) | (I-9) | (II-1) | (A-1) |
| (I-9-5) | (I-9) | (II-1) | (A-2) |
| (I-9-6) | (I-9) | (II-1) | (A-3) |
| (I-9-7) | (I-9) | (II-1) | (A-4) |
| (I-9-8) | (I-9) | (II-1) | (A-5) |
| (I-9-9) | (I-9) | (II-1) | (A-6) |
| (I-9-10) | (I-9) | (II-1) | (A-7) |
| (I-9-11) | (I-9) | (II-1) | (A-8) |
| (I-9-12) | (I-9) | (II-1) | (A-9) |
| (I-9-13) | (I-9) | (II-2) | (P) |
| (I-9-14) | (I-9) | (II-2) | (K) |
| (I-9-15) | (I-9) | (II-2) | (S) |
| (I-9-16) | (I-9) | (II-2) | (A-1) |
| (I-9-17) | (I-9) | (II-2) | (A-2) |
| (I-9-18) | (I-9) | (II-2) | (A-3) |
| (I-9-19) | (I-9) | (II-2) | (A-4) |
| (I-9-20) | (I-9) | (II-2) | (A-5) |
| (I-9-21) | (I-9) | (II-2) | (A-6) |
| (I-9-22) | (I-9) | (II-2) | (A-7) |
| (I-9-23) | (I-9) | (II-2) | (A-8) |
| (I-9-24) | (I-9) | (II-2) | (A-9) |
| (I-9-25) | (I-9) | (II-3) | (P) |
| (I-9-26) | (I-9) | (II-3) | (K) |
| (I-9-27) | (I-9) | (II-3) | (S) |
| (I-9-28) | (I-9) | (II-3) | (A-1) |
| (I-9-29) | (I-9) | (II-3) | (A-2) |
| (I-9-30) | (I-9) | (II-3) | (A-3) |
| (I-9-31) | (I-9) | (II-3) | (A-4) |
| (I-9-32) | (I-9) | (II-3) | (A-5) |
| (I-9-33) | (I-9) | (II-3) | (A-6) |
| (I-9-34) | (I-9) | (II-3) | (A-7) |
| (I-9-35) | (I-9) | (II-3) | (A-8) |
| (I-9-36) | (I-9) | (II-3) | (A-9) |
| (I-9-37) | (I-9) | (II-4) | (P) |
| (I-9-38) | (I-9) | (II-4) | (K) |
| (I-9-39) | (I-9) | (II-4) | (S) |
| (I-9-40) | (I-9) | (II-4) | (A-1) |
| (I-9-41) | (I-9) | (II-4) | (A-2) |
| (I-9-42) | (I-9) | (II-4) | (A-3) |
| (I-9-43) | (I-9) | (II-4) | (A-4) |
| (I-9-44) | (I-9) | (II-4) | (A-5) |
| (I-9-45) | (I-9) | (II-4) | (A-6) |
| (I-9-46) | (I-9) | (II-4) | (A-7) |
| (I-9-47) | (I-9) | (II-4) | (A-8) |
| (I-9-48) | (I-9) | (II-4) | (A-9) |
| (I-9-49) | (I-9) | (II-5) | (P) |
| (I-9-50) | (I-9) | (II-5) | (K) |
| (I-9-51) | (I-9) | (II-5) | (S) |
| (I-9-52) | (I-9) | (II-5) | (A-1) |
| (I-9-53) | (I-9) | (II-5) | (A-2) |
| (I-9-54) | (I-9) | (II-5) | (A-3) |
| (I-9-55) | (I-9) | (II-5) | (A-4) |
| (I-9-56) | (I-9) | (II-5) | (A-5) |
| (I-9-57) | (I-9) | (II-5) | (A-6) |
| (I-9-58) | (I-9) | (II-5) | (A-7) |
| (I-9-59) | (I-9) | (II-5) | (A-8) |
| (I-9-60) | (I-9) | (II-5) | (A-9) |
| (I-10-1) | (I-10) | (II-1) | (P) |
| (I-10-2) | (I-10) | (II-1) | (K) |
| (I-10-3) | (I-10) | (II-1) | (S) |
| (I-10-4) | (I-10) | (II-1) | (A-1) |
| (I-10-5) | (I-10) | (II-1) | (A-2) |
| (I-10-6) | (I-10) | (II-1) | (A-3) |
| (I-10-7) | (I-10) | (II-1) | (A-4) |
| (I-10-8) | (I-10) | (II-1) | (A-5) |
| (I-10-9) | (I-10) | (II-1) | (A-6) |
| (I-10-10) | (I-10) | (II-1) | (A-7) |
| (I-10-11) | (I-10) | (II-1) | (A-8) |
| (I-10-12) | (I-10) | (II-1) | (A-9) |
| (I-10-13) | (I-10) | (II-2) | (P) |
| (I-10-14) | (I-10) | (II-2) | (K) |
| (I-10-15) | (I-10) | (II-2) | (S) |
| (I-10-16) | (I-10) | (II-2) | (A-1) |
| (I-10-17) | (I-10) | (II-2) | (A-2) |
| (I-10-18) | (I-10) | (II-2) | (A-3) |
| (I-10-19) | (I-10) | (II-2) | (A-4) |
| (I-10-20) | (I-10) | (II-2) | (A-5) |
| (I-10-21) | (I-10) | (II-2) | (A-6) |
| (I-10-22) | (I-10) | (II-2) | (A-7) |
| (I-10-23) | (I-10) | (II-2) | (A-8) |
| (I-10-24) | (I-10) | (II-2) | (A-9) |
| (I-10-25) | (I-10) | (II-3) | (P) |
| (I-10-26) | (I-10) | (II-3) | (K) |
| (I-10-27) | (I-10) | (II-3) | (S) |
| (I-10-28) | (I-10) | (II-3) | (A-1) |
| (I-10-29) | (I-10) | (II-3) | (A-2) |
| (I-10-30) | (I-10) | (II-3) | (A-3) |
| (I-10-31) | (I-10) | (II-3) | (A-4) |
| (I-10-32) | (I-10) | (II-3) | (A-5) |
| (I-10-33) | (I-10) | (II-3) | (A-6) |
| (I-10-34) | (I-10) | (II-3) | (A-7) |
| (I-10-35) | (I-10) | (II-3) | (A-8) |
| (I-10-36) | (I-10) | (II-3) | (A-9) |
| (I-10-37) | (I-10) | (II-4) | (P) |
| (I-10-38) | (I-10) | (II-4) | (K) |
| (I-10-39) | (I-10) | (II-4) | (S) |
| (I-10-40) | (I-10) | (II-4) | (A-1) |
| (I-10-41) | (I-10) | (II-4) | (A-2) |
| (I-10-42) | (I-10) | (II-4) | (A-3) |
| (I-10-43) | (I-10) | (II-4) | (A-4) |
| (I-10-44) | (I-10) | (II-4) | (A-5) |
| (I-10-45) | (I-10) | (II-4) | (A-6) |
| (I-10-46) | (I-10) | (II-4) | (A-7) |
| (I-10-47) | (I-10) | (II-4) | (A-8) |
| (I-10-48) | (I-10) | (II-4) | (A-9) |
| (I-10-49) | (I-10) | (II-5) | (P) |
| (I-10-50) | (I-10) | (II-5) | (K) |
| (I-10-51) | (I-10) | (II-5) | (S) |
| (I-10-52) | (I-10) | (II-5) | (A-1) |
| (I-10-53) | (I-10) | (II-5) | (A-2) |
| (I-10-54) | (I-10) | (II-5) | (A-3) |
| (I-10-55) | (I-10) | (II-5) | (A-4) |
| (I-10-56) | (I-10) | (II-5) | (A-5) |
| (I-10-57) | (I-10) | (II-5) | (A-6) |
| (I-10-58) | (I-10) | (II-5) | (A-7) |

-continued
| | Compound of the formula | Group of the formula (II) | Group A |
|---|---|---|---|
| (I-10-59) | (I-10) | (II-5) | (A-8) |
| (I-10-60) | (I-10) | (II-5) | (A-9) |
where the symbols occurring are as defined above and are preferably present in the preferred embodiments indicated above.
Examples of compounds according to the invention are shown in the following table.
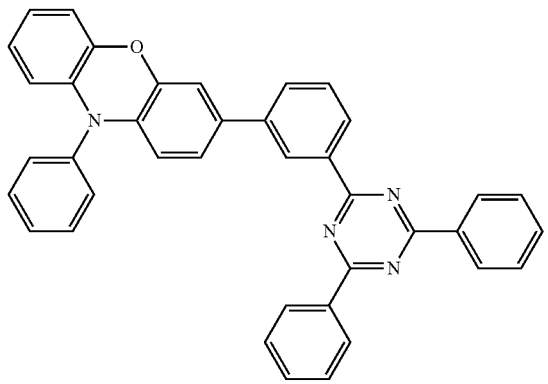 [SMILES: c1ccc(-c2nc(-c3ccccc3)nc(-c3cccc(-c4ccc5c(c4)Sc4ccccc4N5c4ccccc4)c3)n2)cc1]
1
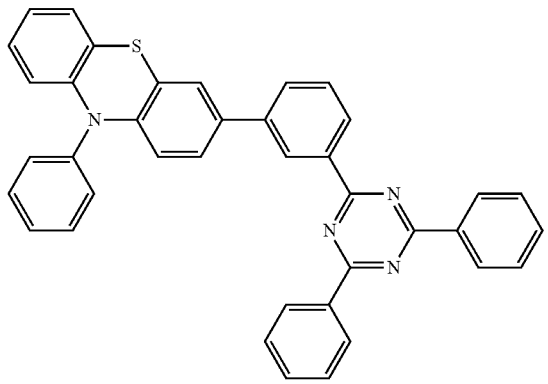
2
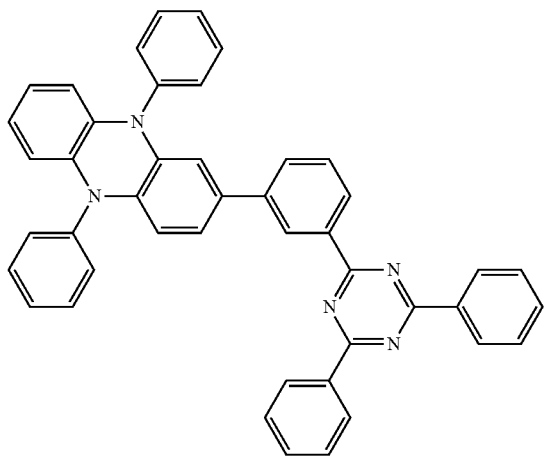 [SMILES: c1ccc(-c2nc(-c3ccccc3)nc(-c3cccc(-c4ccc5c(c4)N(c4ccccc4)c4ccccc4N5c4ccccc4)c3)n2)cc1]
3

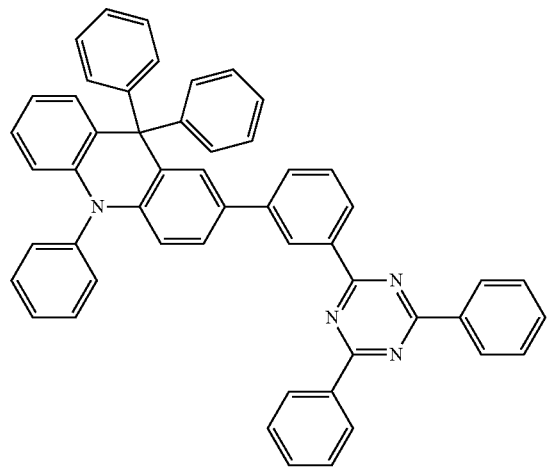 [SMILES: c1ccc(-c2nc(-c3ccccc3)nc(-c3cccc(-c4ccc5c(c4)C(c4ccccc4)(c4ccccc4)c4ccccc4N5c4ccccc4)c3)n2)cc1]
4
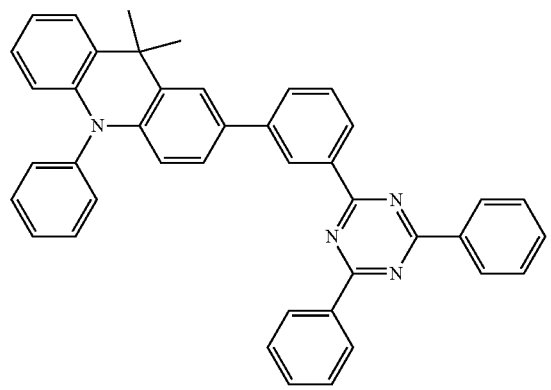 [SMILES: CC1(C)c2ccccc2N(c2ccccc2)c2ccc(-c3cccc(-c4nc(-c5ccccc5)nc(-c5ccccc5)n4)c3)cc21]
5
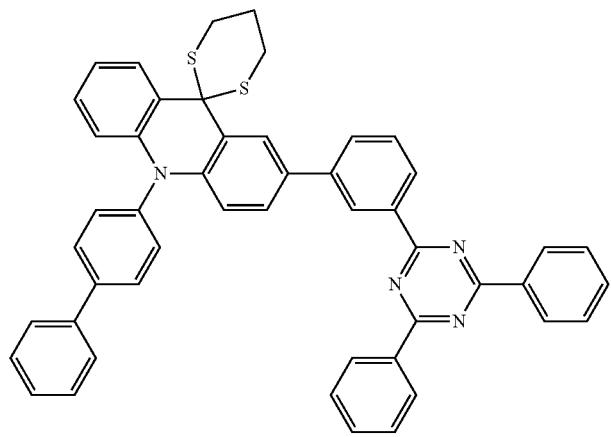 [SMILES: c1ccc(-c2ccc(N3c4ccccc4C4(SCCCS4)c4cc(-c5cccc(-c6nc(-c7ccccc7)nc(-c7ccccc7)n6)c5)ccc43)cc2)cc1]
6

-continued
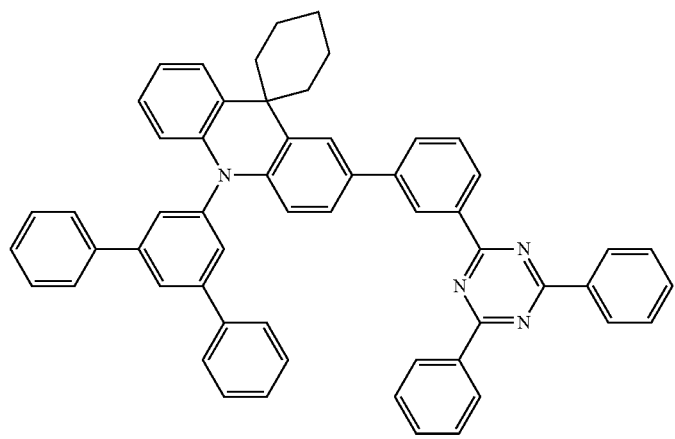 [SMILES: c1ccc(-c2cc(-c3ccccc3)cc(N3c4ccccc4C4(CCCCC4)c4cc(-c5cccc(-c6nc(-c7ccccc7)nc(-c7ccccc7)n6)c5)ccc43)c2)cc1]
7
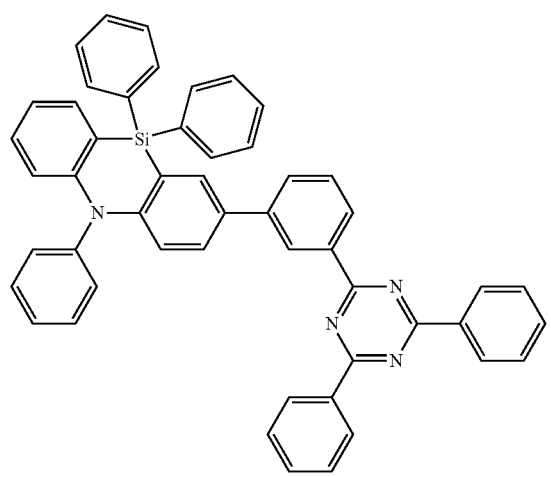
8
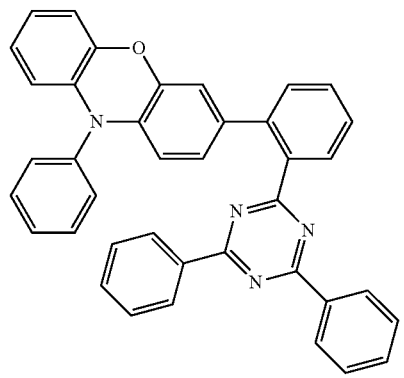 [SMILES: c1ccc(-c2nc(-c3ccccc3)nc(-c3ccccc3-c3ccc4c(c3)Oc3ccccc3N4c3ccccc3)n2)cc1]
9

-continued
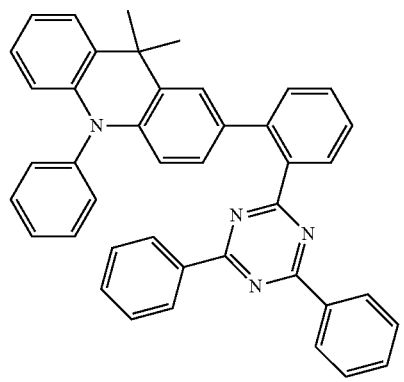 [SMILES: CC1(C)c2ccccc2N(c2ccccc2)c2ccc(-c3ccccc3-c3nc(-c4ccccc4)nc(-c4ccccc4)n3)cc21]
10
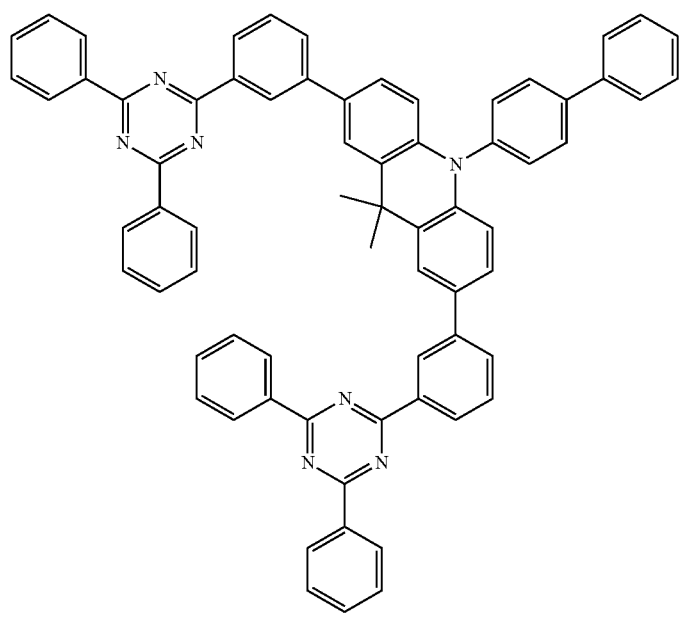 [SMILES: CC1(C)c2cc(-c3cccc(-c4nc(-c5ccccc5)nc(-c5ccccc5)n4)c3)ccc2N(c2ccc(-c3ccccc3)cc2)c2ccc(-c3cccc(-c4nc(-c5ccccc5)nc(-c5ccccc5)n4)c3)cc21]
11
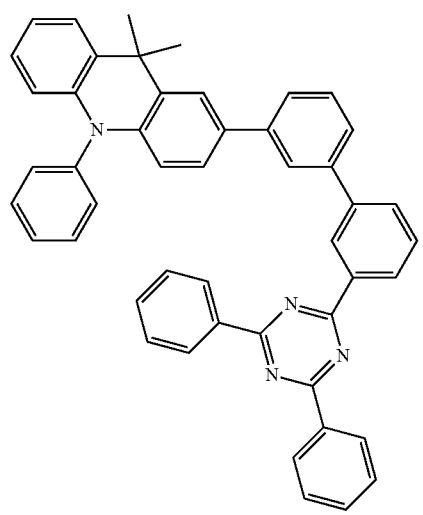 [SMILES: CC1(C)c2ccccc2N(c2ccccc2)c2ccc(-c3cccc(-c4cccc(-c5nc(-c6ccccc6)nc(-c6ccccc6)n5)c4)c3)cc21]
12

-continued
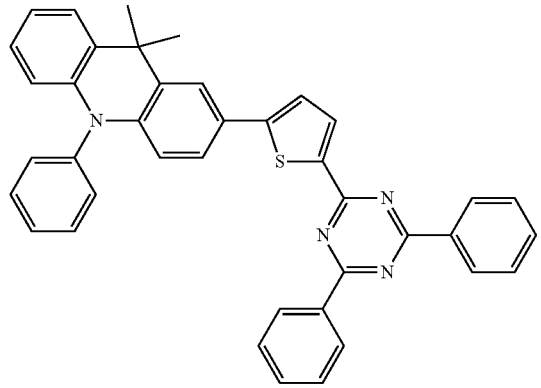 [SMILES: CC1(C)c2ccccc2N(c2ccccc2)c2ccc(-c3ccc(-c4nc(-c5ccccc5)nc(-c5ccccc5)n4)s3)cc21]
13
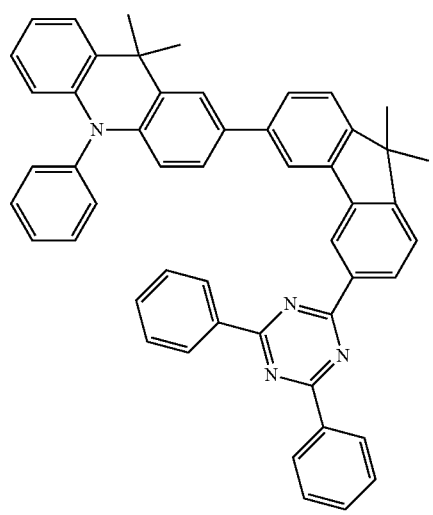 [SMILES: CC1(C)c2ccc(-c3ccc4c(c3)C(C)(C)c3ccccc3N4c3ccccc3)cc2-c2cc(-c3nc(-c4ccccc4)nc(-c4ccccc4)n3)ccc21]
14
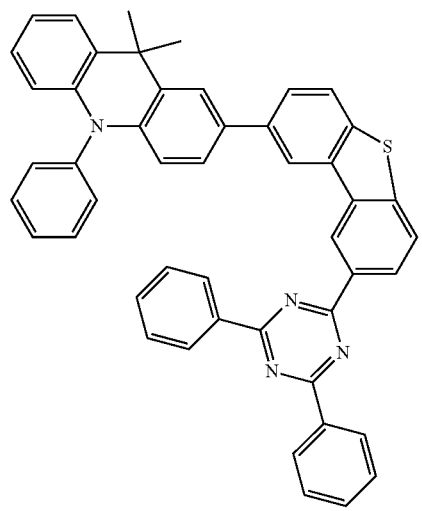 [SMILES: CC1(C)c2ccccc2N(c2ccccc2)c2ccc(-c3ccc4sc5ccc(-c6nc(-c7ccccc7)nc(-c7ccccc7)n6)cc5c4c3)cc21]
15

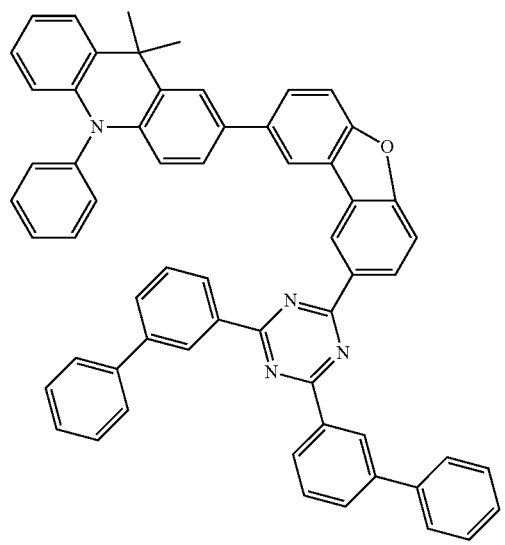 [SMILES: CC1(C)c2ccccc2N(c2ccccc2)c2ccc(-c3ccc4oc5ccc(-c6nc(-c7cccc(-c8ccccc8)c7)nc(-c7cccc(-c8ccccc8)c7)n6)cc5c4c3)cc21]
16
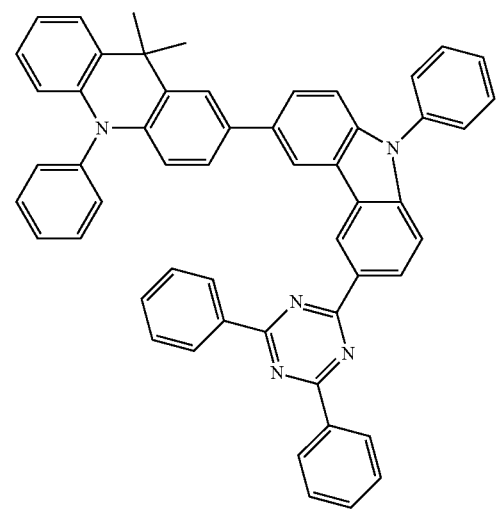 [SMILES: CC1(C)c2ccccc2N(c2ccccc2)c2ccc(-c3ccc4c(c3)c3cc(-c5nc(-c6ccccc6)nc(-c6ccccc6)n5)ccc3n4-c3ccccc3)cc21]
17
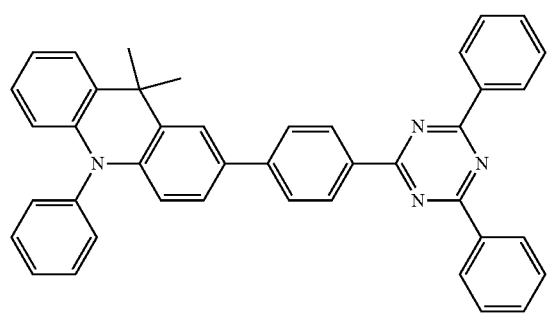 [SMILES: CC1(C)c2ccccc2N(c2ccccc2)c2ccc(-c3ccc(-c4nc(-c5ccccc5)nc(-c5ccccc5)n4)cc3)cc21]
18

19
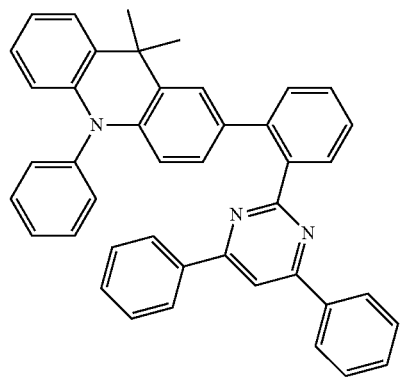 [SMILES: CC1(C)c2ccccc2N(c2ccccc2)c2ccc(-c3ccccc3-c3nc(-c4ccccc4)cc(-c4ccccc4)n3)cc21]
20
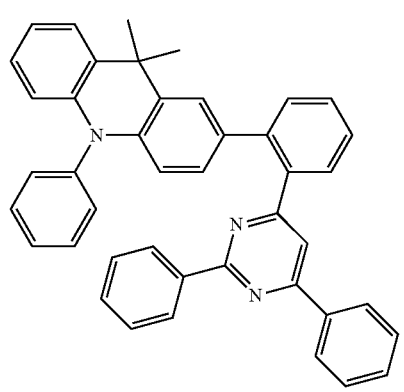 [SMILES: CC1(C)c2ccccc2N(c2ccccc2)c2ccc(-c3ccccc3-c3cc(-c4ccccc4)nc(-c4ccccc4)n3)cc21]
21
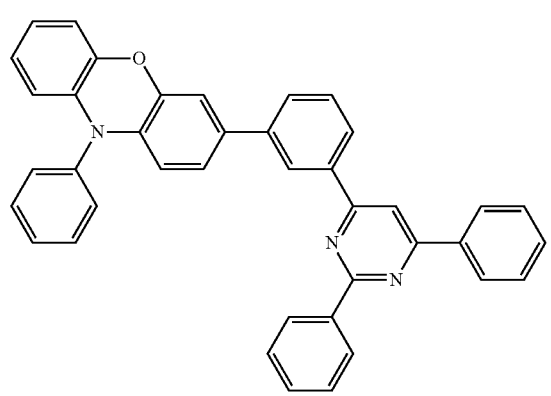 [SMILES: c1ccc(-c2cc(-c3cccc(-c4ccc5c(c4)Oc4ccccc4N5c4ccccc4)c3)nc(-c3ccccc3)n2)cc1]
22
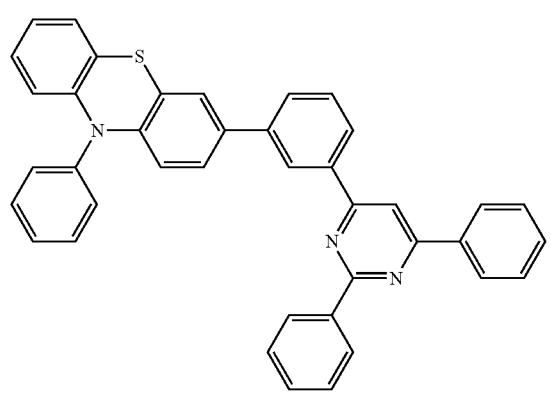

-continued
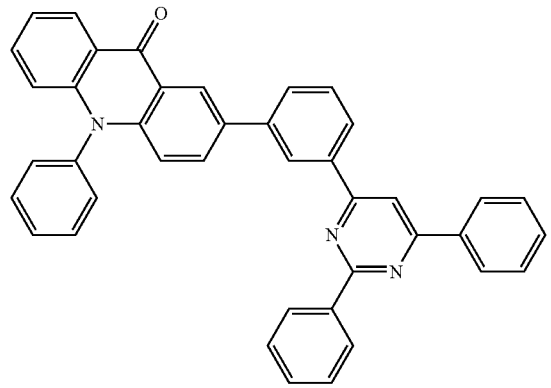 [SMILES: O=c1c2ccccc2n(-c2ccccc2)c2ccc(-c3cccc(-c4cc(-c5ccccc5)nc(-c5ccccc5)n4)c3)cc12]
23
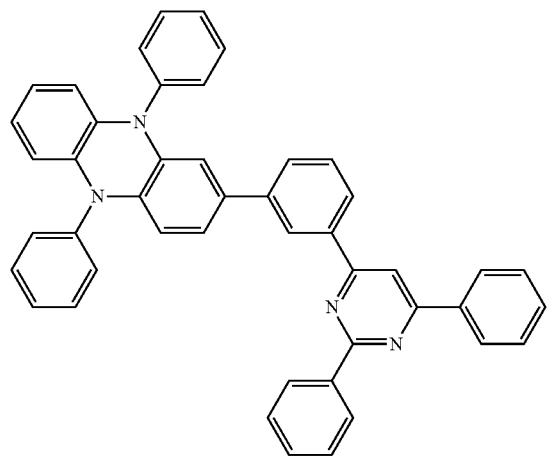 [SMILES: c1ccc(-c2cc(-c3cccc(-c4ccc5c(c4)N(c4ccccc4)c4ccccc4N5c4ccccc4)c3)nc(-c3ccccc3)n2)cc1]
24
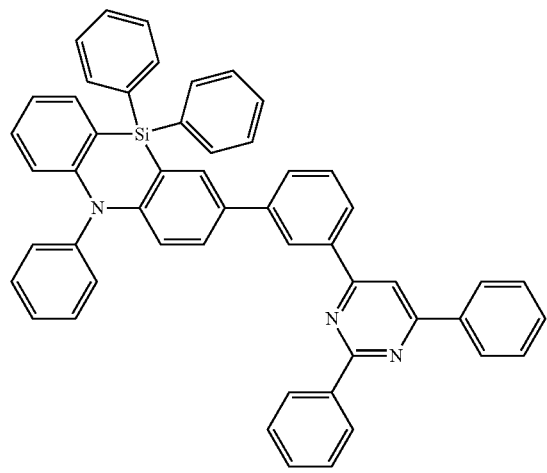
25

-continued
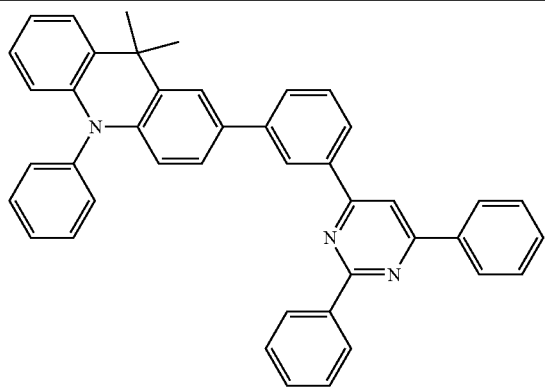
26
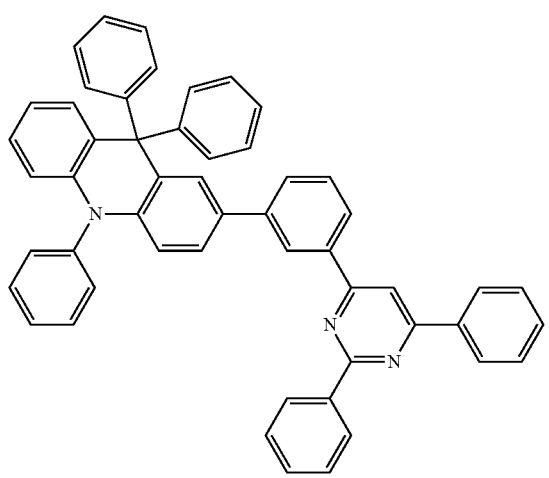 [SMILES: c1ccc(-c2cc(-c3cccc(-c4ccc5c(c4)C(c4ccccc4)(c4ccccc4)c4ccccc4N5c4ccccc4)c3)nc(-c3ccccc3)n2)cc1]
27
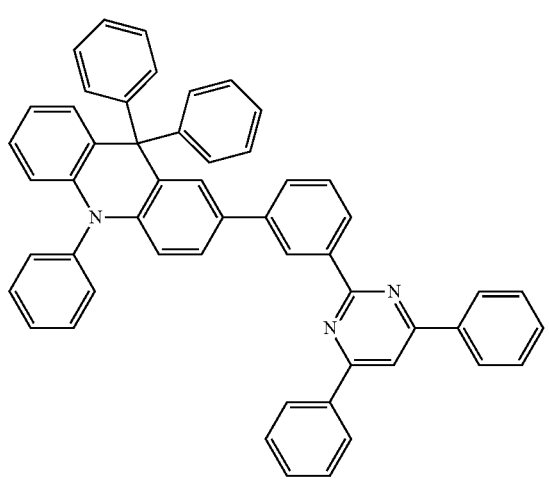 [SMILES: c1ccc(-c2cc(-c3ccccc3)nc(-c3cccc(-c4ccc5c(c4)C(c4ccccc4)(c4ccccc4)c4ccccc4N5c4ccccc4)c3)n2)cc1]
28

-continued
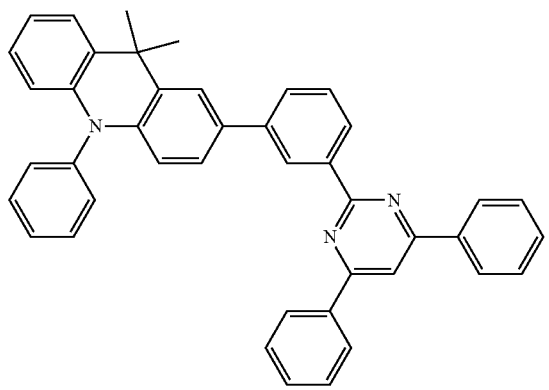 [SMILES: CC1(C)c2ccccc2N(c2ccccc2)c2ccc(-c3cccc(-c4nc(-c5ccccc5)cc(-c5ccccc5)n4)c3)cc21]
29
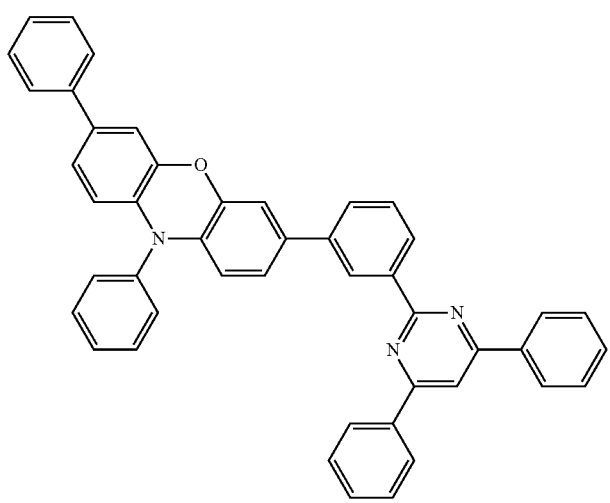 [SMILES: c1ccc(-c2ccc3c(c2)Oc2cc(-c4cccc(-c5nc(-c6ccccc6)cc(-c6ccccc6)n5)c4)ccc2N3c2ccccc2)cc1]
30
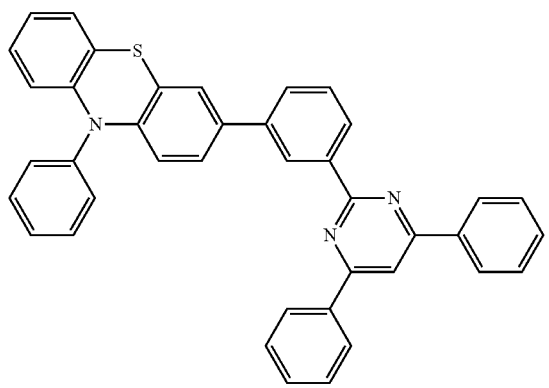 [SMILES: c1ccc(-c2cc(-c3ccccc3)nc(-c3cccc(-c4ccc5c(c4)Sc4ccccc4N5c4ccccc4)c3)n2)cc1]
31

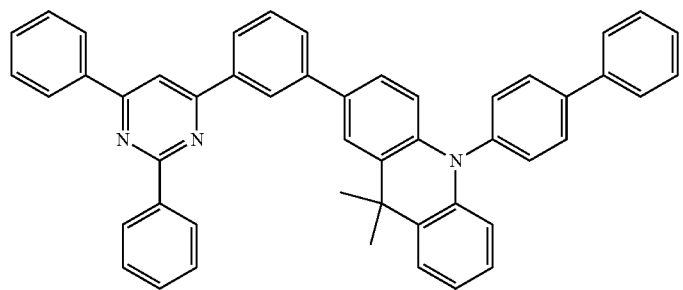
32
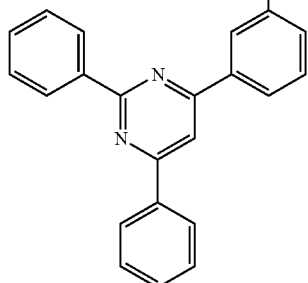
33
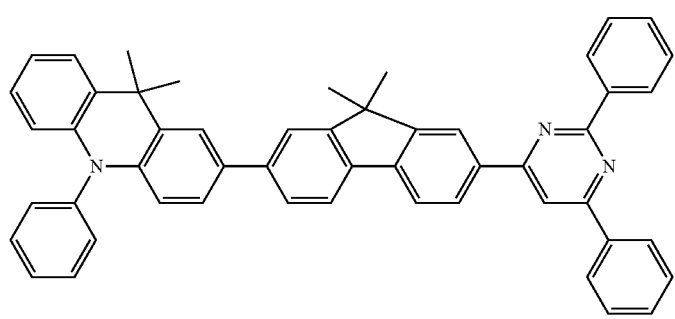 [SMILES: CC1(C)c2cc(-c3ccc4c(c3)C(C)(C)c3ccccc3N4c3ccccc3)ccc2-c2ccc(-c3cc(-c4ccccc4)nc(-c4ccccc4)n3)cc21]
34
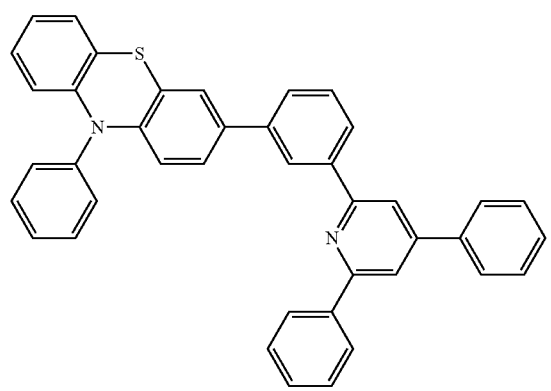 [SMILES: c1ccc(-c2cc(-c3ccccc3)nc(-c3cccc(-c4ccc5c(c4)Sc4ccccc4N5c4ccccc4)c3)c2)cc1]

-continued
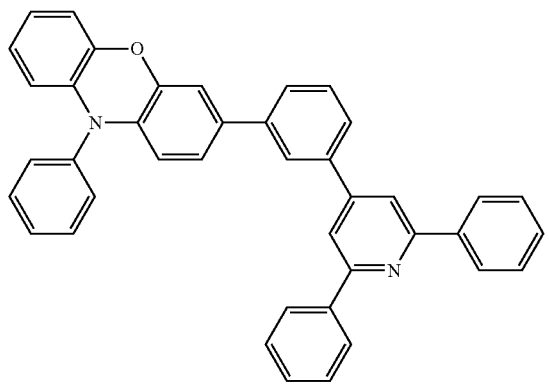 [SMILES: c1ccc(-c2cc(-c3cccc(-c4ccc5c(c4)Oc4ccccc4N5c4ccccc4)c3)cc(-c3ccccc3)n2)cc1]
35
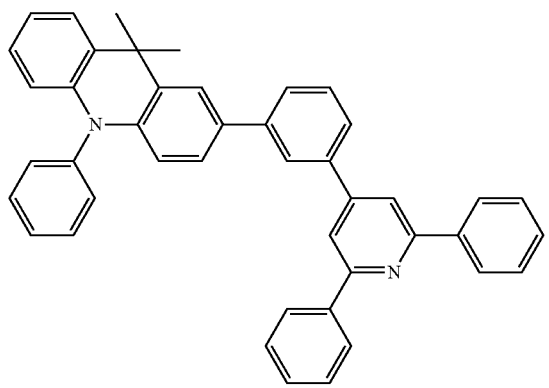 [SMILES: CC1(C)c2ccccc2N(c2ccccc2)c2ccc(-c3cccc(-c4cc(-c5ccccc5)nc(-c5ccccc5)c4)c3)cc21]
36
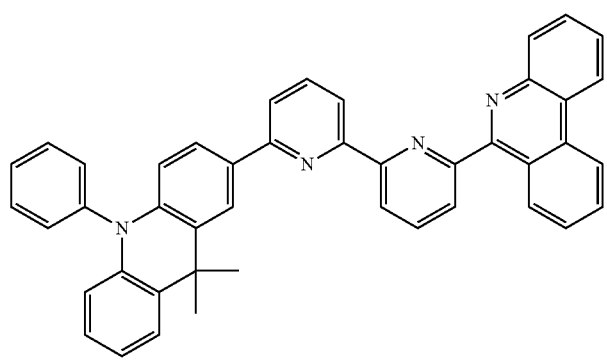 [SMILES: CC1(C)c2ccccc2N(c2ccccc2)c2ccc(-c3cccc(-c4cccc(-c5nc6ccccc6c6ccccc56)n4)n3)cc21]
37
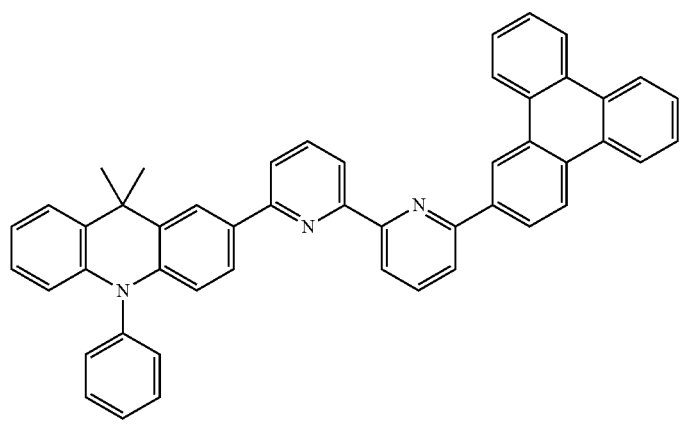 [SMILES: CC1(C)c2ccccc2N(c2ccccc2)c2ccc(-c3cccc(-c4cccc(-c5ccc6c7ccccc7c7ccccc7c6c5)n4)n3)cc21]
38

-continued
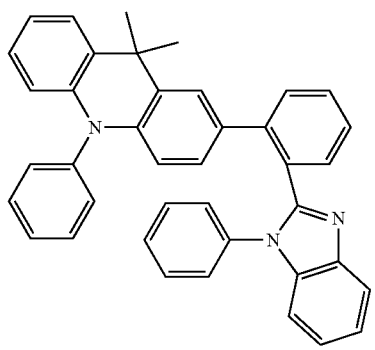 [SMILES: CC1(C)c2ccccc2N(c2ccccc2)c2ccc(-c3ccccc3-c3nc4ccccc4n3-c3ccccc3)cc21]
39
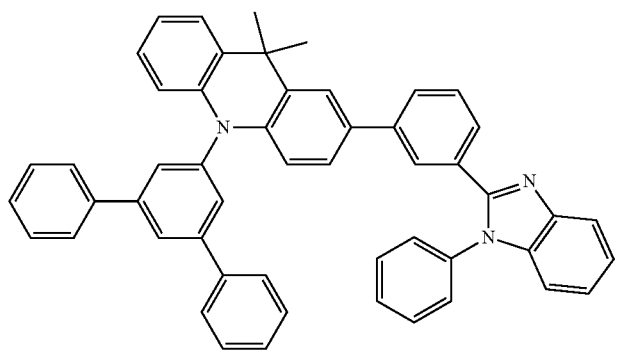 [SMILES: CC1(C)c2ccccc2N(c2cc(-c3ccccc3)cc(-c3ccccc3)c2)c2ccc(-c3cccc(-c4nc5ccccc5n4-c4ccccc4)c3)cc21]
40
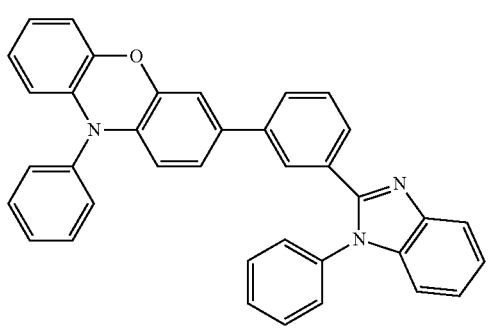 [SMILES: c1ccc(N2c3ccccc3Oc3cc(-c4cccc(-c5nc6ccccc6n5-c5ccccc5)c4)ccc32)cc1]
41
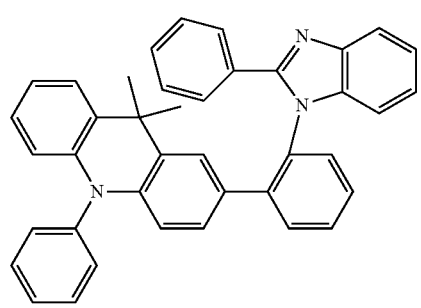 [SMILES: CC1(C)c2ccccc2N(c2ccccc2)c2ccc(-c3ccccc3-n3c(-c4ccccc4)nc4ccccc43)cc21]
42

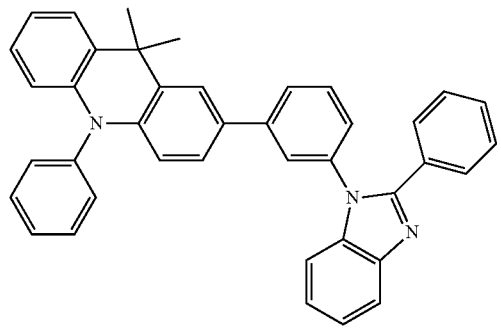 [SMILES: CC1(C)c2ccccc2N(c2ccccc2)c2ccc(-c3cccc(-n4c(-c5ccccc5)nc5ccccc54)c3)cc21]
43
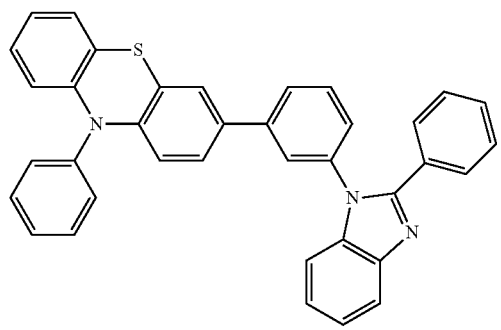 [SMILES: c1ccc(-c2nc3ccccc3n2-c2cccc(-c3ccc4c(c3)Sc3ccccc3N4c3ccccc3)c2)cc1]
44
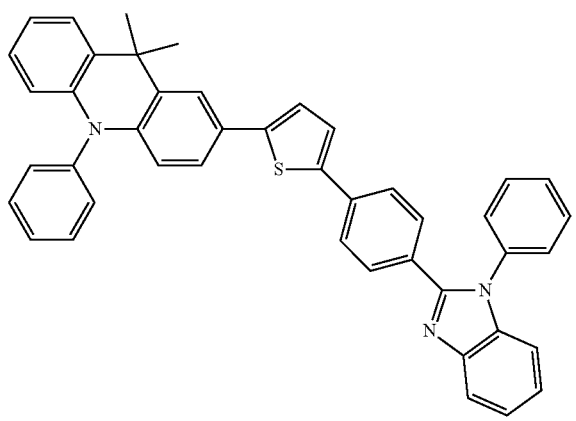 [SMILES: CC1(C)c2ccccc2N(c2ccccc2)c2ccc(-c3ccc(-c4ccc(-c5nc6ccccc6n5-c5ccccc5)cc4)s3)cc21]
45
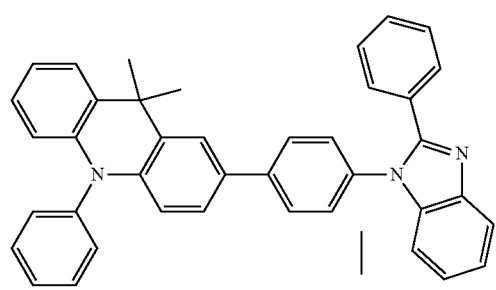
46

-continued
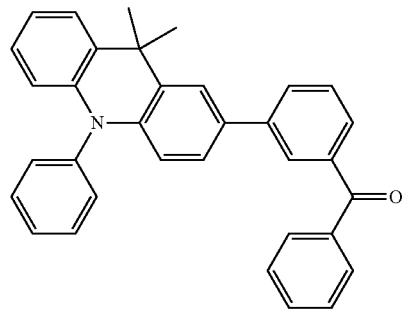 [SMILES: CC1(C)c2ccccc2N(c2ccccc2)c2ccc(-c3cccc(C(=O)c4ccccc4)c3)cc21]
47
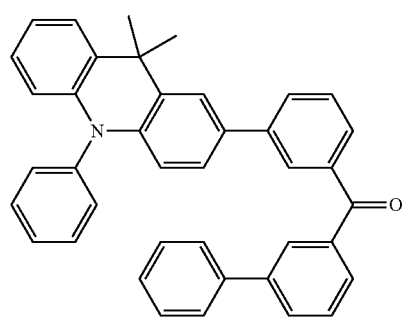 [SMILES: CC1(C)c2ccccc2N(c2ccccc2)c2ccc(-c3cccc(C(=O)c4cccc(-c5ccccc5)c4)c3)cc21]
48
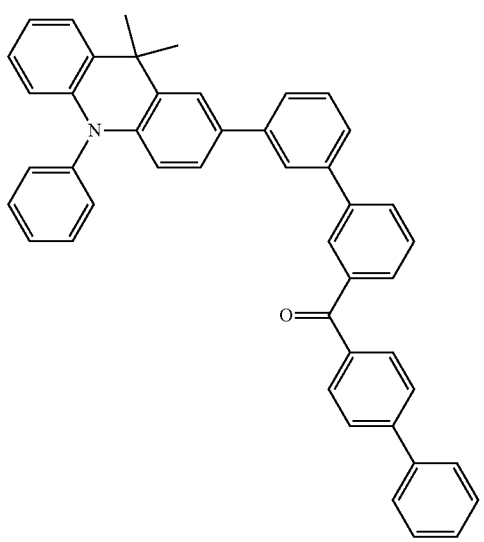 [SMILES: CC1(C)c2ccccc2N(c2ccccc2)c2ccc(-c3cccc(-c4cccc(C(=O)c5ccc(-c6ccccc6)cc5)c4)c3)cc21]
49

50
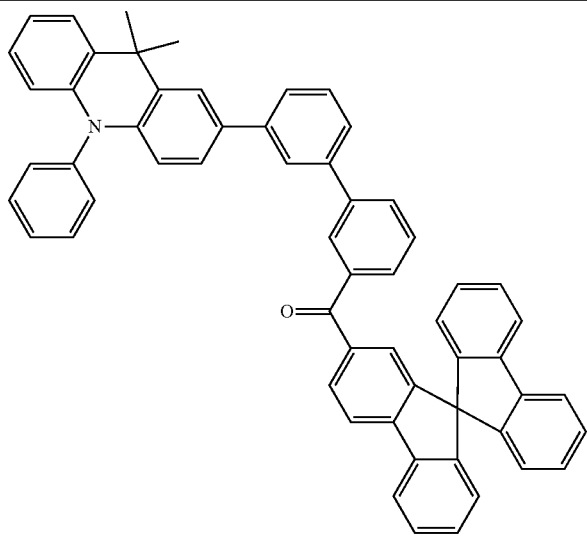
51
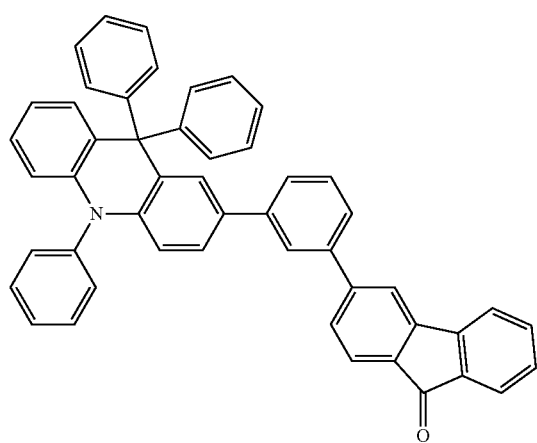 [SMILES: O=C1c2ccccc2-c2cc(-c3cccc(-c4ccc5c(c4)C(c4ccccc4)(c4ccccc4)c4ccccc4N5c4ccccc4)c3)ccc21]
52
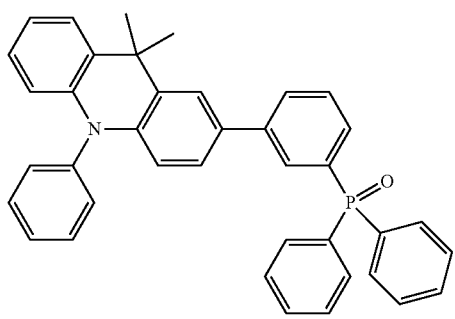 [SMILES: CC1(C)c2ccccc2N(c2ccccc2)c2ccc(-c3cccc(P(=O)(c4ccccc4)c4ccccc4)c3)cc21]
53
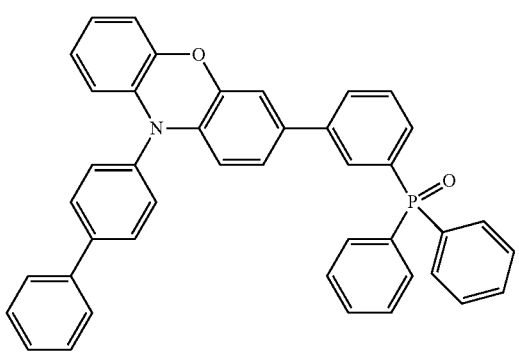 [SMILES: O=P(c1ccccc1)(c1ccccc1)c1cccc(-c2ccc3c(c2)Oc2ccccc2N3c2ccc(-c3ccccc3)cc2)c1]

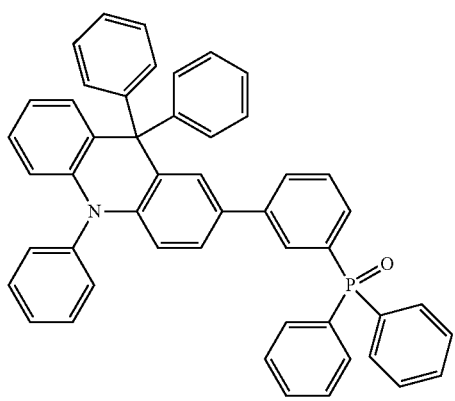 [SMILES: O=P(c1ccccc1)(c1ccccc1)c1cccc(-c2ccc3c(c2)C(c2ccccc2)(c2ccccc2)c2ccccc2N3c2ccccc2)c1]
54
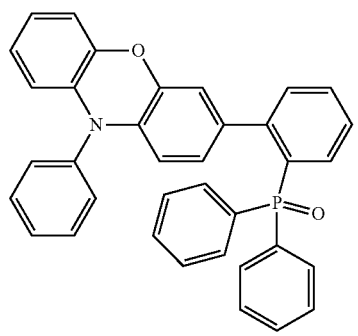 [SMILES: O=P(c1ccccc1)(c1ccccc1)c1ccccc1-c1ccc2c(c1)Oc1ccccc1N2c1ccccc1]
55
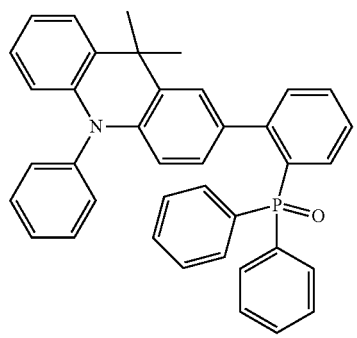 [SMILES: CC1(C)c2ccccc2N(c2ccccc2)c2ccc(-c3ccccc3P(=O)(c3ccccc3)c3ccccc3)cc21]
56
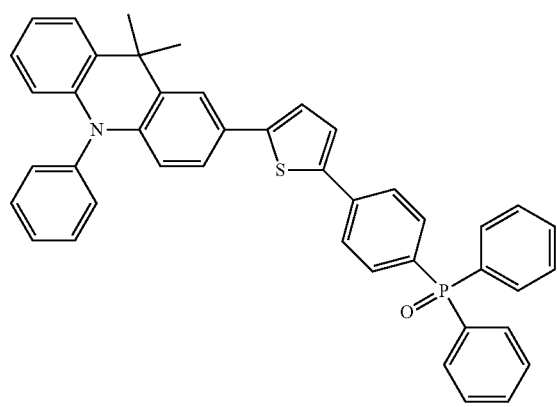 [SMILES: CC1(C)c2ccccc2N(c2ccccc2)c2ccc(-c3ccc(-c4ccc(P(=O)(c5ccccc5)c5ccccc5)cc4)s3)cc21]
57

-continued
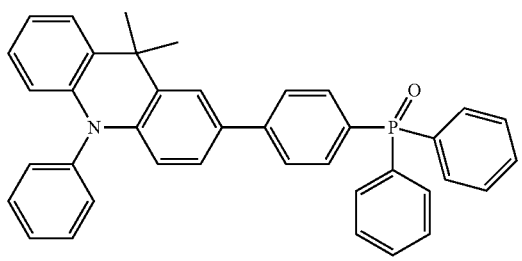 [SMILES: CC1(C)c2ccccc2N(c2ccccc2)c2ccc(-c3ccc(P(=O)(c4ccccc4)c4ccccc4)cc3)cc21]
58
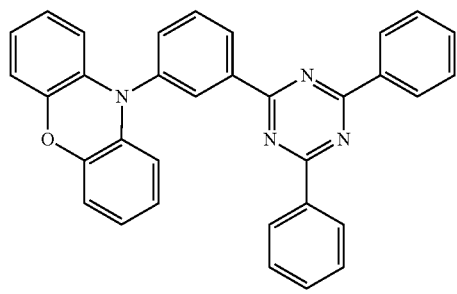 [SMILES: c1ccc(-c2nc(-c3ccccc3)nc(-c3cccc(N4c5ccccc5Oc5ccccc54)c3)n2)cc1]
59
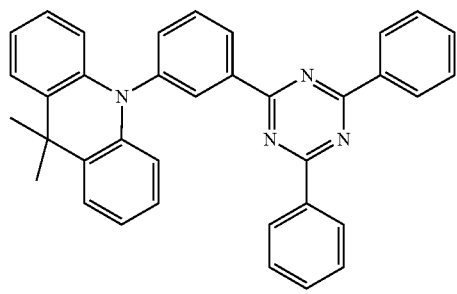 [SMILES: CC1(C)c2ccccc2N(c2cccc(-c3nc(-c4ccccc4)nc(-c4ccccc4)n3)c2)c2ccccc21]
60
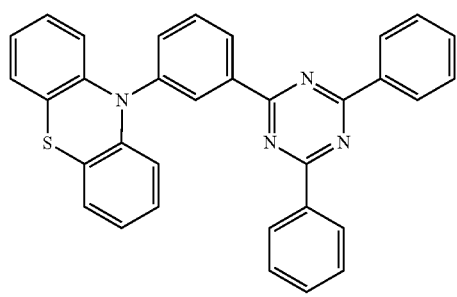 [SMILES: c1ccc(-c2nc(-c3ccccc3)nc(-c3cccc(N4c5ccccc5Sc5ccccc54)c3)n2)cc1]
61
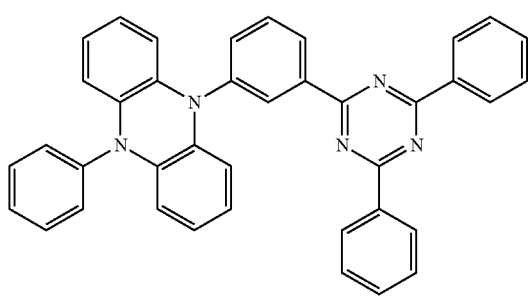 [SMILES: c1ccc(-c2nc(-c3ccccc3)nc(-c3cccc(N4c5ccccc5N(c5ccccc5)c5ccccc54)c3)n2)cc1]
62

-continued
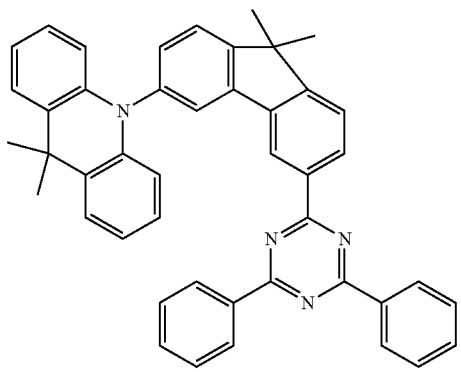 [SMILES: CC1(C)c2ccc(-c3nc(-c4ccccc4)nc(-c4ccccc4)n3)cc2-c2cc(N3c4ccccc4C(C)(C)c4ccccc43)ccc21]
63
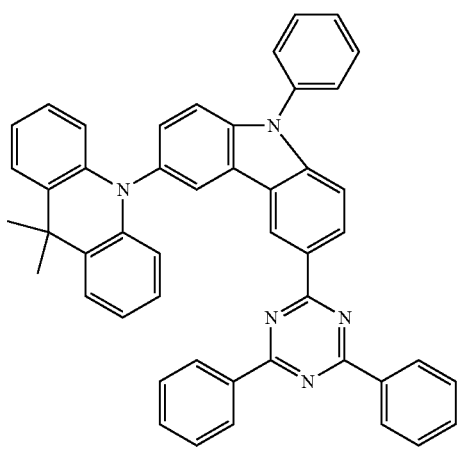 [SMILES: CC1(C)c2ccccc2N(c2ccc3c(c2)c2cc(-c4nc(-c5ccccc5)nc(-c5ccccc5)n4)ccc2n3-c2ccccc2)c2ccccc21]
64
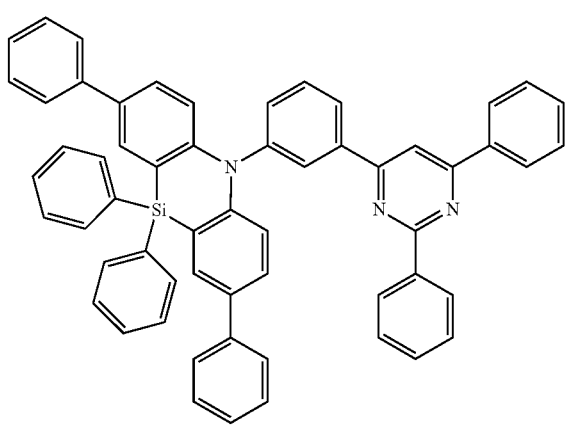
65
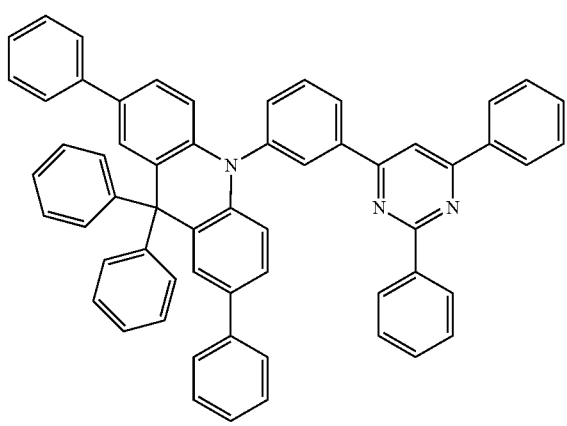 [SMILES: c1ccc(-c2ccc3c(c2)[Si](c2ccccc2)(c2ccccc2)c2cc(-c4ccccc4)ccc2N3c2cccc(-c3cc(-c4ccccc4)nc(-c4ccccc4)n3)c2)cc1]
66

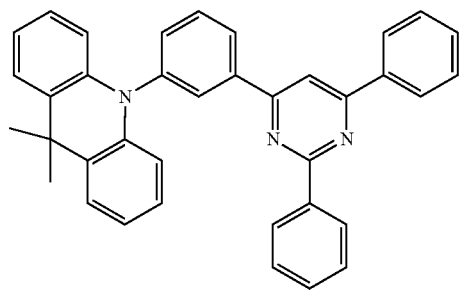 [SMILES: CC1(C)c2ccccc2N(c2cccc(-c3cc(-c4ccccc4)nc(-c4ccccc4)n3)c2)c2ccccc21]
67
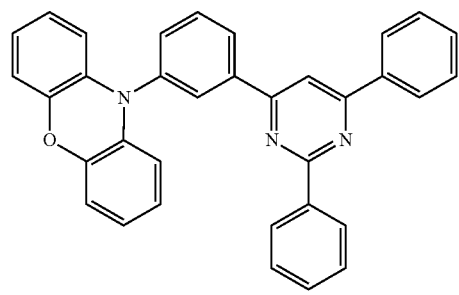 [SMILES: c1ccc(-c2cc(-c3cccc(N4c5ccccc5Oc5ccccc54)c3)nc(-c3ccccc3)n2)cc1]
68
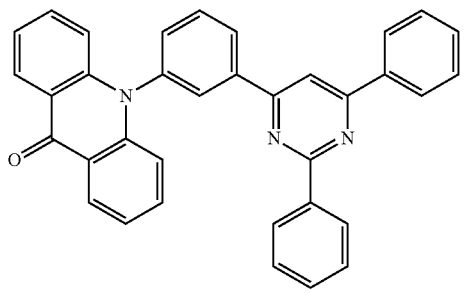 [SMILES: O=c1c2ccccc2n(-c2cccc(-c3cc(-c4ccccc4)nc(-c4ccccc4)n3)c2)c2ccccc12]
69
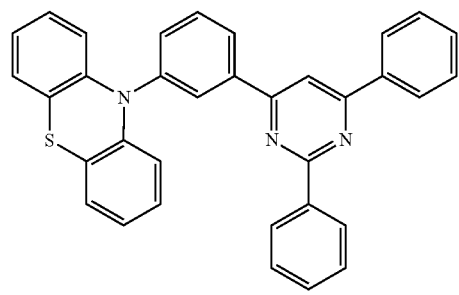 [SMILES: c1ccc(-c2cc(-c3cccc(N4c5ccccc5Sc5ccccc54)c3)nc(-c3ccccc3)n2)cc1]
70
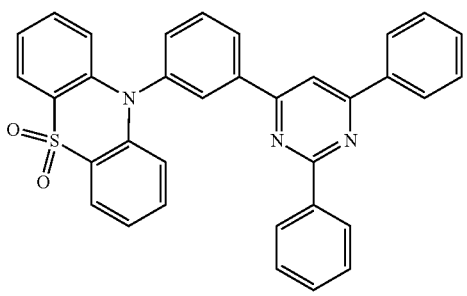 [SMILES: O=S1(=O)c2ccccc2N(c2cccc(-c3cc(-c4ccccc4)nc(-c4ccccc4)n3)c2)c2ccccc21]
71

-continued
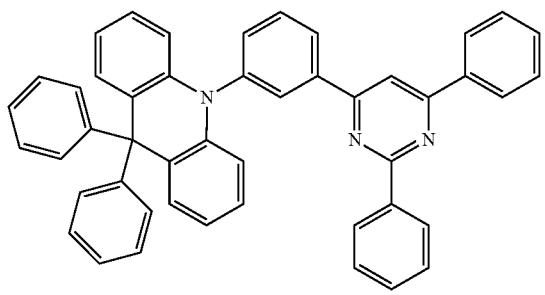 [SMILES: c1ccc(-c2cc(-c3cccc(N4c5ccccc5C(c5ccccc5)(c5ccccc5)c5ccccc54)c3)nc(-c3ccccc3)n2)cc1]
72
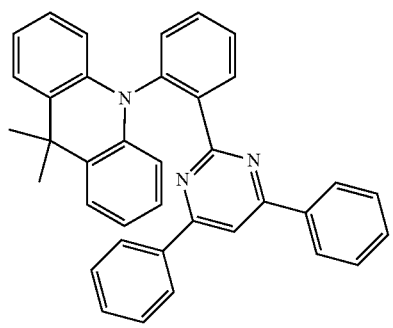 [SMILES: CC1(C)c2ccccc2N(c2ccccc2-c2nc(-c3ccccc3)cc(-c3ccccc3)n2)c2ccccc21]
73
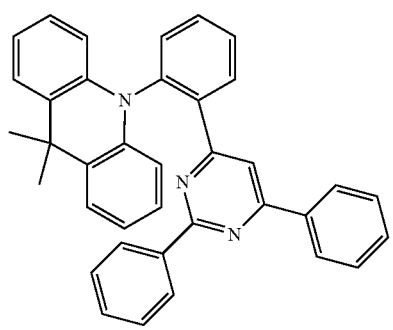 [SMILES: CC1(C)c2ccccc2N(c2ccccc2-c2cc(-c3ccccc3)nc(-c3ccccc3)n2)c2ccccc21]
74
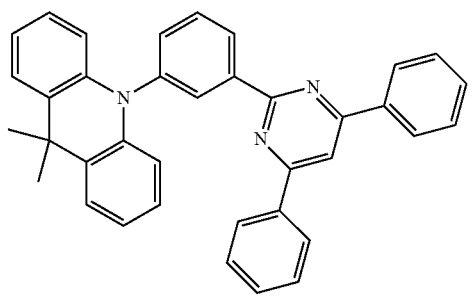 [SMILES: CC1(C)c2ccccc2N(c2cccc(-c3nc(-c4ccccc4)cc(-c4ccccc4)n3)c2)c2ccccc21]
75

76
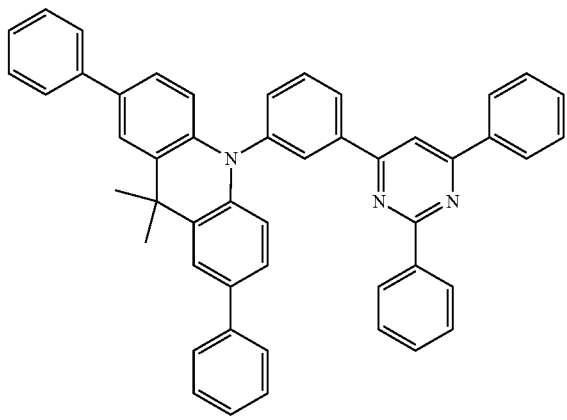 [SMILES: CC1(C)c2cc(-c3ccccc3)ccc2N(c2cccc(-c3cc(-c4ccccc4)nc(-c4ccccc4)n3)c2)c2ccc(-c3ccccc3)cc21]
77
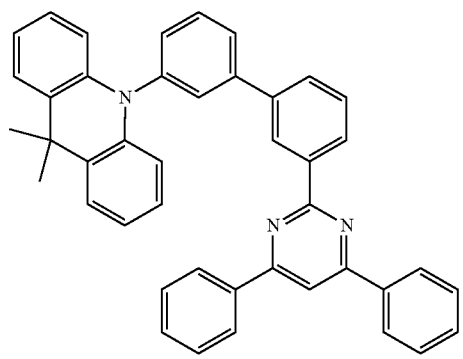 [SMILES: CC1(C)c2ccccc2N(c2cccc(-c3cccc(-c4nc(-c5ccccc5)cc(-c5ccccc5)n4)c3)c2)c2ccccc21]
78
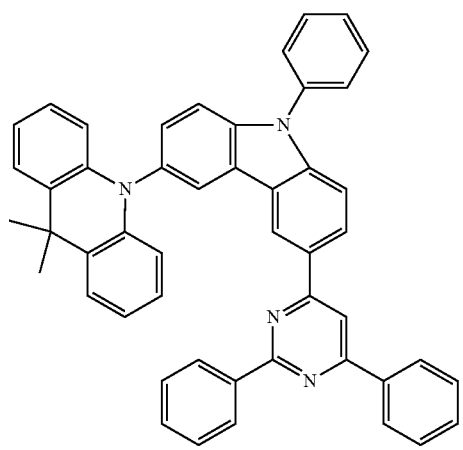 [SMILES: CC1(C)c2ccccc2N(c2ccc3c(c2)c2cc(-c4cc(-c5ccccc5)nc(-c5ccccc5)n4)ccc2n3-c2ccccc2)c2ccccc21]
79
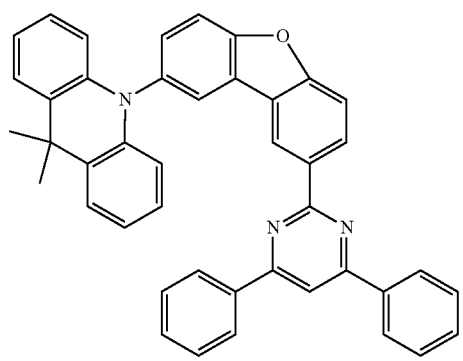 [SMILES: CC1(C)c2ccccc2N(c2ccc3oc4ccc(-c5nc(-c6ccccc6)cc(-c6ccccc6)n5)cc4c3c2)c2ccccc21]

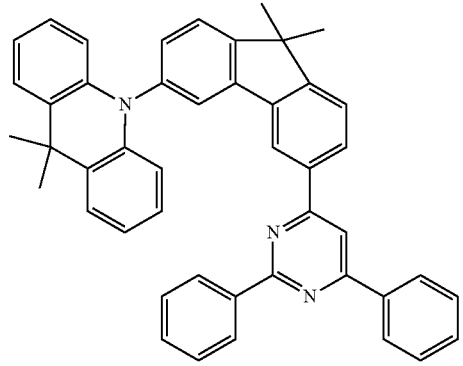 [SMILES: CC1(C)c2ccc(-c3cc(-c4ccccc4)nc(-c4ccccc4)n3)cc2-c2cc(N3c4ccccc4C(C)(C)c4ccccc43)ccc21]
80
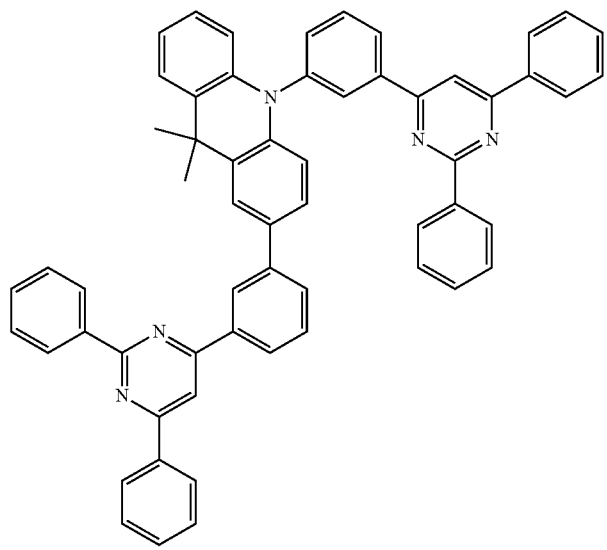 [SMILES: CC1(C)c2ccccc2N(c2cccc(-c3cc(-c4ccccc4)nc(-c4ccccc4)n3)c2)c2ccc(-c3cccc(-c4cc(-c5ccccc5)nc(-c5ccccc5)n4)c3)cc21]
81
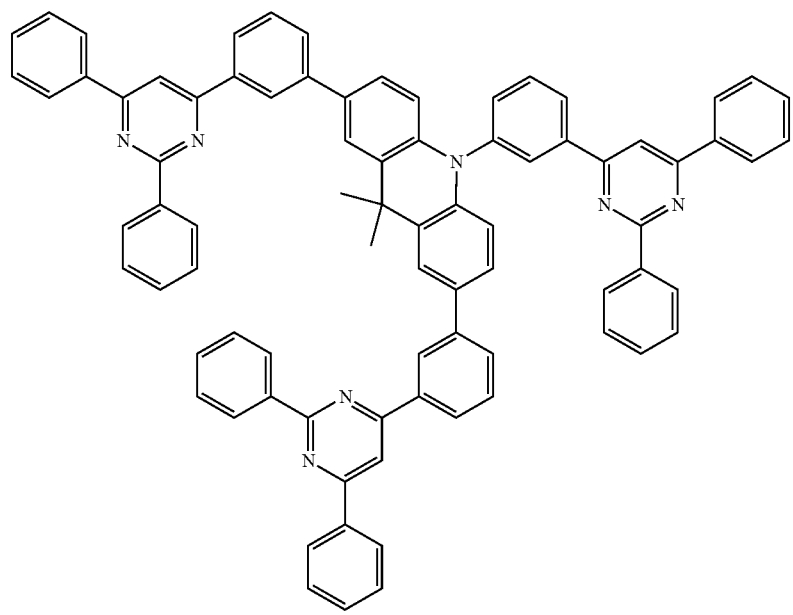 [SMILES: CC1(C)c2cc(-c3cccc(-c4cc(-c5ccccc5)nc(-c5ccccc5)n4)c3)ccc2N(c2cccc(-c3cc(-c4ccccc4)nc(-c4ccccc4)n3)c2)c2ccc(-c3cccc(-c4cc(-c5ccccc5)nc(-c5ccccc5)n4)c3)cc21]
82

83
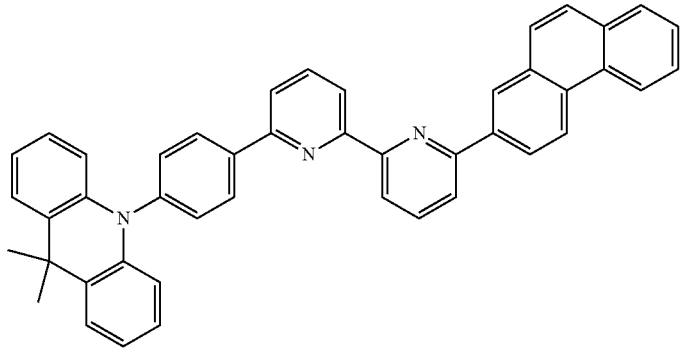 [SMILES: CC1(C)c2ccccc2N(c2ccc(-c3cccc(-c4cccc(-c5ccc6c(ccc7ccccc76)c5)n4)n3)cc2)c2ccccc21]
84
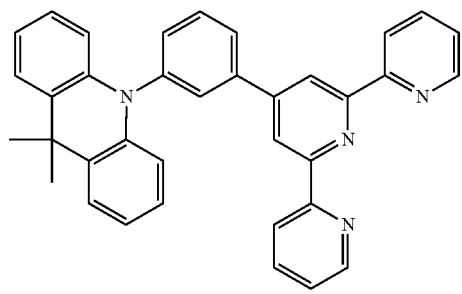 [SMILES: CC1(C)c2ccccc2N(c2cccc(-c3cc(-c4ccccn4)nc(-c4ccccn4)c3)c2)c2ccccc21]
85
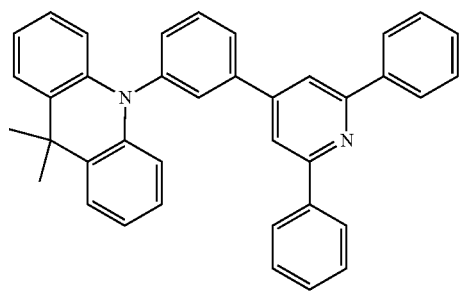 [SMILES: CC1(C)c2ccccc2N(c2cccc(-c3cc(-c4ccccc4)nc(-c4ccccc4)c3)c2)c2ccccc21]
86
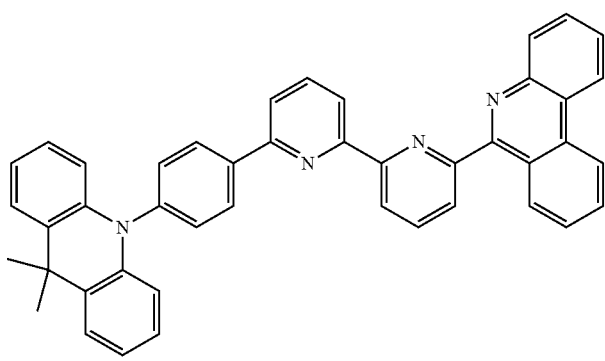 [SMILES: CC1(C)c2ccccc2N(c2ccc(-c3cccc(-c4cccc(-c5nc6ccccc6c6ccccc56)n4)n3)cc2)c2ccccc21]
87
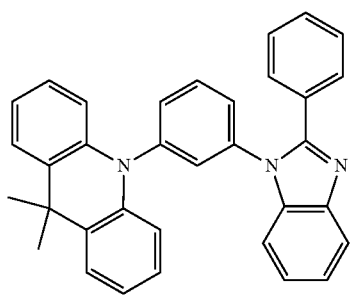 [SMILES: CC1(C)c2ccccc2N(c2cccc(-n3c(-c4ccccc4)nc4ccccc43)c2)c2ccccc21]

-continued
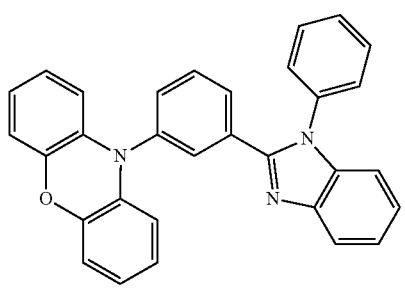 [SMILES: c1ccc(-n2c(-c3cccc(N4c5ccccc5Oc5ccccc54)c3)nc3ccccc32)cc1]
88
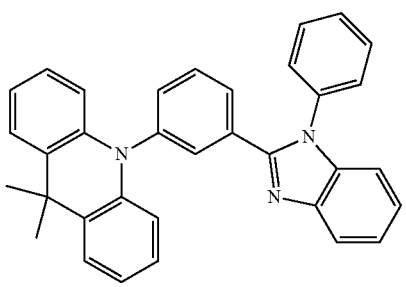 [SMILES: CC1(C)c2ccccc2N(c2cccc(-c3nc4ccccc4n3-c3ccccc3)c2)c2ccccc21]
89
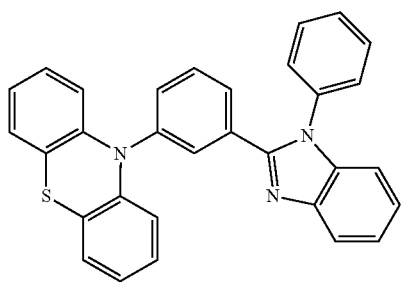 [SMILES: c1ccc(-n2c(-c3cccc(N4c5ccccc5Sc5ccccc54)c3)nc3ccccc32)cc1]
90
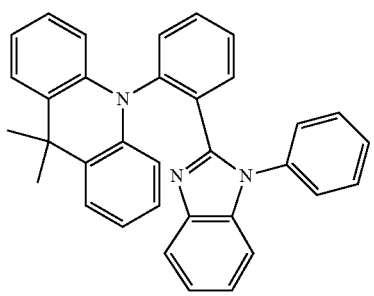 [SMILES: CC1(C)c2ccccc2N(c2ccccc2-c2nc3ccccc3n2-c2ccccc2)c2ccccc21]
91
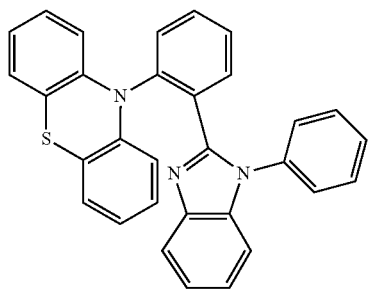 [SMILES: c1ccc(-n2c(-c3ccccc3N3c4ccccc4Sc4ccccc43)nc3ccccc32)cc1]
92

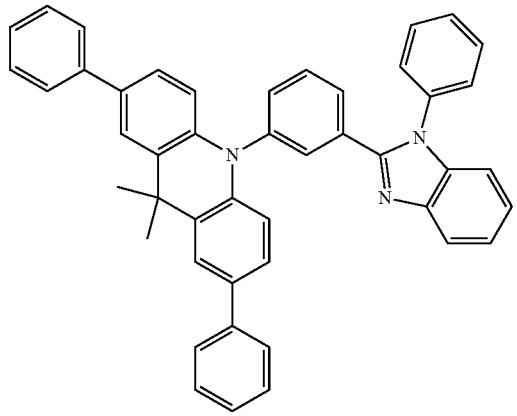 [SMILES: CC1(C)c2cc(-c3ccccc3)ccc2N(c2cccc(-c3nc4ccccc4n3-c3ccccc3)c2)c2ccc(-c3ccccc3)cc21]
93
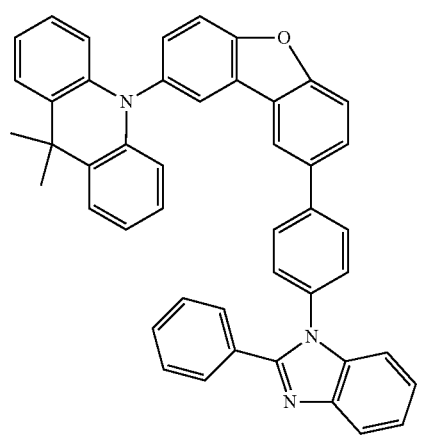 [SMILES: CC1(C)c2ccccc2N(c2ccc3oc4ccc(-c5ccc(-n6c(-c7ccccc7)nc7ccccc76)cc5)cc4c3c2)c2ccccc21]
94
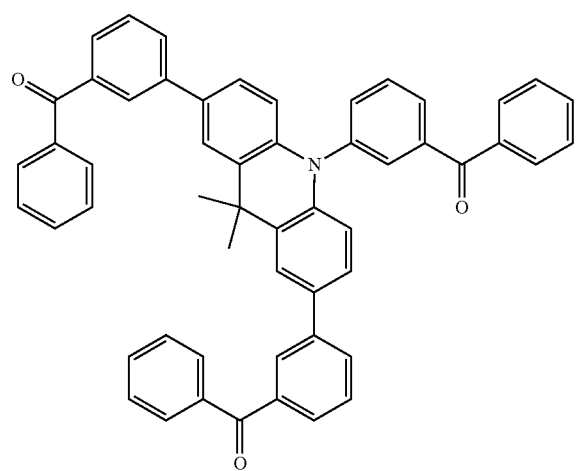 [SMILES: CC1(C)c2cc(-c3cccc(C(=O)c4ccccc4)c3)ccc2N(c2cccc(C(=O)c3ccccc3)c2)c2ccc(-c3cccc(C(=O)c4ccccc4)c3)cc21]
95

96
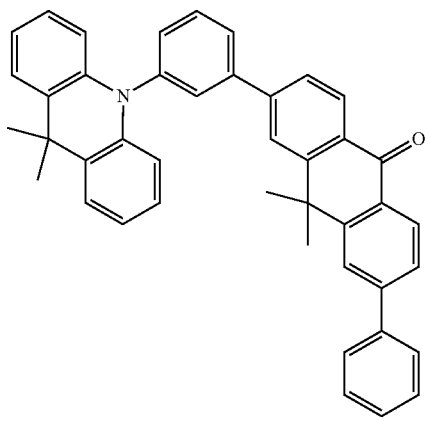 [SMILES: CC1(C)c2cc(-c3ccccc3)ccc2C(=O)c2ccc(-c3cccc(N4c5ccccc5C(C)(C)c5ccccc54)c3)cc21]
97
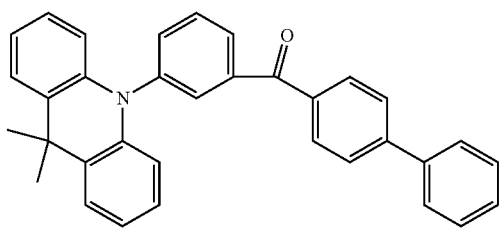 [SMILES: CC1(C)c2ccccc2N(c2cccc(C(=O)c3ccc(-c4ccccc4)cc3)c2)c2ccccc21]
98
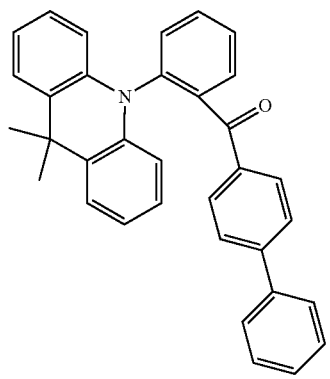 [SMILES: CC1(C)c2ccccc2N(c2ccccc2C(=O)c2ccc(-c3ccccc3)cc2)c2ccccc21]
99
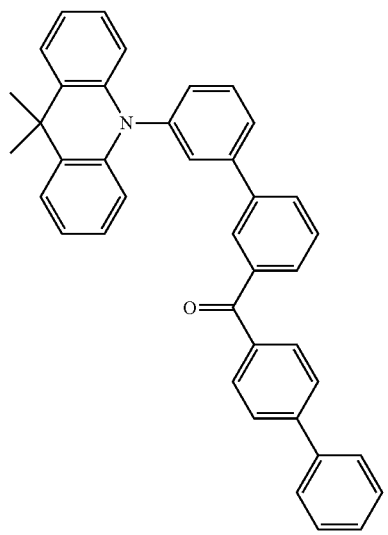 [SMILES: CC1(C)c2ccccc2N(c2cccc(-c3cccc(C(=O)c4ccc(-c5ccccc5)cc4)c3)c2)c2ccccc21]

-continued
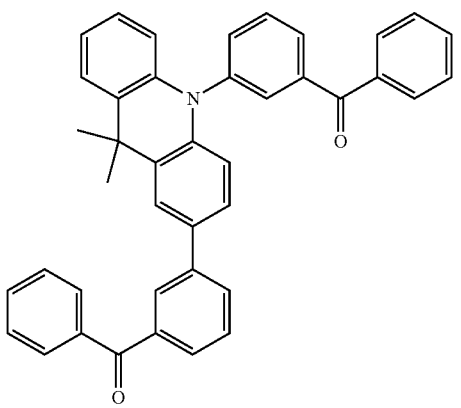 [SMILES: CC1(C)c2ccccc2N(c2cccc(C(=O)c3ccccc3)c2)c2ccc(-c3cccc(C(=O)c4ccccc4)c3)cc21]
100
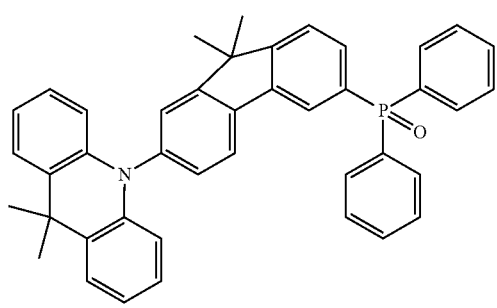 [SMILES: CC1(C)c2ccc(P(=O)(c3ccccc3)c3ccccc3)cc2-c2ccc(N3c4ccccc4C(C)(C)c4ccccc43)cc21]
101
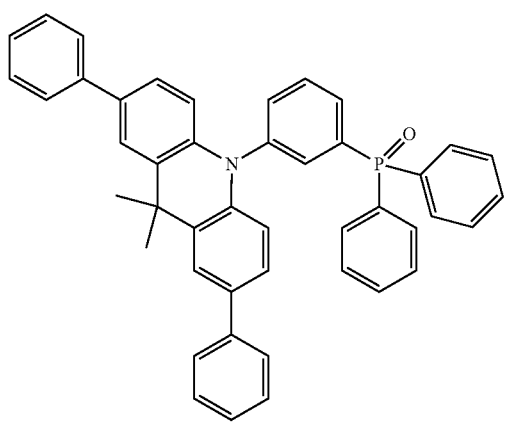 [SMILES: CC1(C)c2cc(-c3ccccc3)ccc2N(c2cccc(P(=O)(c3ccccc3)c3ccccc3)c2)c2ccc(-c3ccccc3)cc21]
102
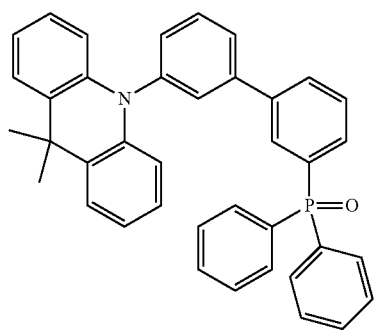 [SMILES: CC1(C)c2ccccc2N(c2cccc(-c3cccc(P(=O)(c4ccccc4)c4ccccc4)c3)c2)c2ccccc21]
103

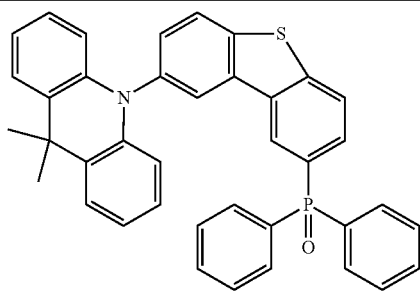

104

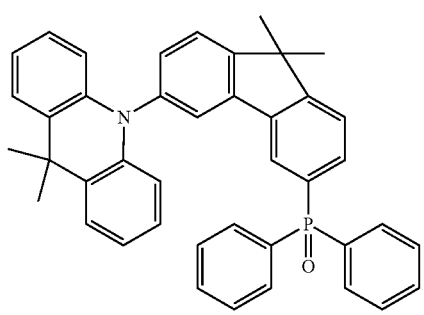 [SMILES: CC1(C)c2ccc(N3c4ccccc4C(C)(C)c4ccccc43)cc2-c2cc(P(=O)(c3ccccc3)c3ccccc3)ccc21]

105

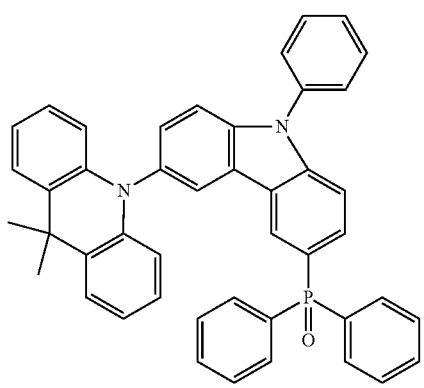 [SMILES: CC1(C)c2ccccc2N(c2ccc3c(c2)c2cc(P(=O)(c4ccccc4)c4ccccc4)ccc2n3-c2ccccc2)c2ccccc21]

106

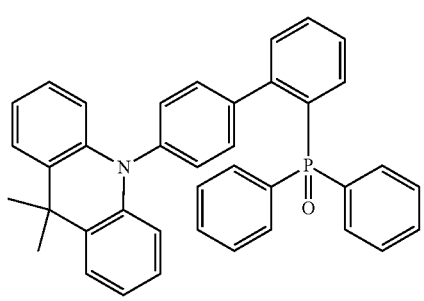 [SMILES: CC1(C)c2ccccc2N(c2ccc(-c3ccccc3P(=O)(c3ccccc3)c3ccccc3)cc2)c2ccccc21]

107

The compounds according to the invention can be prepared by known organochemical synthetic methods. These include, for example, Ullmann coupling, Hartwig-Buchwald coupling, Suzuki coupling and halogenation reactions.

Compounds according to the invention can be prepared in accordance with Scheme 1 below in which the group A (a six-membered heteroaryl group is shown by way of example) is bonded to one of the aromatic rings of the dihydroacridine unit (dibenzopiperidine unit).

Scheme 1

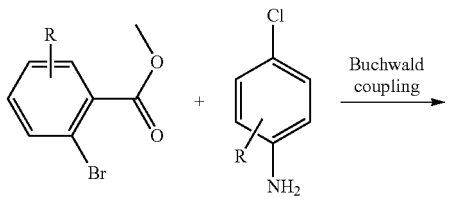

Buchwald coupling

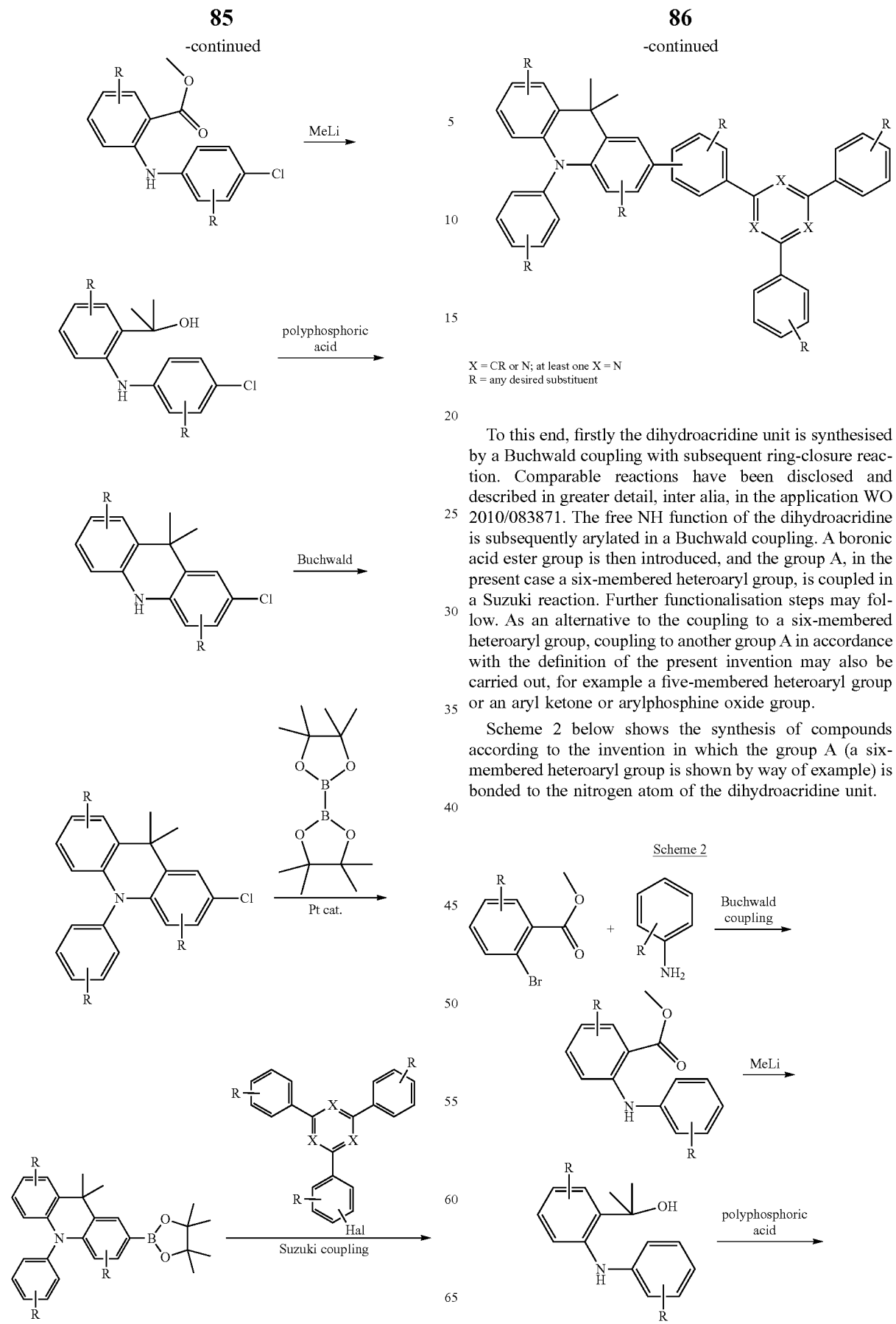

X = CR or N; at least one X = N
R = any desired substituent

To this end, firstly the dihydroacridine unit is synthesised by a Buchwald coupling with subsequent ring-closure reaction. Comparable reactions have been disclosed and described in greater detail, inter alia, in the application WO 2010/083871. The free NH function of the dihydroacridine is subsequently arylated in a Buchwald coupling. A boronic acid ester group is then introduced, and the group A, in the present case a six-membered heteroaryl group, is coupled in a Suzuki reaction. Further functionalisation steps may follow. As an alternative to the coupling to a six-membered heteroaryl group, coupling to another group A in accordance with the definition of the present invention may also be carried out, for example a five-membered heteroaryl group or an aryl ketone or arylphosphine oxide group.

Scheme 2 below shows the synthesis of compounds according to the invention in which the group A (a six-membered heteroaryl group is shown by way of example) is bonded to the nitrogen atom of the dihydroacridine unit.

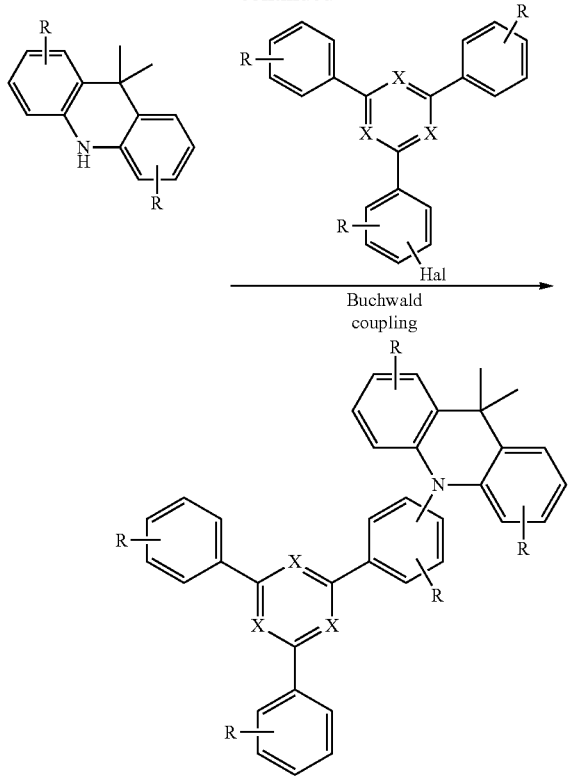

X = CR or N; at least one X = N
R = at least one substituent

To this end, the synthesis of the dihydroacridine skeleton is followed by the introduction of the six-membered heteroaryl group in the corresponding position of the dihydroacridine via a Buchwald coupling. Further functionalisation steps may follow. As an alternative to the coupling to a six-membered heteroaryl group, coupling to another group A in accordance with the definition of the present invention may also be carried out, for example a five-membered heteroaryl group or an aryl ketone or arylphosphine oxide group.

Schemes 1 and 2 show the synthesis of compounds according to the invention in which the group Y represents a methylene bridge. Alternatively, however, other groups Y can also be achieved through the use of synthetic methods known to the person skilled in the art. In some cases, starting materials used can also be commercially available intermediates, as shown in some synthesis examples of the experimental part.

To sum up, the invention furthermore relates to a process for the preparation of a compound of the formula (I), characterised in that at least one group containing a structure of the formula (II) is introduced in a metal-catalysed coupling reaction.

The compounds according to the invention described above, in particular compounds which are substituted by reactive leaving groups, can be used as monomers for the preparation of corresponding oligomers, dendrimers or polymers. Suitable reactive leaving groups are, for example, bromine, iodine, chlorine, boronic acids, boronic acid esters, amines, alkenyl or alkynyl groups having a terminal C—C double bond or C—C triple bond, oxiranes, oxetanes, groups which undergo a cycloaddition, for example a 1,3-dipolar cycloaddition, such as, for example, dienes or azides, carboxylic acid derivatives, alcohols and silanes.

The invention therefore furthermore relates to oligomers, polymers or dendrimers containing one or more compounds of the formula (I), where the bond(s) to the polymer, oligomer or dendrimer can be localised at any desired positions in formula (I) which are substituted by $R^1$, $R^2$ or $R^3$. Depending on the linking of the compound of the formula (I), the compound is a constituent of a side chain of the oligomer or polymer or a constituent of the main chain. An oligomer in the sense of this invention is taken to mean a compound which is built up from at least three monomer units. A polymer in the sense of the invention is taken to mean a compound which is built up from at least ten monomer units. The polymers, oligomers or dendrimers according to the invention may be conjugated, partially conjugated or non-conjugated. The oligomers or polymers according to the invention may be linear, branched or dendritic. In the structures linked in a linear manner, the units of the formula (I) may be linked directly to one another or they may be linked to one another via a divalent group, for example via a substituted or unsubstituted alkylene group, via a heteroatom or via a divalent aromatic or heteroaromatic group. In branched and dendritic structures, for example, three or more units of the formula (I) may be linked via a trivalent or polyvalent group, for example via a trivalent or polyvalent aromatic or heteroaromatic group, to form a branched or dendritic oligomer or polymer. The same preferences as described above for compounds of the formula (I) apply to the recurring units of the formula (I) in oligomers, dendrimers and polymers.

For the preparation of the oligomers or polymers, the monomers according to the invention are homopolymerised or copolymerised with further monomers. Suitable and preferred comonomers are selected from fluorenes (for example in accordance with EP 842208 or WO 2000/22026), spirobifluorenes (for example in accordance with EP 707020, EP 894107 or WO 2006/061181), para-phenylenes (for example in accordance with WO 1992/18552), carbazoles (for example in accordance with WO 2004/070772 or WO 2004/113468), thiophenes (for example in accordance with EP 1028136), dihydrophenanthrenes (for example in accordance with WO 2005/014689 or WO 2007/006383), cis- and trans-indenofluorenes (for example in accordance with WO 2004/041901 or WO 2004/113412), ketones (for example in accordance with WO 2005/040302), phenanthrenes (for example in accordance with WO 2005/104264 or WO 2007/017066) or also a plurality of these units. The polymers, oligomers and dendrimers usually also contain further units, for example emitting (fluorescent or phosphorescent) units, such as, for example, vinyltriarylamines (for example in accordance with WO 2007/068325) or phosphorescent metal complexes (for example in accordance with WO 2006/003000), and/or charge-transport units, in particular those based on triarylamines.

The polymers, oligomers and dendrimers according to the invention have advantageous properties, in particular long lifetimes, high efficiencies and good colour coordinates.

The polymers and oligomers according to the invention are generally prepared by polymerisation of one or more types of monomer, of which at least one monomer results in recurring units of the formula (I) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation; and
(D) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 2003/048225, WO 2004/037887 and WO 2004/037887.

The present invention thus also relates to a process for the preparation of the polymers, oligomers and dendrimers according to the invention, which is characterised in that they are prepared by SUZUKI polymerisation, YAMAMOTO polymerisation, STILLE polymerisation or HARTWIG-BUCHWALD polymerisation. The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(I-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6; WO 2002/067343 A1 and WO 2005/026144 A1.

For the processing of the compounds of the formula (I) from liquid phase, for example by spin coating or by printing processes, formulations of the compounds are necessary. These formulations can be, for example, solutions, dispersions or mini-emulsions.

The invention therefore furthermore relates to a formulation, in particular a solution, dispersion or mini-emulsion, comprising at least one compound of the formula (I) or at least one polymer, oligomer or dendrimer containing at least one unit of the formula (I) and at least one solvent, preferably an organic solvent. The way in which solutions of this type can be prepared is known to the person skilled in the art and is described, for example, in the applications WO 2002/072714 and WO 2003/019694 and the literature cited therein.

The compounds of the formula (I) are suitable for use in electronic devices, in particular in organic electroluminescent devices (OLEDs). The compounds can be employed in different functions and/or layers, inter alia depending on the substitution. The compounds are preferably employed as host materials for phosphorescent emitters or as electron-transport materials.

The invention furthermore relates to the use of the compounds of the formula (I) in electronic devices. The electronic devices here are preferably selected from the group consisting of organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs), organic laser diodes (O-lasers) and particularly preferably selected from organic electroluminescent devices (OLEDs).

The invention furthermore relates to an electronic device comprising anode, cathode and at least one organic layer, where the organic layer comprises at least one compound of the formula (I). The electronic device here is preferably selected from the above-mentioned devices and is particularly preferably an organic electroluminescent device (OLED).

Apart from cathode, anode and the emitting layer, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multi-photon Organic EL Device Having Charge Generation Layer*), coupling-out layers and/or organic or inorganic p/n junctions. However, it should be pointed out that each of these layers does not necessarily have to be present and the choice of layers is always dependent on the compounds used and in particular also on whether the electroluminescent device is fluorescent or phosphorescent. The compounds preferably employed in the respective layers and functions are explicitly disclosed in later sections.

It is preferred in accordance with the invention for the compound of the formula (I) to be employed in an electronic device comprising one or more phosphorescent dopants. The compound can be used in various layers here, preferably in an electron-transport layer, a hole-transport layer, a hole-injection layer or in the emitting layer. However, the compound of the formula (I) can also be employed in accordance with the invention in an electronic device comprising one or more fluorescent dopants and no phosphorescent dopants.

The term phosphorescent dopants typically encompasses compounds in which the light emission takes place by a spin-forbidden transition, for example a transition from an excited triplet state or a state having a relatively high spin quantum number, for example a quintet state.

Suitable phosphorescent dopants are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescent dopants used are preferably compounds which contain copper, molybdenum, tungsten, rhenium, ruthenium, osmium, rhodium, iridium, palladium, platinum, silver, gold or europium, in particular compounds which contain iridium, platinum or copper.

For the purposes of the present invention, all luminescent iridium, platinum or copper complexes are regarded as phosphorescent compounds.

Examples of the phosphorescent dopants described above are revealed by the applications WO 2000/70655, WO 2001/41512, WO 2002/02714, WO 2002/15645, EP 1191613, EP 1191612, EP 1191614, WO 2005/033244, WO 2005/019373 and US 2005/0258742. In general, all phosphorescent complexes as used in accordance with the prior art for phosphorescent OLEDs and as are known to the person skilled in the art in the area of organic electroluminescent devices are suitable for use in the devices according to the invention. The person skilled in the art will also be able to employ further phosphorescent complexes without inventive step in combination with the compounds according to the invention in OLEDs. Further examples of suitable phosphorescent dopants are revealed by the table following in a later section.

In a preferred embodiment of the present invention, the compounds of the formula (I) are employed as matrix material in combination with one or more dopants, preferably phosphorescent dopants.

A dopant in a system comprising a matrix material and a dopant is taken to mean the component whose proportion in the mixture is the smaller. Correspondingly, a matrix material is taken to mean the component whose proportion in the mixture is the greater in a system comprising a matrix material and a dopant.

The proportion of the matrix material in the emitting layer is in this case between 50.0 and 99.9% by vol., preferably between 80.0 and 99.5% by vol. and particularly preferably between 92.0 and 99.5% by vol. for fluorescent emitting layers and between 85.0 and 97.0% by vol. for phosphorescent emitting layers.

Correspondingly, the proportion of the dopant is between 0.1 and 50.0% by vol., preferably between 0.5 and 20.0% by vol. and particularly preferably between 0.5 and 8.0% by vol. for fluorescent emitting layers and between 3.0 and 15.0% by vol. for phosphorescent emitting layers.

An emitting layer of an organic electroluminescent device may also comprise systems comprising a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

In a further preferred embodiment of the invention, the compounds of the formula (I) are used as a component of mixed-matrix systems. The mixed-matrix systems preferably comprise two or three different matrix materials, particularly preferably two different matrix materials. One of the two materials here is preferably a material having hole-transporting properties and the other material is a material having electron-transporting properties. The two different matrix materials here may be present in a ratio of 1:50 to 1:1, preferably 1:20 to 1:1, particularly preferably 1:10 to 1:1 and very particularly preferably 1:4 to 1:1. Mixed-matrix systems are preferably employed in phosphorescent organic electroluminescent devices. More detailed information of mixed-matrix systems is given, inter alia, in the application WO 2010/108579.

The mixed-matrix systems may comprise one or more dopants. The dopant compound or the dopant compounds together have, in accordance with the invention, a proportion of 0.1 to 50.0% by vol. in the mixture as a whole and preferably a proportion of 0.5 to 20.0% by vol. in the mixture as a whole. Correspondingly, the matrix components together have a proportion of 50.0 to 99.9% by vol. in the mixture as a whole and preferably a proportion of 80.0 to 99.5% by vol. in the mixture as a whole.

Particularly suitable matrix materials, which can be employed in combination with the compounds according to the invention as matrix components of a mixed-matrix system, are aromatic ketones, aromatic phosphine oxides or aromatic sulfoxides or sulfones, for example in accordance with WO 2004/013080, WO 2004/093207, WO 2006/005627 or WO 2010/006680, triarylamines, carbazole derivatives, for example CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, azacarbazole derivatives, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, diazasilole or tetraazasilole derivatives, for example in accordance with WO 2010/054729, diazaphosphole derivatives, for example in accordance with WO 2010/054730, or indenocarbazole derivatives, for example in accordance with WO 10/136,109 and WO 2011/000455, or bridged carbazoles, for example in accordance with WO 2011/088877 and WO 2011/128017.

Preferred phosphorescent dopants for use in mixed-matrix systems comprising the compounds according to the invention are the phosphorescent dopants shown in a following table.

In a further preferred embodiment of the invention, the compound of the formula (I) is employed as electron-transport material in an electron-transport or electron-injection layer. The emitting layer here may comprise fluorescent and/or phosphorescent emitters. If the compound is employed as electron-transport material, it may be preferred for it to be doped, for example with alkali-metal complexes, such as, for example, Liq (lithium hydroxyquinolinate). Also suitable is the combination of the compound according to the invention in an electron-transport layer with an electron-injection layer. Suitable materials for the electron-injection layer are, for example, alkali or alkaline-earth metal fluorides, such as, for example, LiF.

In still a further preferred embodiment of the invention, the compound of the formula (I) is employed as hole-blocking material in a hole-blocking layer. A hole-blocking layer is taken to mean a layer which is directly adjacent to an emitting layer on the cathode side.

The organic electroluminescent device according to the invention may also comprise a plurality of emitting layers. These emission layers in this case particularly preferably have in total a plurality of emission maxima between 380 nm and 750 nm, resulting overall in white emission, i.e. various emitting compounds which are able to fluoresce or phosphoresce and which emit blue or yellow or orange or red light are used in the emitting layers, where the various colours in this embodiment of the invention together give white light. Particular preference is given to three-layer systems, i.e. systems having three emitting layers, where one pr more of these layers comprises a compound of the formula (I) and where the three layers exhibit blue, green and orange or red emission (for the basic structure see, for example, WO 2005/011013). Likewise, emitters which have broad-band emission bands and thus exhibit white emission are suitable for white emission in such systems. Alternatively and/or additionally, the compounds according to the invention may also be present in a hole-transport layer or electron-transport layer or in another layer in such systems.

The further functional materials preferably employed in the electronic devices according to the invention are shown below.

The compounds shown in the following table are particularly suitable phosphorescent dopants.

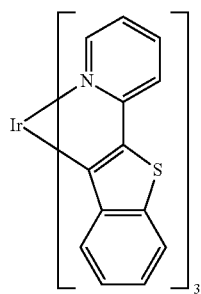
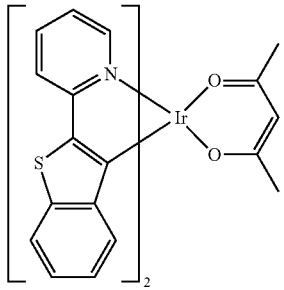
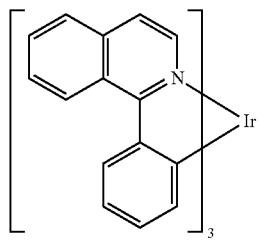
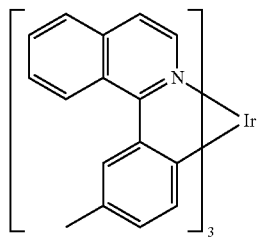
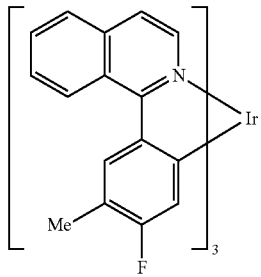
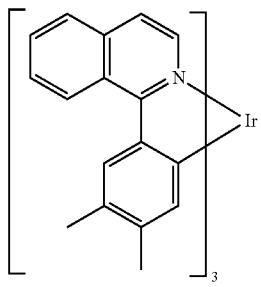
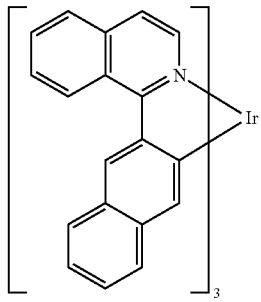
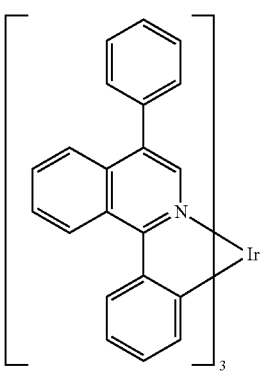
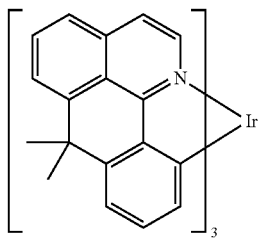
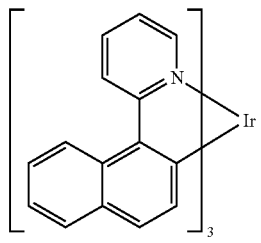
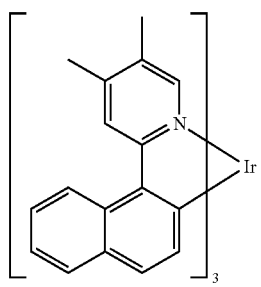

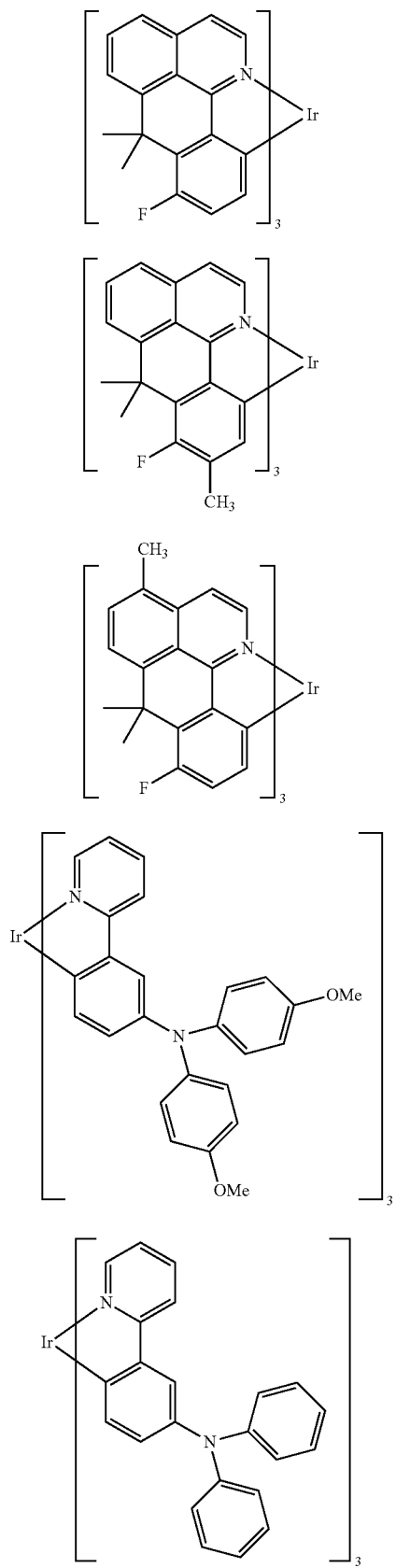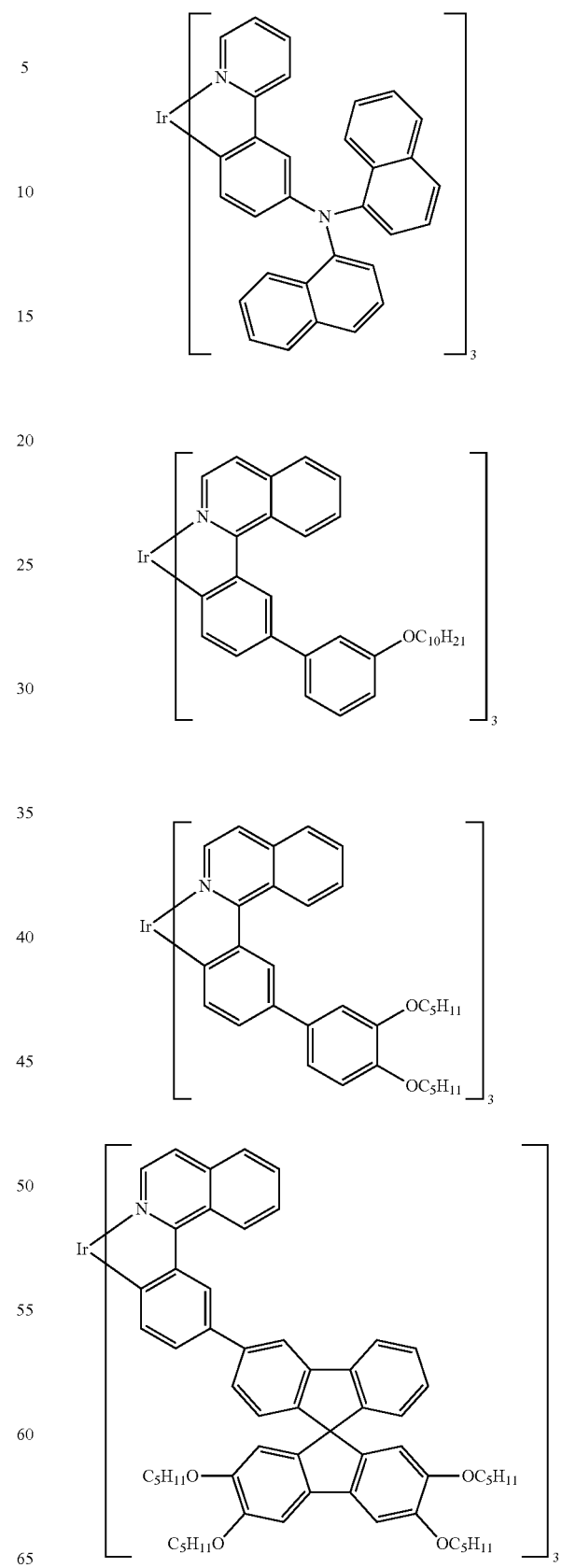

97
-continued
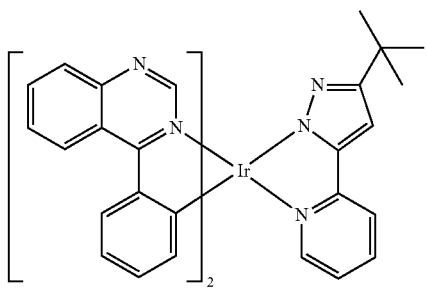
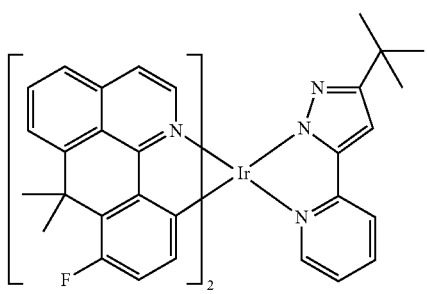
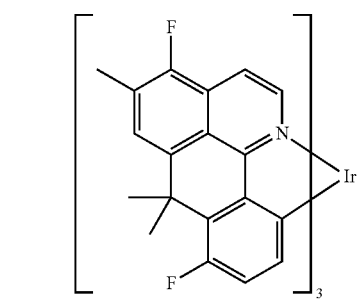
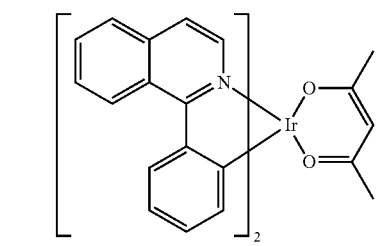
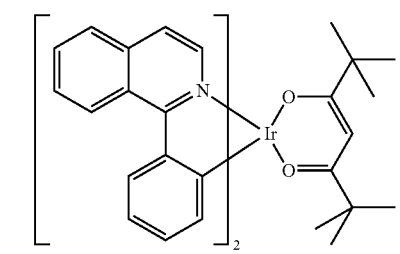
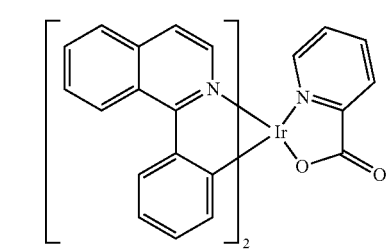
98
-continued
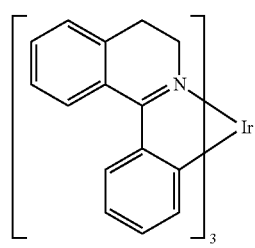
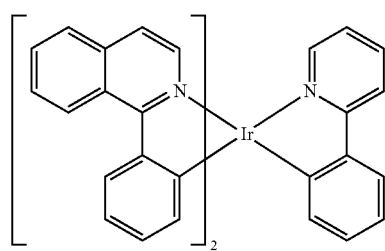
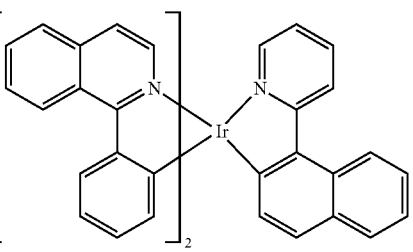
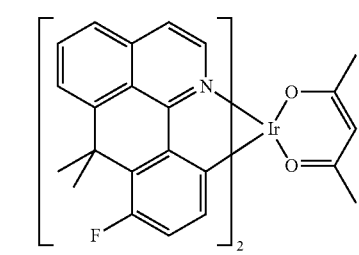
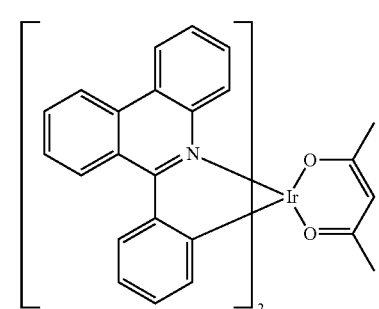
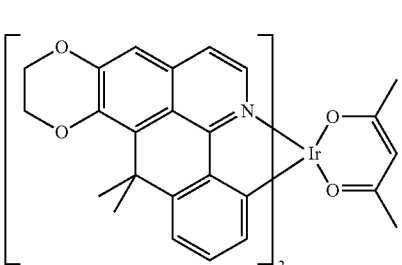

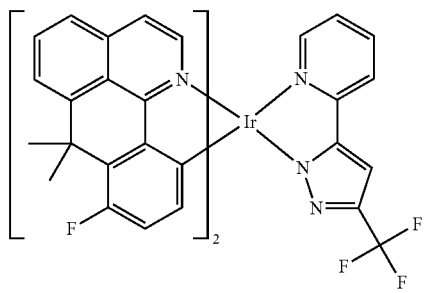
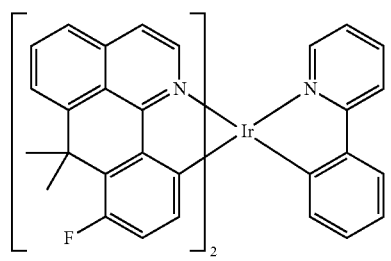
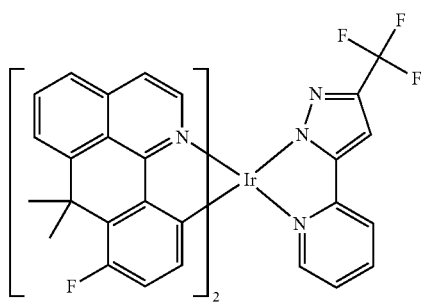
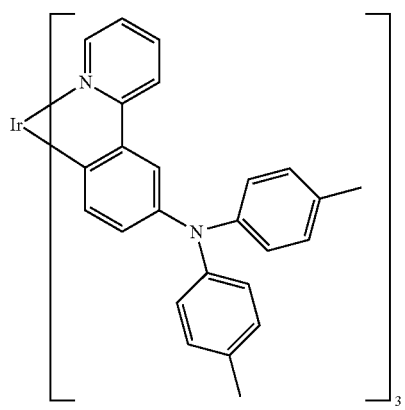
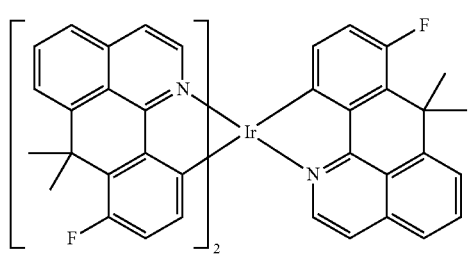
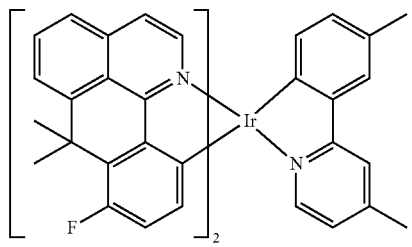
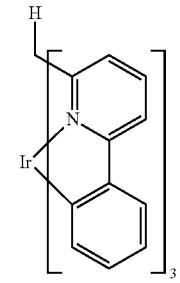
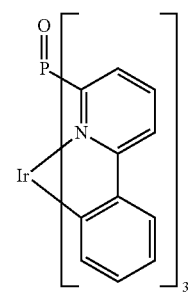
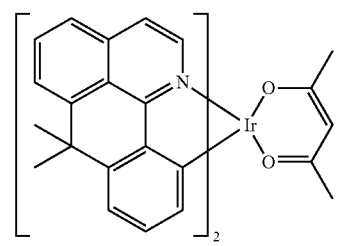
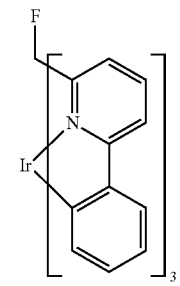
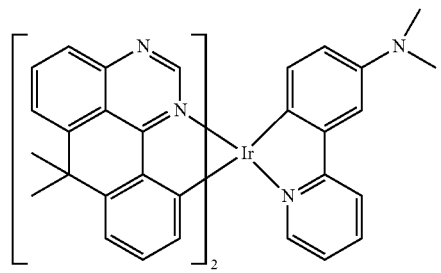

101
-continued
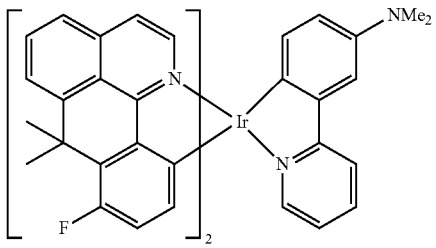
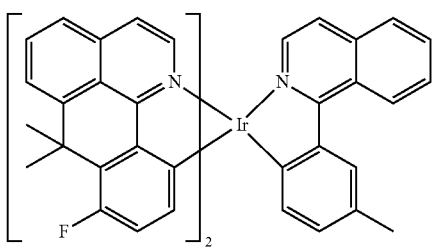
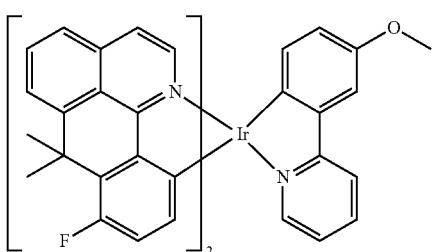
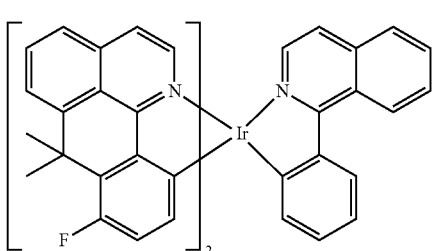
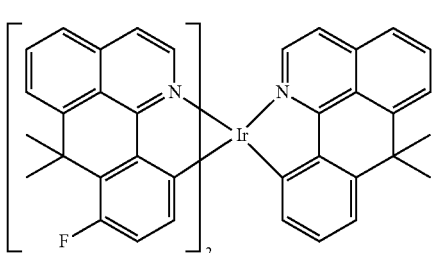
102
-continued
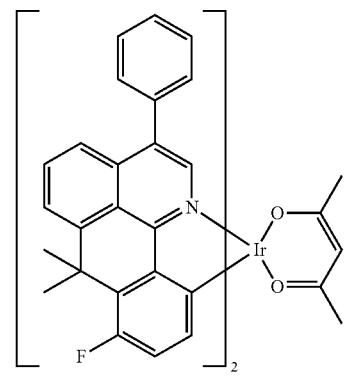
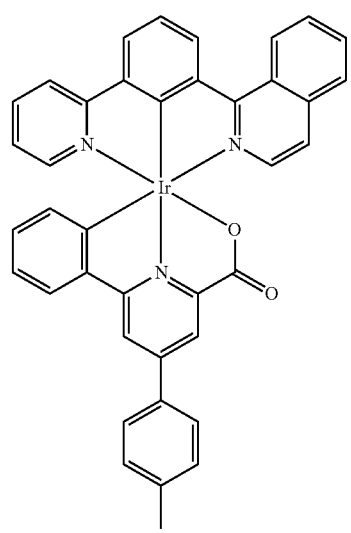
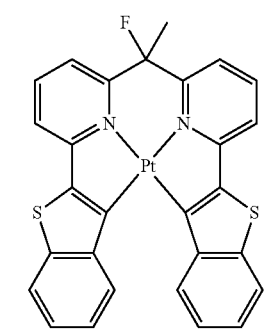

103
-continued
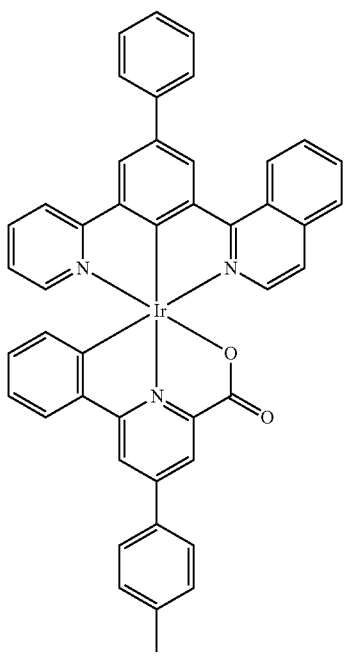
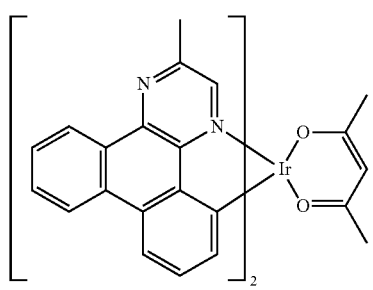
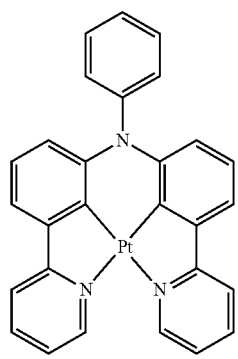
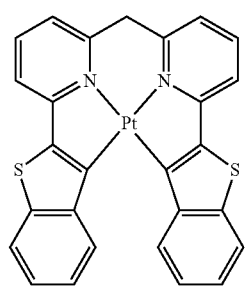
104
-continued
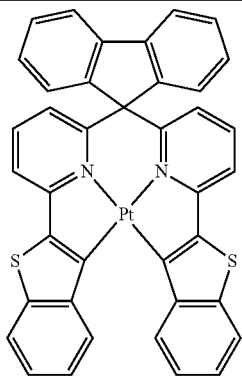
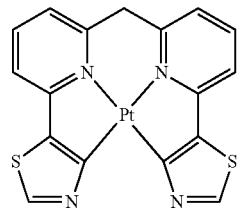
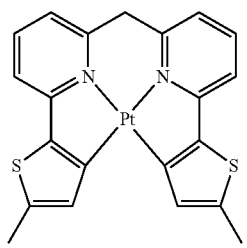
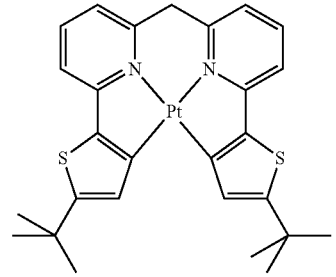
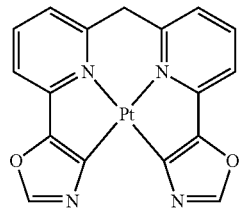
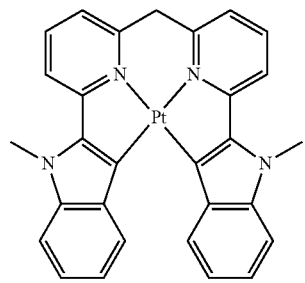

| 105 -continued | 106 -continued |
|---|---|
| 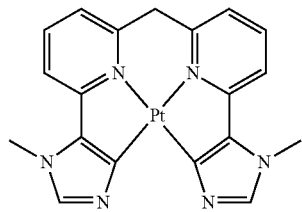 | 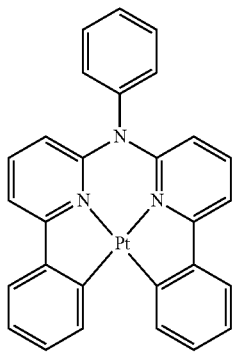 |
| 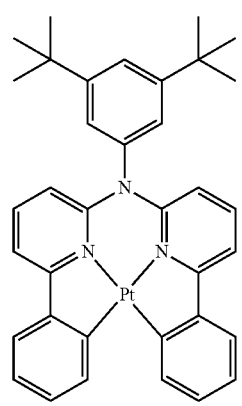 | 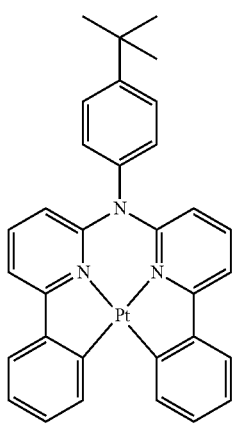 |
| 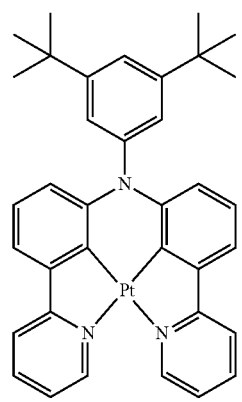 | 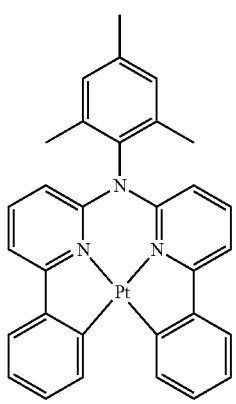 |
| 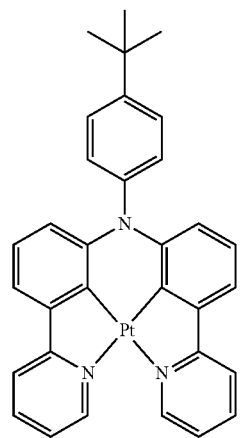 | 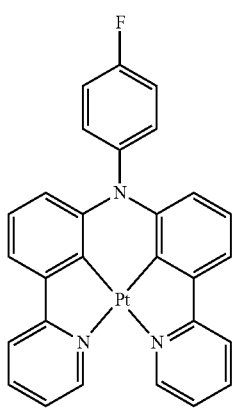 |

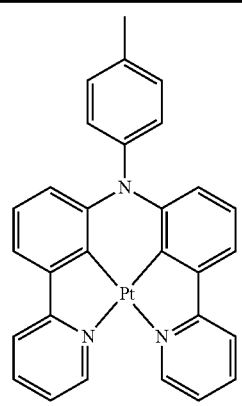
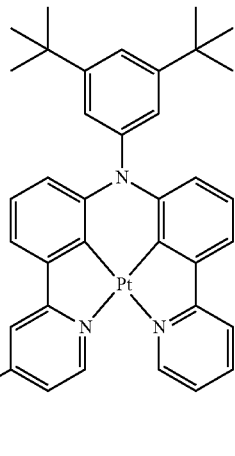
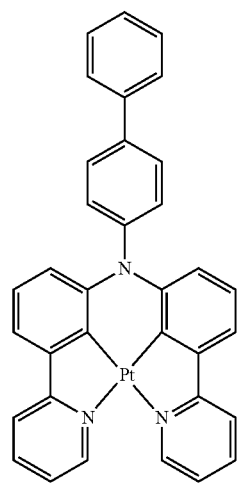
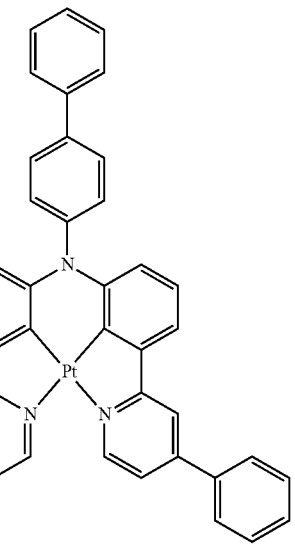
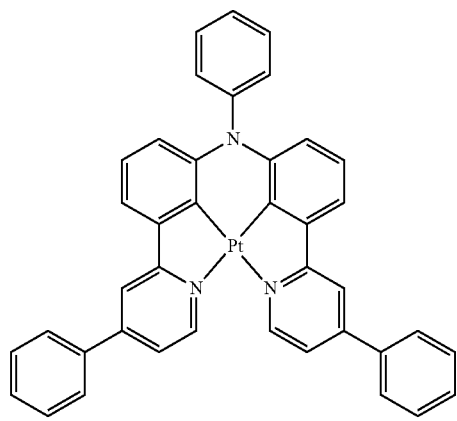
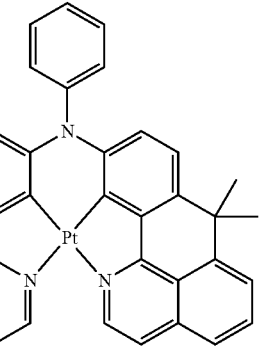

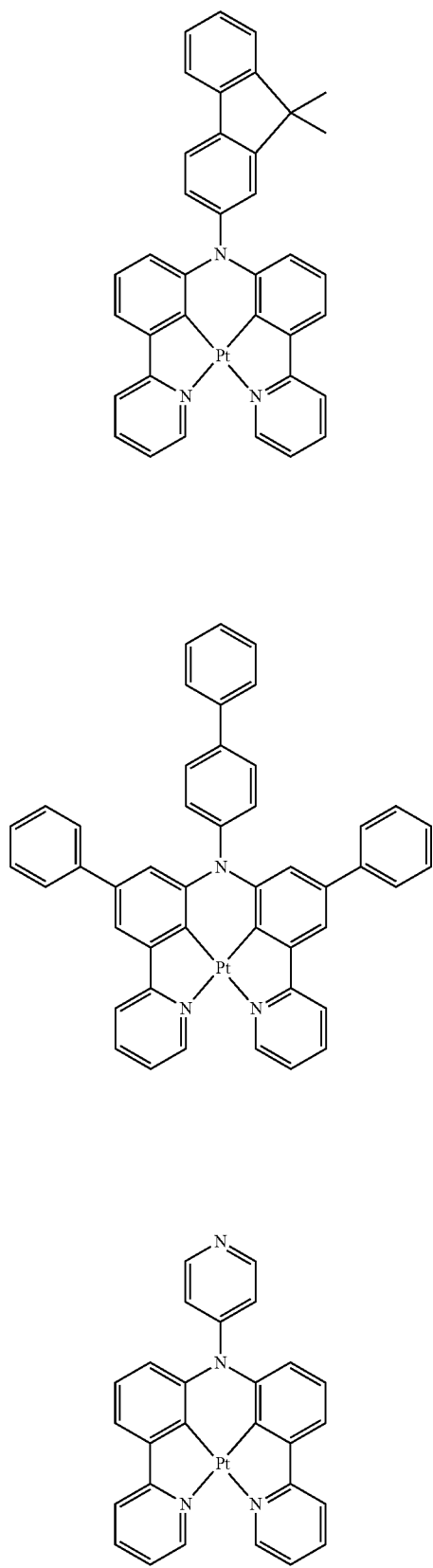

111
-continued
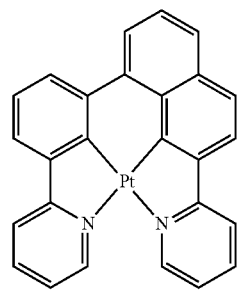
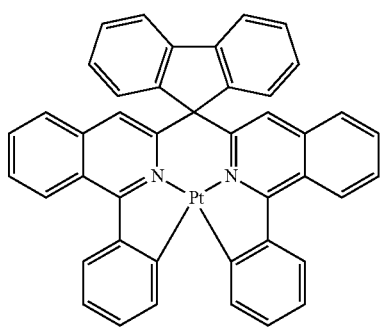
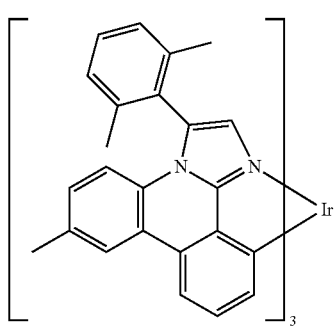
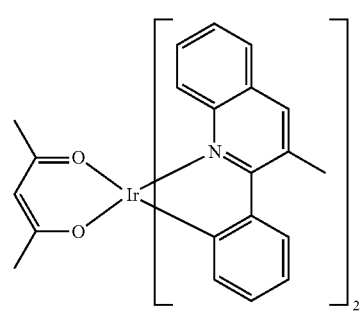
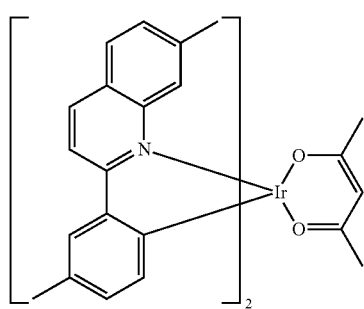
112
-continued
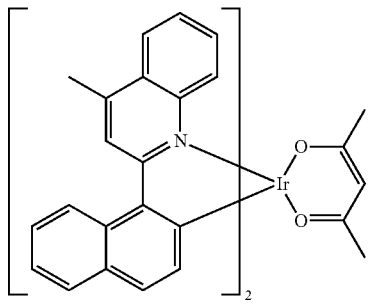
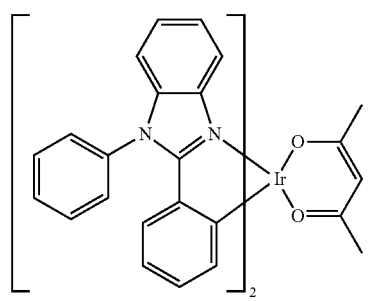
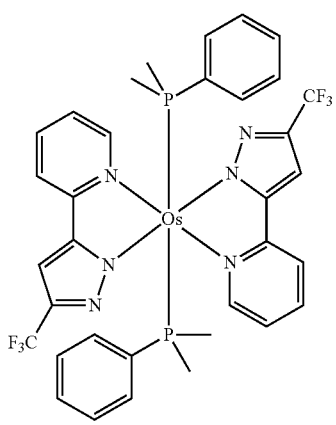
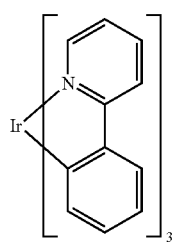
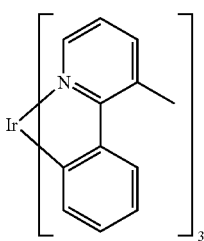

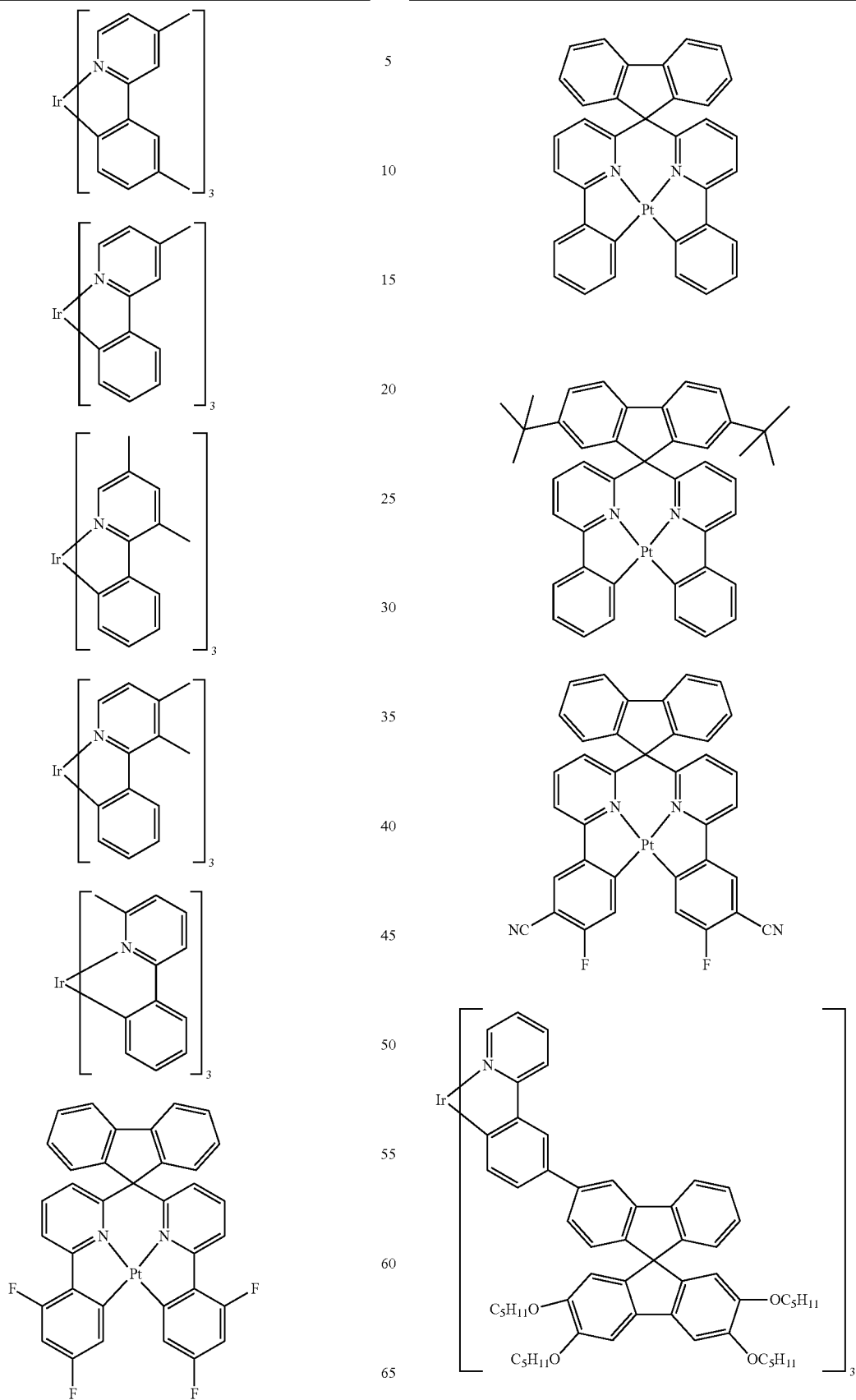

115
-continued
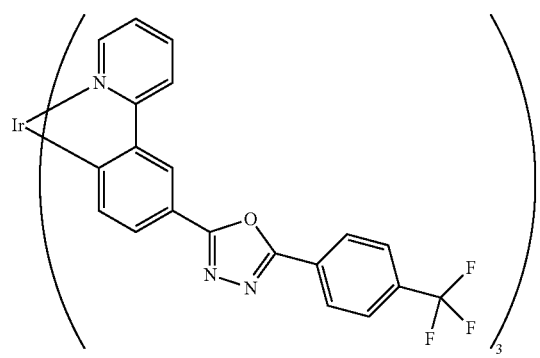
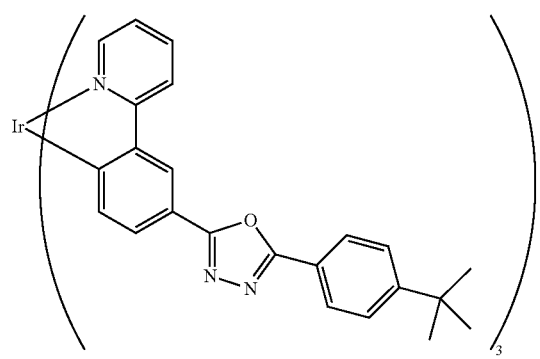
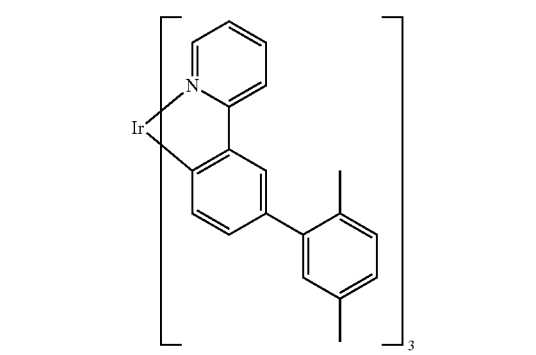
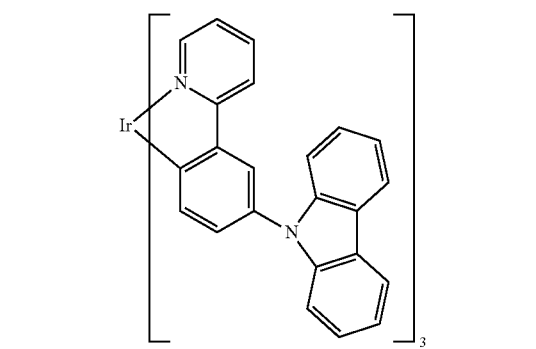
116
-continued
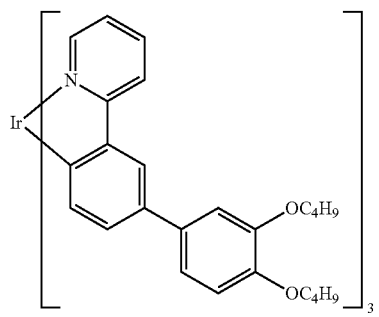
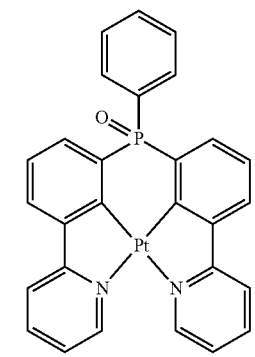
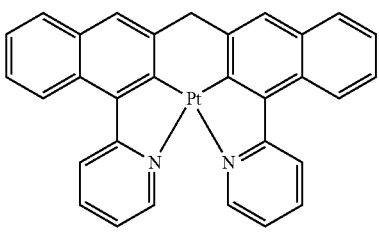
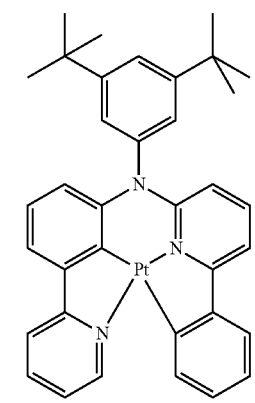
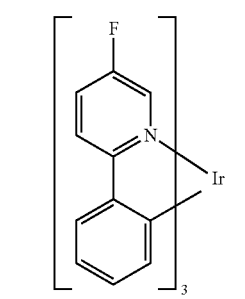

117
-continued
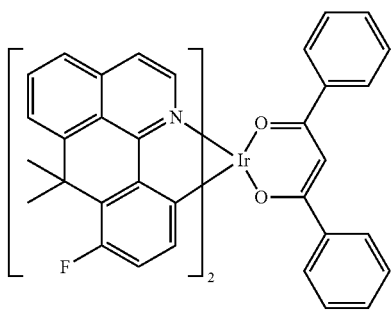
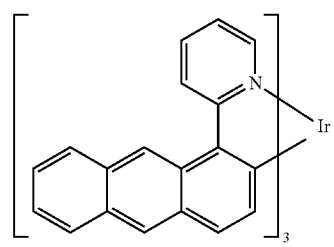
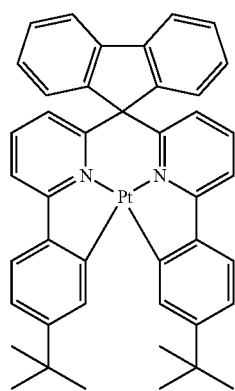
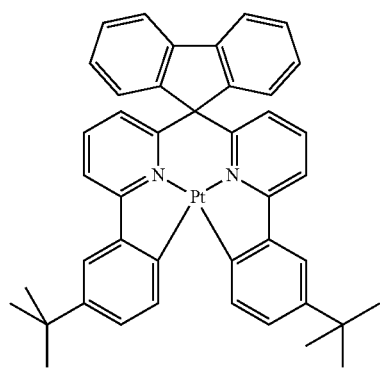
118
-continued
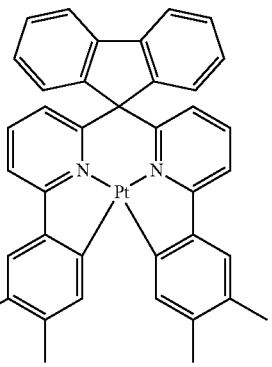
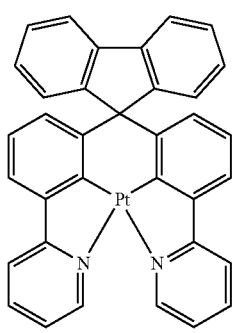
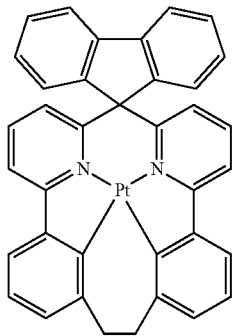
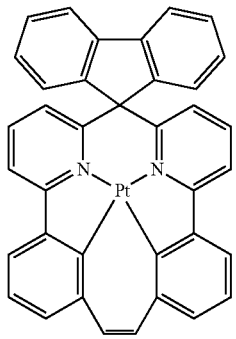

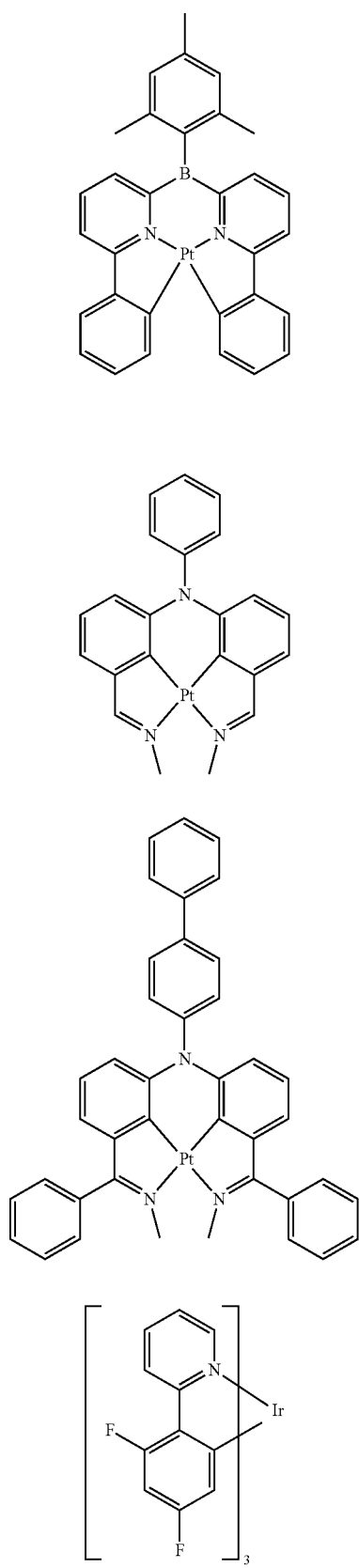

121
-continued
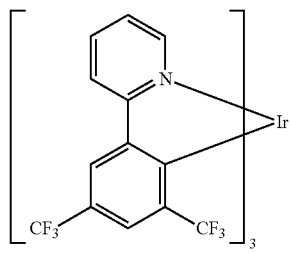
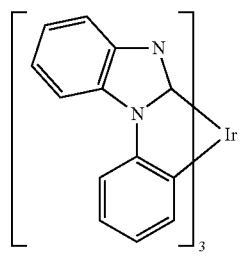
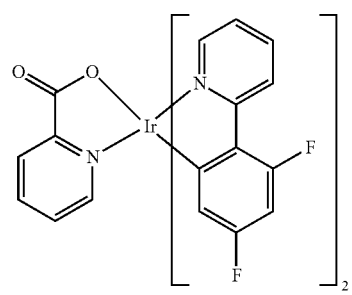
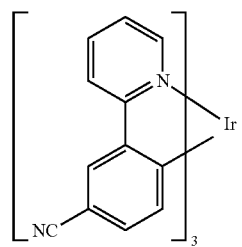
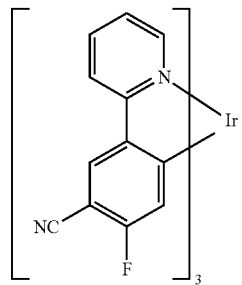
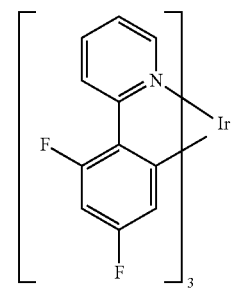
122
-continued
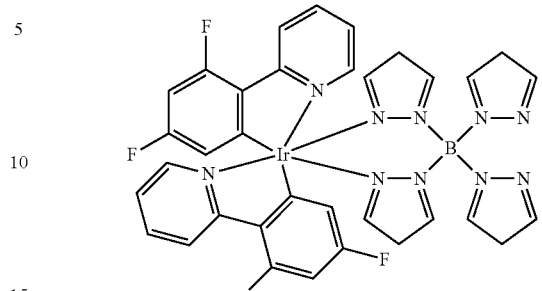
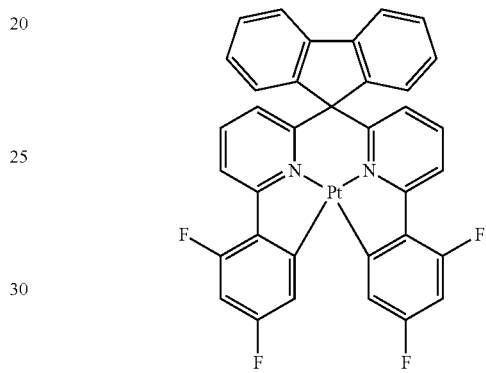
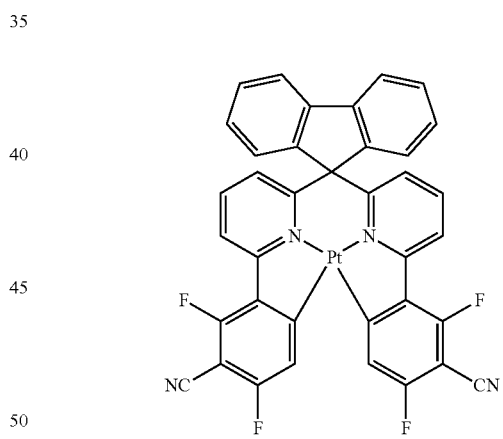
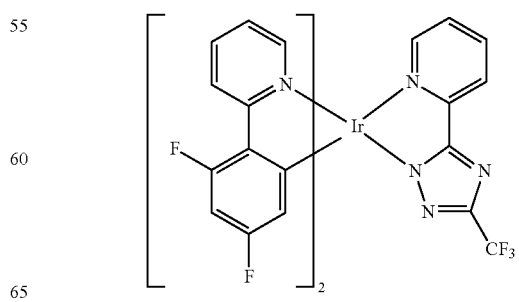

-continued

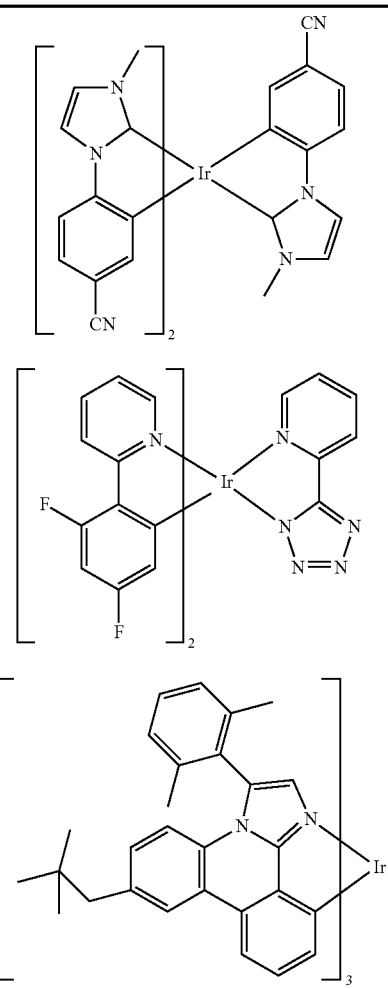

Preferred fluorescent dopants are selected from the class of the arylamines. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position. Further preferred fluorescent dopants are selected from indenofluorenamines or indenofluorenediamines, for example in accordance with WO 2006/122630, benzoindenofluorenamines or benzoindenofluorenediamines, for example in accordance with WO 2008/006449, and dibenzoindenofluorenamines or dibenzoindenofluorenediamines, for example in accordance with WO 2007/140847. Examples of fluorescent dopants from the class of the styrylamines are substituted or unsubstituted tristilbenamines or the fluorescent dopants described in WO 2006/000388, WO 2006/058737, WO 2006/000389, WO 2007/065549 and WO 2007/115610. Preference is furthermore given to the condensed hydrocarbons disclosed in WO 2010/012328.

Suitable fluorescent dopants are furthermore the derivatives disclosed in JP 2006/001973, WO 2004/047499, WO 2006/098080, WO 2007/065678, US 2005/0260442 and WO 2004/092111.

Preferred matrix materials for phosphorescent dopants, besides the compounds according to the invention, are carbazole derivatives (for example CBP, N,N-biscarbazolylbiphenyl) or compounds in accordance with WO 2005/039246, US 2005/0069729, JP 2004/288381, EP 1205527 or WO 2008/086851), triarylamines, azacarbazoles (for example in accordance with EP 1617710, EP 1617711, EP 1731584, JP 2005/347160), indolocarbazole derivatives (for example in accordance with WO 2007/063754 or WO 2008/056746), ketones (for example in accordance with WO 2004/093207 or WO 2010/006680), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), azaboroles or boronic esters (for example in accordance with WO 2006/117052), triazine derivatives (for example in accordance with WO 2010/015306, WO 2007/063754 or WO 2008/056746), zinc complexes (for example in accordance with WO 2009/062578), aluminium complexes (for example BAlq), diazasilole and tetraazasilole derivatives, for example in accordance with WO 2010/054730, indenocarbazole derivatives, for example in accordance with WO 2010/136109 and WO 2011/000455 or diazaphospholes, for example in accordance with WO 2010/054730.

Suitable charge-transport materials, as can be used in the hole-injection or hole-transport layer or in the electron-transport layer of the organic electroluminescent device according to the invention, are, for example, the compounds disclosed in Y. Shirota et al., Chem. Rev. 2007, 107(4), 953-1010, or other materials as are employed in these layers in accordance with the prior art.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Ba/Ag or Mg/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. For some applications, at least one of the electrodes must be transparent or partially transparent in order to facilitate either irradiation of the organic material (organic solar cells) or the coupling-out of light (OLEDs, O-lasers). Preferred anode materials here are conductive mixed metal oxides. Particular preference is given to indium tin oxide (ITO) or indium zinc oxide (IZO). Preference is furthermore given to conductive, doped organic materials, in particular conductive, doped polymers.

The device is appropriately (depending on the application) structured, provided with contacts and finally sealed, since the lifetime of the devices according to the invention is shortened in the presence of water and/or air.

In a preferred embodiment, the organic electroluminescent device according to the invention is characterised in that one or more layers are coated by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing. Soluble compounds of the formula (I) are necessary for this purpose. High solubility can be achieved through suitable substitution of the compounds.

For the production of an organic electroluminescent device according to the invention, it is furthermore preferred to apply one or more layers from solution and one or more layers by a sublimation process.

The organic electroluminescent devices comprising one or more compounds according to the invention can be employed in displays, as light sources in lighting applications and as light sources in medical and/or cosmetic applications (for example light therapy).

The compounds according to the invention and the organic electroluminescent devices according to the invention are distinguished by the following surprising advantages over the prior art:
1. The compounds according to the invention are very highly suitable for use in an electron-transport layer of an organic electroluminescent device.
2. The compounds according to the invention, employed as matrix material for fluorescent or phosphorescent emitters, result in very high efficiencies and in long lifetimes. This applies, in particular, if the compounds are employed as matrix material for a phosphorescent emitter.
3. The compounds according to the invention are suitable not only as matrix for red- and green-phosphorescent compounds, but also for blue-phosphorescent compounds.
4. The compounds according to the invention, employed in organic electroluminescent devices, result in high efficiencies and in steep current/voltage curves with low use and operating voltages.
5. The compounds according to the invention have high temperature stability and high oxidation stability in solution and are thus readily processible.

The invention is explained in greater detail by the following use examples, where the invention is not restricted to the scope of the examples.

WORKING EXAMPLES

A) Synthesis Examples

The following syntheses are carried out, unless indicated otherwise, in dried solvents under a protective-gas atmosphere. The compounds according to the invention can be prepared by means of synthetic methods known to the person skilled in the art.

Starting materials which can be used are, for example, 3-(bromophenyl)-1-phenyl-2-propen-1-one (*Chemistry & Biodiversity*, 2005, 2(12), 1656-1664), 2-(3-bromophenyl)-4,6-diphenylpyrimidine, 4-(3-bromophenyl)-4,6-diphenylpyrimidine (WO 2005/085387) and 9,10-dihydro-9,9'-dimethylacridine (*Chem. Ber.* 1980, 113(1), 358-384).

I) Synthesis of Intermediate 1a and Analogous Compounds 2a-9a

1st Step:

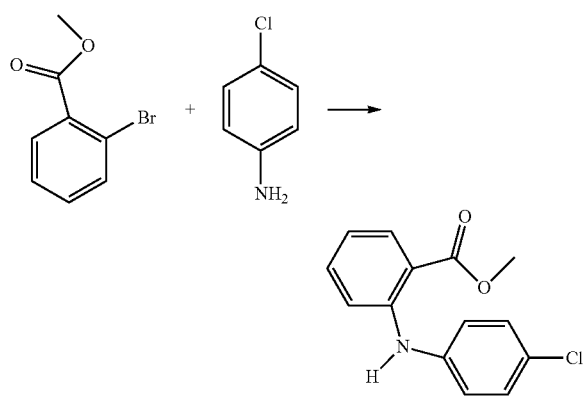

149 g (687 mmol) of methyl 2-bromobenzoate and 100 g (784 mmol) of 4-chloroaniline are dissolved in 1500 ml of toluene and degassed by the introduction of inert gas. Degassed 271 g (825 mmol) of Cs$_2$CO$_3$, 15.4 g (69 mmol) of Pd(OAc)$_2$ and 13.9 g (23 mmol) of 4,5-bis(diphenylphosphino)-9,9-dimethylxanthene are subsequently added. The reaction mixture is subsequently stirred at 82° C. for 6 h and filtered through aluminium oxide (basic, activity grade 1). The product is purified by column chromatography on silica gel with heptane/toluene (1:49), giving 78.7 g (300 mmol, 43%) of the product as pale-yellow solid.

2nd Step:

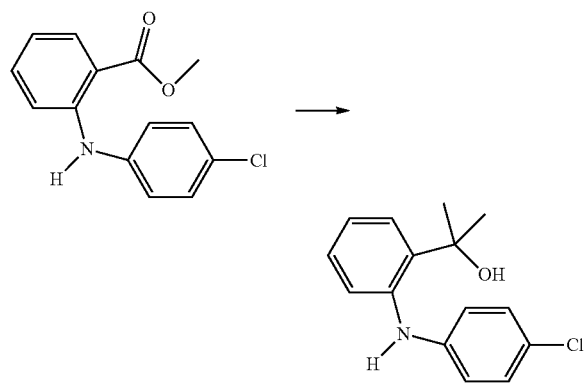

89.5 g (341 mmol) of methyl 2-(4-chlorophenylamino) carboxy are initially introduced in 1000 ml of dry THF, 1367 ml of a 2M solution of MeLi in Et₂O (503 mmol) are added at −78° C., and the mixture is then warmed to −40° C. over the course of 3 h. When the reaction is complete, 300 ml of MeOH are slowly and carefully added at −30° C. in order to quench the excess MeLi. The mixture is allowed to come to room temperature, evaporated to ⅓, ethyl acetate is added, and the organic phase is washed with water. The organic phase is subsequently dried over MgSO₄ and evaporated, giving 72 g (276 mmol, 80%) of the product as solid.

3rd Step:

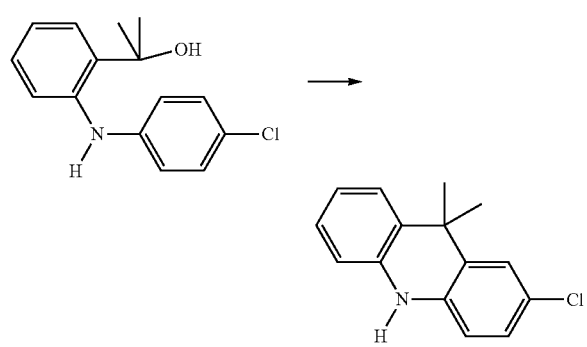

72.3 g (276 mmol) of 2-[2-(4-chlorophenylamino)phenyl] propan-2-ol are dissolved in 1000 ml of dichloromethane and degassed by the introduction of inert gas. A mixture of 178 g of polyphosphoric acid and 118 ml of methanesulfonic acid is added dropwise at RT, and the mixture is heated to 50° C. When the reaction is complete (about 30 min), 20% NaOH solution is carefully added to the reaction solution with good cooling until a pH of 8 has become established. The organic phase is separated off, and the water phase is extracted with toluene. The combined organic phase is subsequently dried over MgSO₄ and evaporated, giving 62 g (270 mmol) of the product as solid (98%).

4th Step:

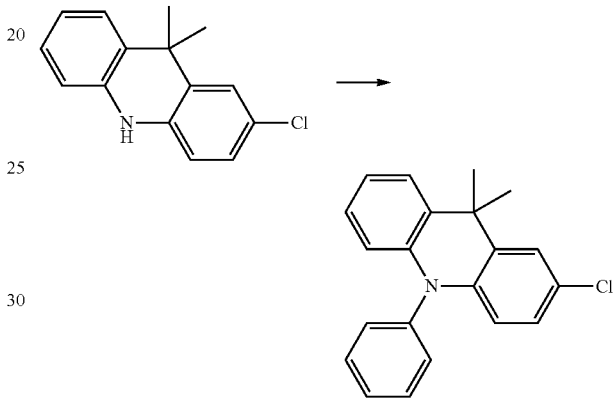

46 g (188.7 mmol) of 2-chloro-9,9-dimethyl-9,10-dihydroacridine and 46 g (226 mmol) of iodobenzene are dissolved in toluene and degassed by the introduction of protective gas. 13 ml (13 mmol/1 M solution in toluene) of tri-tert-butylphosphine, 2.1 g (9.4 mmol) of Pd(OAc)₂ and 27 g (283 mmol) of NaOtBu are subsequently added. The solids are degassed in advance, the reaction mixture is degassed subsequently and subsequently stirred under reflux for 5 h. The warm reaction solution is filtered through aluminium oxide B (activity grade 1), washed with water, dried and evaporated. Crystallisation from toluene gives 51 g (166 mmol, 85%) of compound 1a as white solid.

Compounds 2a-9a are obtained analogously:

| Ex. | Starting material 1 | Product | Yield |
|---|---|---|---|
| 2a | 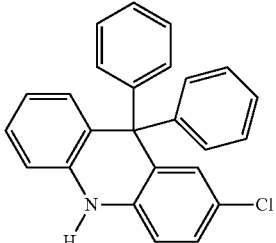 | 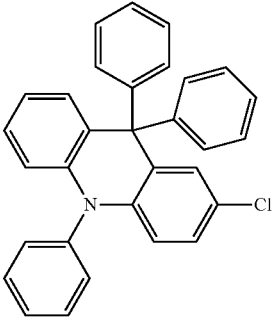 [SMILES: Clc1ccc2c(c1)C(c1ccccc1)(c1ccccc1)c1ccccc1N2c1ccccc1] 21971-81-3 | 88% |

-continued
| Ex. | Starting material 1 | Product | Yield |
|---|---|---|---|
| 3a | 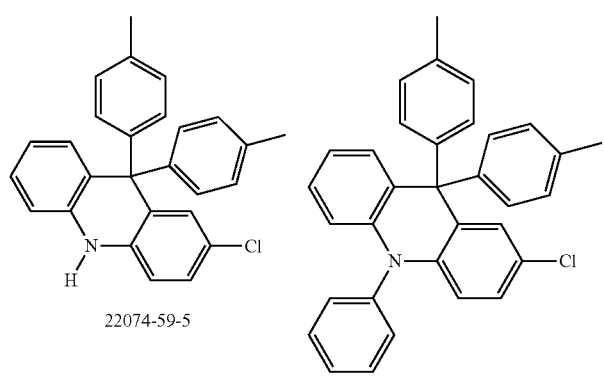<br>22074-59-5 | 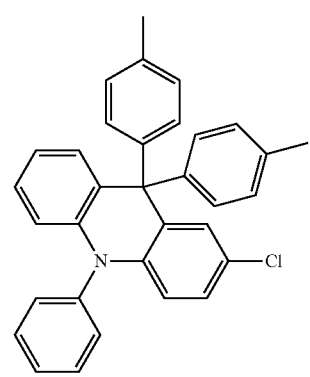 [SMILES: Cc1ccc(C2(c3ccc(C)cc3)c3ccccc3N(c3ccccc3)c3ccc(Cl)cc32)cc1] | 69% |
| 4a | 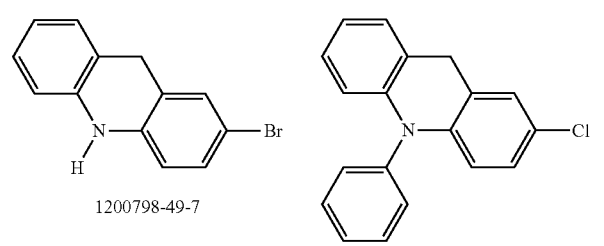<br>1200798-49-7 | 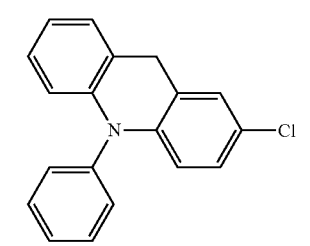 [SMILES: Clc1ccc2c(c1)Cc1ccccc1N2c1ccccc1] | 63% |
| 5a | 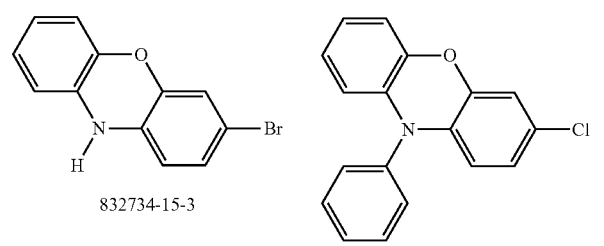<br>832734-15-3 | 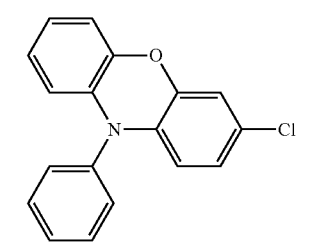 [SMILES: Clc1ccc2c(c1)Oc1ccccc1N2c1ccccc1] | 87% |
| 6a | 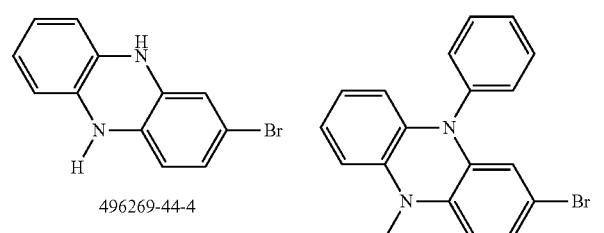<br>496269-44-4 | 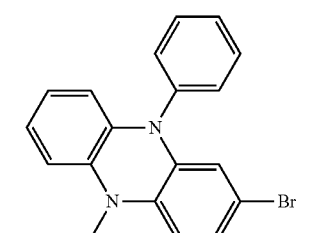 | 73% |
| 7a | 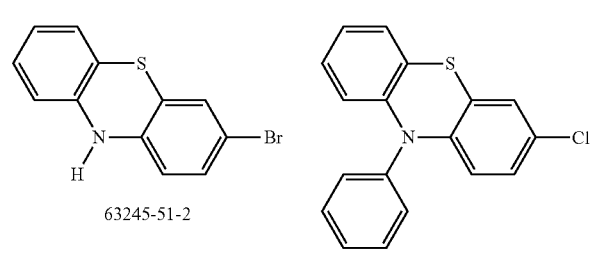<br>63245-51-2 | 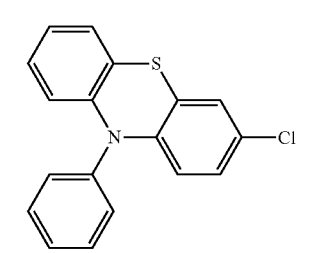 [SMILES: Clc1ccc2c(c1)Sc1ccccc1N2c1ccccc1] | 63% |

-continued

| Ex. | Starting material 1 | Product | Yield |
|---|---|---|---|
| 8a | 197861-19-1 | | 69% |
| 9a | 7497-52-1 | | 59% |

II) Synthesis of Intermediate 1b and Analogous Compounds 2b-9b

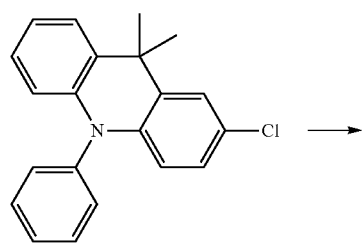

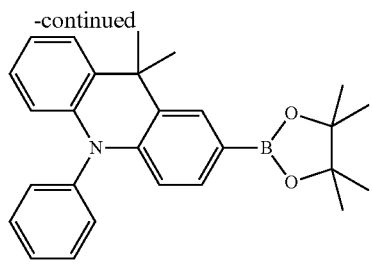

51 g (161 mmol) of 2-chloro-9,9-dimethyl-10-phenyl-9,10-dihydroacridine (compound 1a), 53.3 g (210 mmol) of bis(pinacolato)diborane and 26 g (274 mmol) of potassium acetate are suspended in 800 ml of dioxane. 11.9 g (16.1 mmol) of 1,1-bis(diphenylphosphino)ferrocenepalladium (II) dichloride complex with dichloromethane are added to this suspension. The reaction mixture is heated under reflux for 16 h. After cooling, the organic phase is separated off, washed three times with 150 ml of water and subsequently evaporated to dryness. The residue is recrystallised from toluene. The yield is 48 g (72 mmol, 90%) of compound 1b.

Compounds 2b-8b are obtained analogously:

| Ex. | Starting material 1 | Product | Yield |
|---|---|---|---|
| 2b | 2a | | 88% |

-continued

| Ex. | Starting material 1 | Product | Yield |
|---|---|---|---|
| 3b | 3a | | 69% |
| 4b | 4a | | 63% |
| 5b | 5a | | 87% |
| 6b | 6a | | 85% |

-continued

| Ex. | Starting material 1 | Product | Yield |
|---|---|---|---|
| 7b | 7a | | 78% |
| 8b | 8a | | 69% |
| 9b | 9a | | 77% |

III) Synthesis of Intermediates A-C

Intermediate A:
4-(2-bromophenyl)-2,6-diphenylpyrimidine

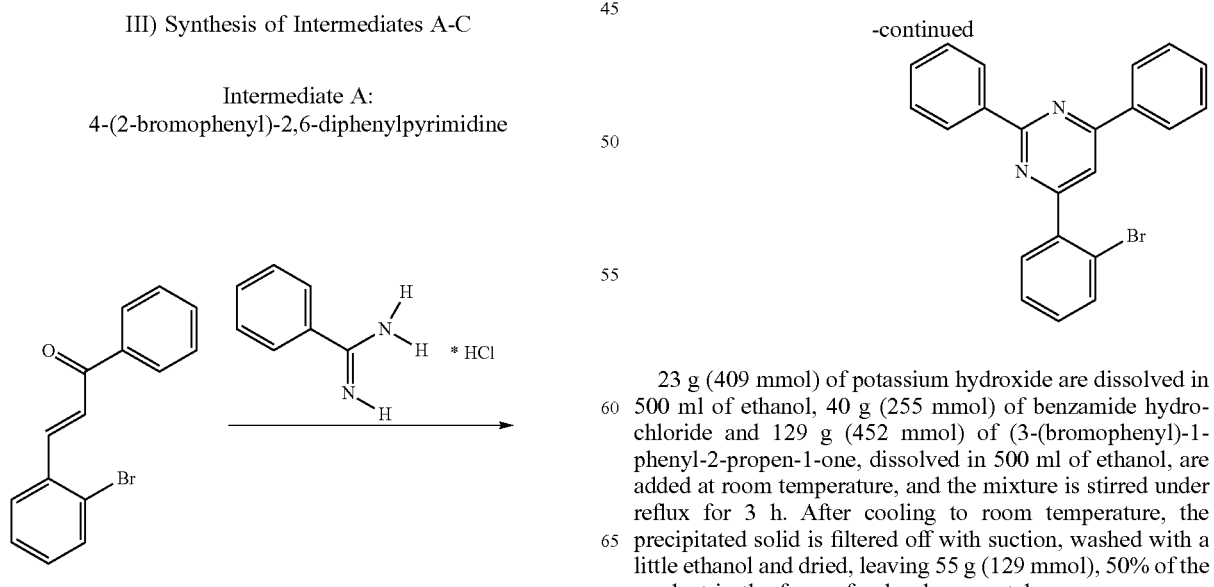

23 g (409 mmol) of potassium hydroxide are dissolved in 500 ml of ethanol, 40 g (255 mmol) of benzamide hydrochloride and 129 g (452 mmol) of (3-(bromophenyl)-1-phenyl-2-propen-1-one, dissolved in 500 ml of ethanol, are added at room temperature, and the mixture is stirred under reflux for 3 h. After cooling to room temperature, the precipitated solid is filtered off with suction, washed with a little ethanol and dried, leaving 55 g (129 mmol), 50% of the product in the form of colourless crystals.

Intermediate B:
(3'-Bromobiphenyl-3-yl)phenylmethanone

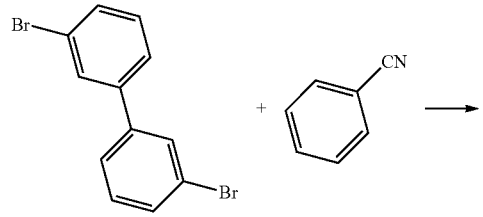

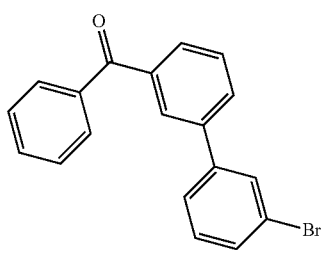

The corresponding Grignard reagent is prepared from a solution of 31.5 g (101 mmol) of 3,3'-dibromobiphenyl and 1 ml of 1,2-dichloroethane in 30 ml of 1,2-dimethoxyethane and 300 ml of THF and 2.8 g (115 mmol) of magnesium at the boiling temperature. A solution of 10.4 g (101 mmol) of benzonitrile in a mixture of 130 ml of THF and 130 ml of toluene is added dropwise to this Grignard solution at 0-5° C. over the course of 20 min. The mixture is subsequently heated under reflux for 16 h. After cooling, the reaction mixture is evaporated to dryness. The solid is taken up in 1000 ml of NMP and heated under reflux for 12 h with 40 ml of water and 2 ml of glacial acetic acid. A mixture of 600 ml of methanol and 600 ml of 1N hydrochloric acid is added, and the precipitated solid is separated off by filtration and dried. The crude product is recrystallised from toluene/heptane. The yield, with a purity>98% according to HPLC, is 27.1 g (80.5 mmol), corresponding to 80% of theory.

Intermediate C:
Bis(3'-bromobiphenyl-3-yl)methanone

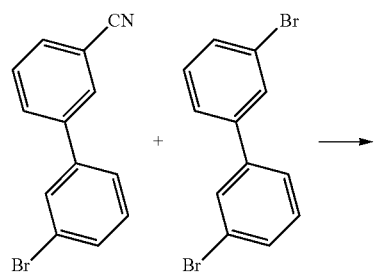

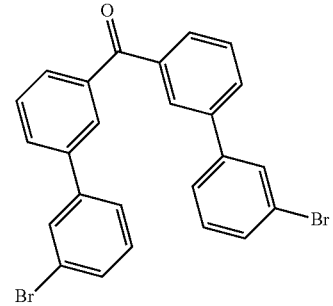

The corresponding Grignard reagent is prepared from a solution of 31.5 g (101 mmol) of 3,3'-dibromobiphenyl, 1 ml of 1,2-dichloroethane and 30 ml of 1,2-dimethoxyethane in 300 ml of THF and 2.8 g (115 mmol) of magnesium at the boiling temperature. A solution of 26.06 g (101 mmol) of 3-bromo-3'-cyanobiphenyl in a mixture of 130 ml of THF and 130 ml of toluene is added dropwise to this Grignard solution at 0-5° C. over the course of 20 min. The mixture is subsequently heated under reflux for 16 h. After cooling, the reaction mixture is evaporated to dryness. The solid is taken up in 1100 ml of NMP and heated under reflux for 24 h with ml of water and 5 ml of glacial acetic acid. A mixture of 600 ml of methanol and 600 ml of 1N hydrochloric acid is added, and the precipitated solid is separated off by filtration and dried. The crude product is recrystallised three times from toluene/heptane. The yield, with a purity>97% according to HPLC, is 34.8 g (70.7 mmol) corresponding to 70.1% of theory.

IV) Synthesis of Example Compound 1 and Analogous Compounds 2-12

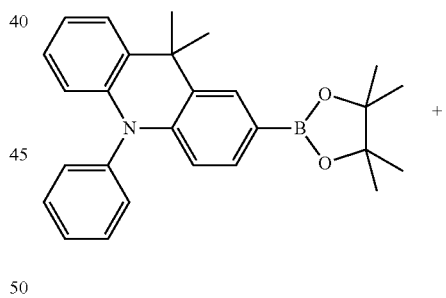

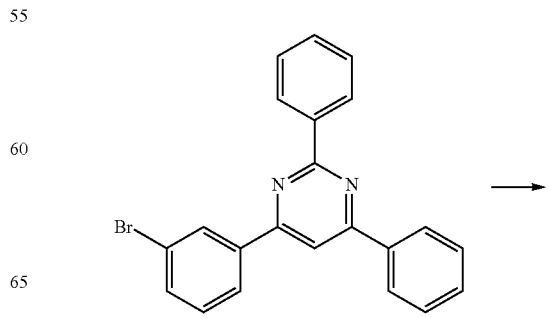

-continued

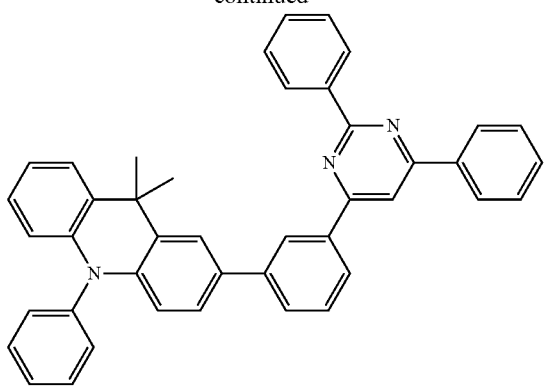

16 g (43.3 mmol) of 2-(3-bromophenyl)-4,6-diphenylpyrimidine ([864377-28-6]) and 19.3 g (48 mmol) of 7-borono-12,12-dimethyl-10-phenyl-10,12-dihydro-10-azaindeno[2,1-b]fluorene (compound 1b) are dissolved in 80 ml of toluene and degassed. 281 ml of a degassed 2M $K_2CO_3$ solution and 2.5 g (2.2 mmol) of $Pd(OAc)_2$ are added. The reaction mixture is subsequently stirred at 80° C. under a protective-gas atmosphere for 48 h. The cooled solution is diluted with toluene, washed a number of times with water, dried and evaporated. The product is purified by column chromatography on silica gel with toluene/heptane (1:2). The purity is 99.9%. Yield: 22 g (31 mmol, 77%) of theory.

Compounds 2-12 are obtained analogously:

| Ex. | Starting material 1 | Starting material 2 |
|---|---|---|
| 2 | 1b | A |
| 3 | 1b | |
| 4 | 2b | |

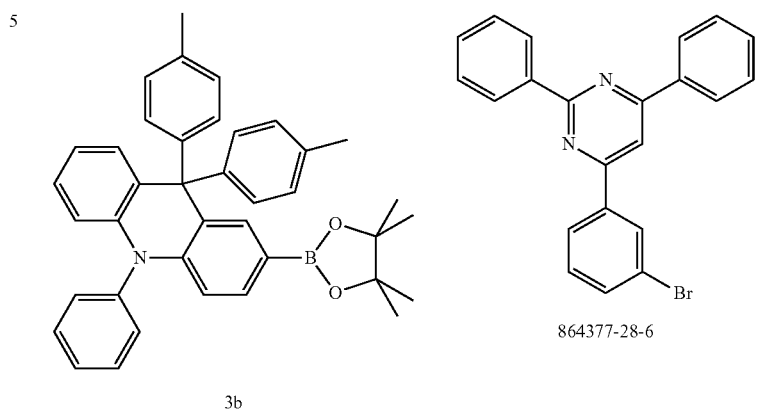
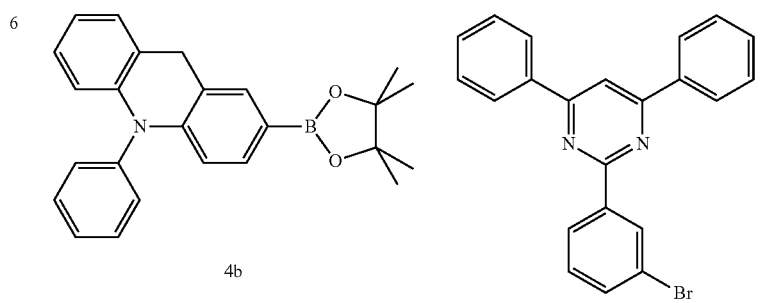
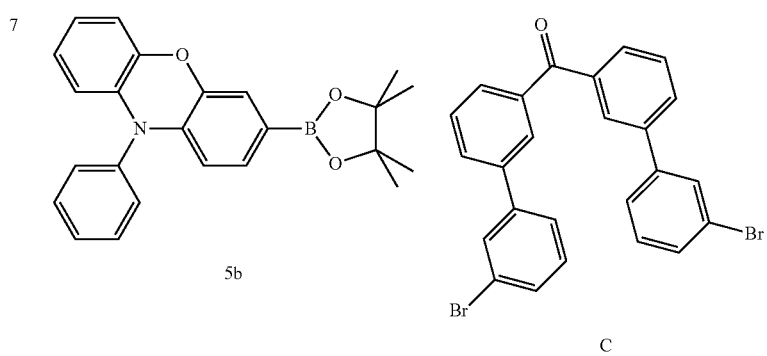
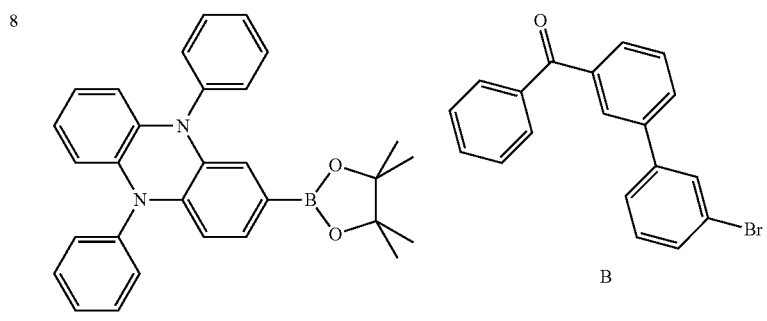

-continued
9 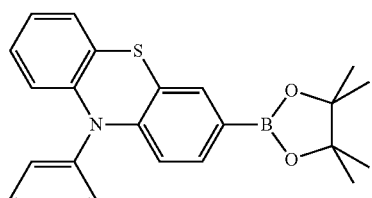
7b
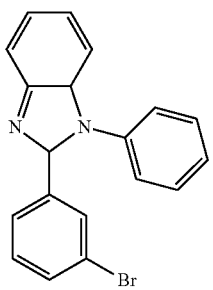
760212-40-6
10 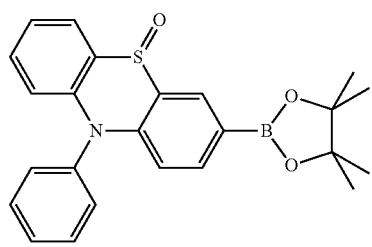 [SMILES: CC1(C)OB(c2ccc3c(c2)S(=O)c2ccccc2N3c2ccccc2)OC1(C)C]
8b
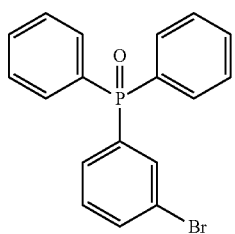
10212-04-1
11 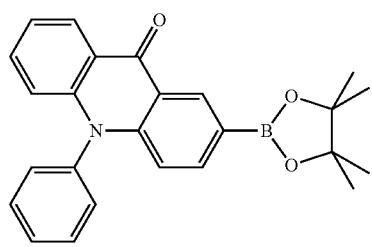 [SMILES: CC1(C)OB(c2ccc3c(c2)c(=O)c2ccccc2n3-c2ccccc2)OC1(C)C]
9b
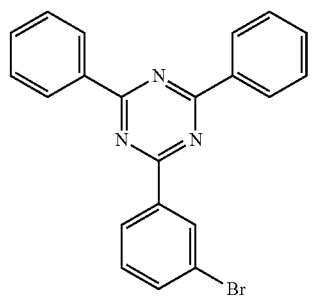 [SMILES: Brc1cccc(-c2nc(-c3ccccc3)cc(-c3ccccc3)n2)c1]
864377-31-1
12 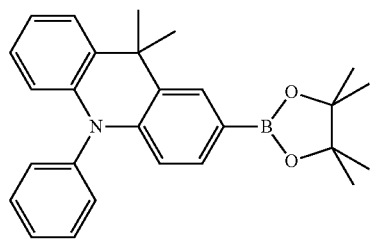
1b
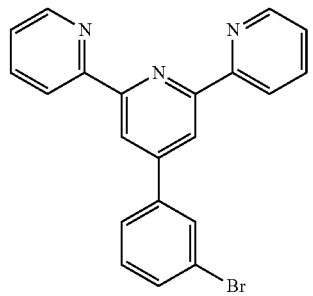
879879-65-9

-continued
| Ex. | Product | Yield |
|---|---|---|
| 2 | 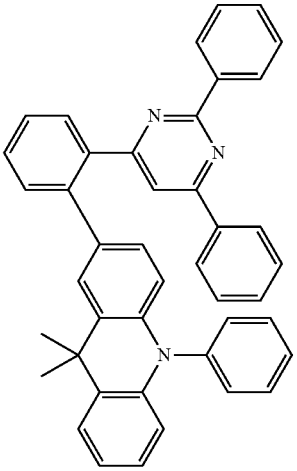 [SMILES: CC1(C)c2ccccc2N(c2ccccc2)c2ccc(-c3ccccc3-c3cc(-c4ccccc4)nc(-c4ccccc4)n3)cc21] | 69% |
| 3 | 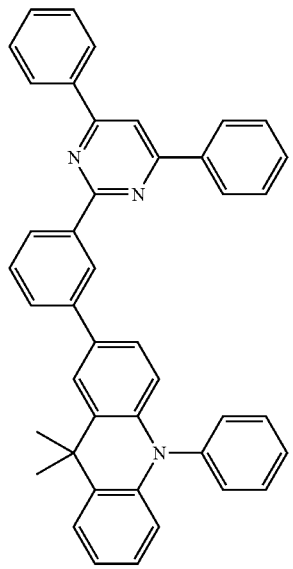 [SMILES: CC1(C)c2ccccc2N(c2ccccc2)c2ccc(-c3cccc(-c4nc(-c5ccccc5)cc(-c5ccccc5)n4)c3)cc21] | 79% |
| 4 | 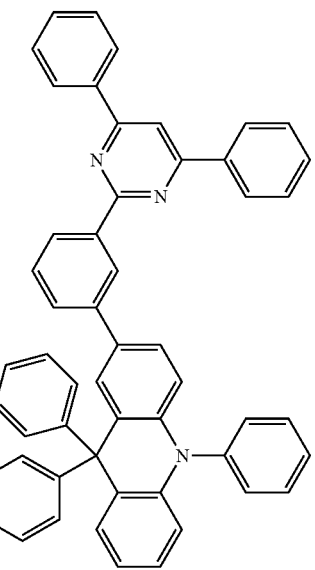 | 77% |

-continued
| 5 | 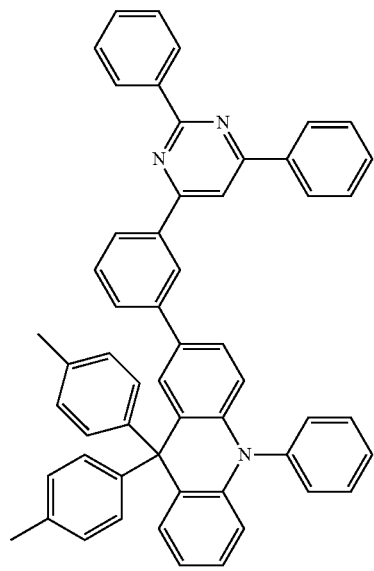 [SMILES: Cc1ccc(C2(c3ccc(C)cc3)c3ccccc3N(c3ccccc3)c3ccc(-c4cccc(-c5cc(-c6ccccc6)nc(-c6ccccc6)n5)c4)cc32)cc1] | 78% |
| 6 | 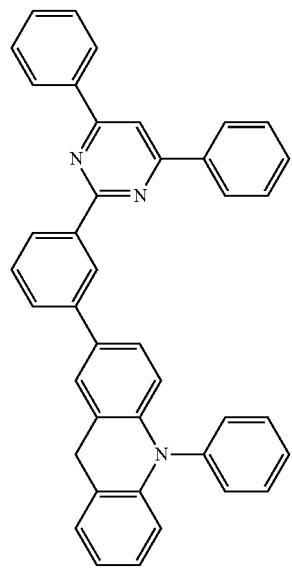 [SMILES: c1ccc(-c2cc(-c3ccccc3)nc(-c3cccc(-c4ccc5c(c4)Cc4ccccc4N5c4ccccc4)c3)n2)cc1] | 85% |

| | | |
|---|---|---|
| 7 | 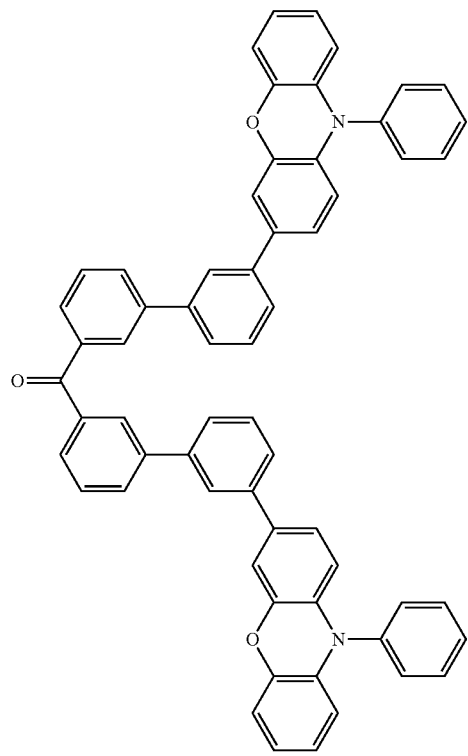 [SMILES: O=C(c1cccc(-c2cccc(-c3ccc4c(c3)Oc3ccccc3N4c3ccccc3)c2)c1)c1cccc(-c2cccc(-c3ccc4c(c3)Oc3ccccc3N4c3ccccc3)c2)c1] | 65% |
| 8 | 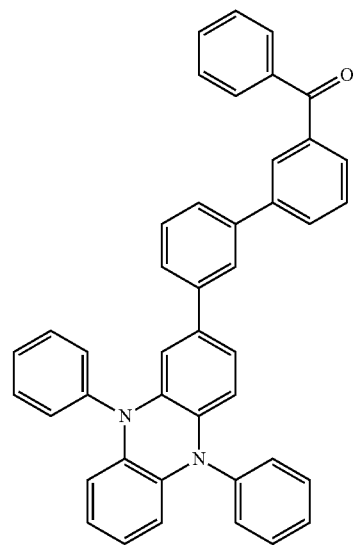 [SMILES: O=C(c1ccccc1)c1cccc(-c2cccc(-c3ccc4c(c3)N(c3ccccc3)c3ccccc3N4c3ccccc3)c2)c1] | 91% |

| | | |
|---|---|---|
| 9 | 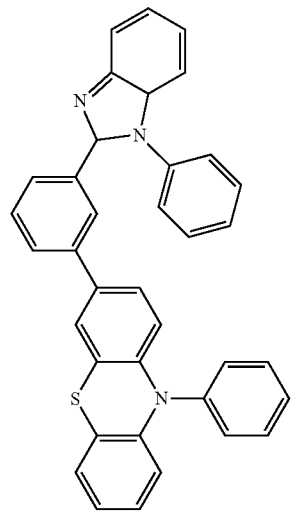 [SMILES: C1=CC2=NC(c3cccc(-c4ccc5c(c4)Sc4ccccc4N5c4ccccc4)c3)N(c3ccccc3)C2C=C1] | 88% |
| 10 | 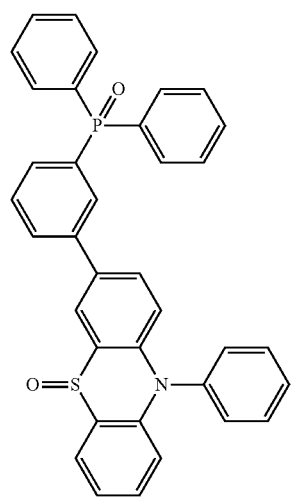 [SMILES: O=S1c2ccccc2N(c2ccccc2)c2ccc(-c3cccc(P(=O)(c4ccccc4)c4ccccc4)c3)cc21] | 74% |
| 11 | 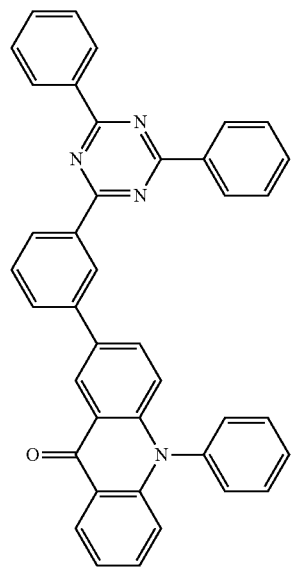 [SMILES: O=c1c2ccccc2n(-c2ccccc2)c2ccc(-c3cccc(-c4nc(-c5ccccc5)nc(-c5ccccc5)n4)c3)cc12] | 83% |

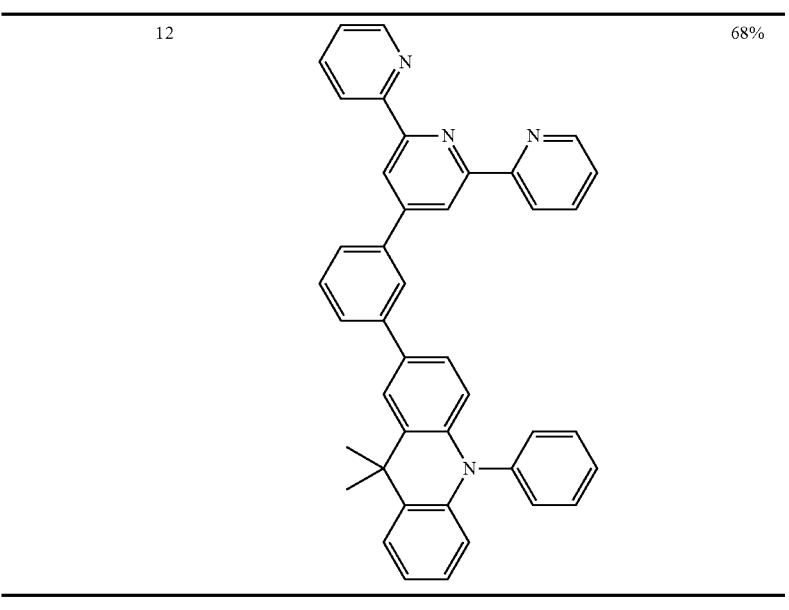

V) Synthesis of Example Compound 13 and Analogous Compounds 14-24

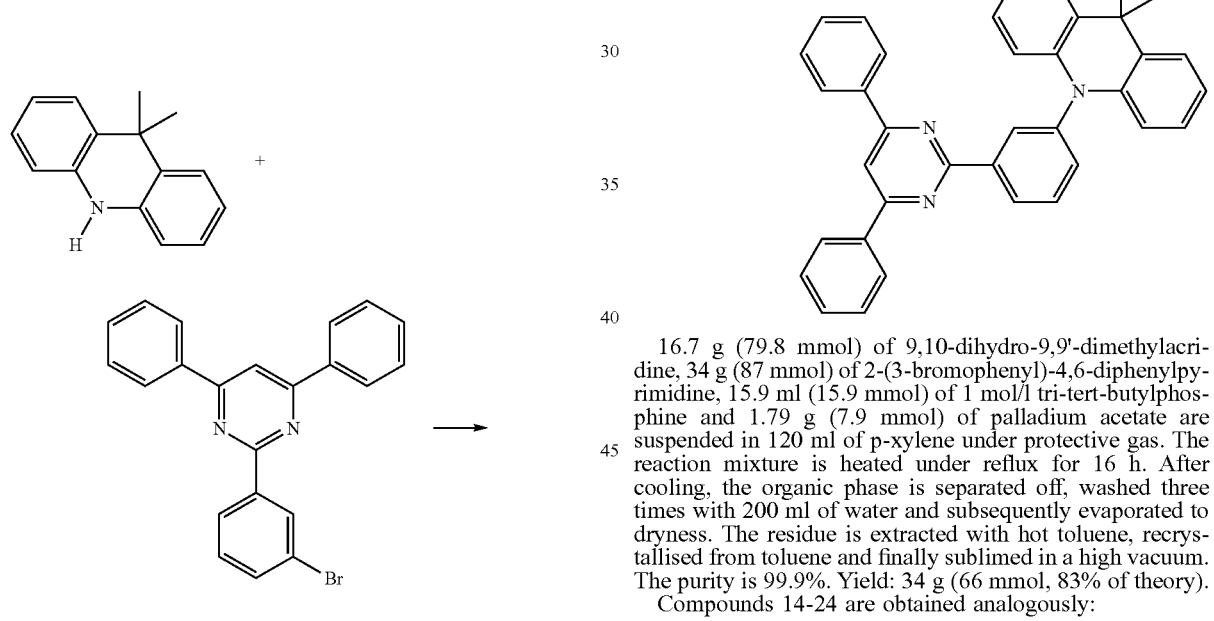

16.7 g (79.8 mmol) of 9,10-dihydro-9,9'-dimethylacridine, 34 g (87 mmol) of 2-(3-bromophenyl)-4,6-diphenylpyrimidine, 15.9 ml (15.9 mmol) of 1 mol/l tri-tert-butylphosphine and 1.79 g (7.9 mmol) of palladium acetate are suspended in 120 ml of p-xylene under protective gas. The reaction mixture is heated under reflux for 16 h. After cooling, the organic phase is separated off, washed three times with 200 ml of water and subsequently evaporated to dryness. The residue is extracted with hot toluene, recrystallised from toluene and finally sublimed in a high vacuum. The purity is 99.9%. Yield: 34 g (66 mmol, 83% of theory).

Compounds 14-24 are obtained analogously:

| | | |
|---|---|---|
| 15 | 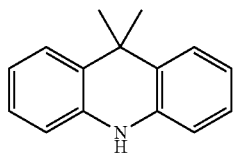 [SMILES: CC1(C)c2ccccc2Nc2ccccc21] | 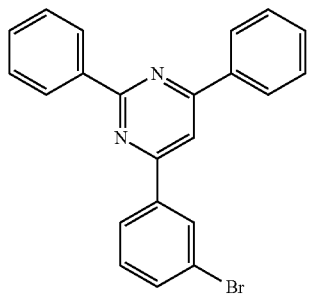<br>864377-28-6 |
| 16 | 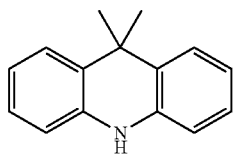 | 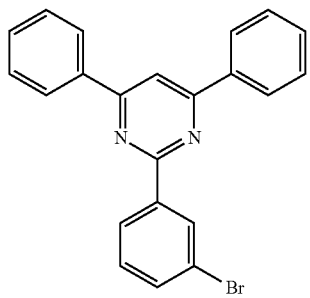 [SMILES: Brc1cccc(-c2nc(-c3ccccc3)cc(-c3ccccc3)n2)c1] |
| 17 | 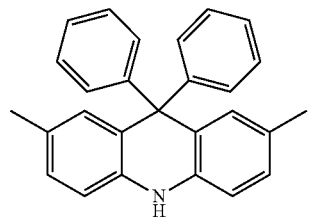<br>92638-87-4 | 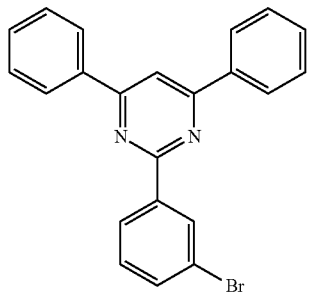 [SMILES: Brc1cccc(-c2nc(-c3ccccc3)cc(-c3ccccc3)n2)c1] |
| 18 | 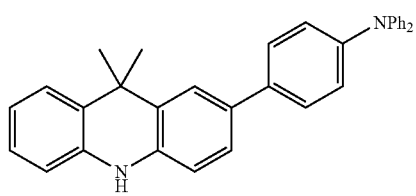<br>1236106-99-2 | 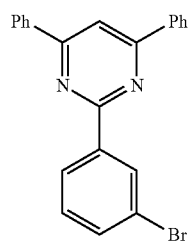 [SMILES: Brc1cccc(-c2nc(-c3ccccc3)cc(-c3ccccc3)n2)c1] |
| 19 | 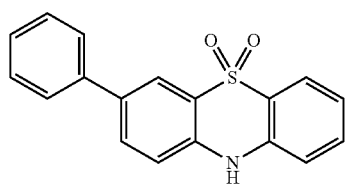<br>888008-94-4 | 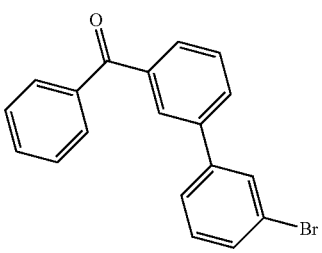<br>B |

| | | | |
|---|---|---|---|
| 20 | 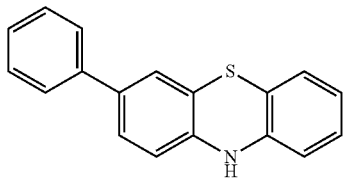
4018-68-2 | 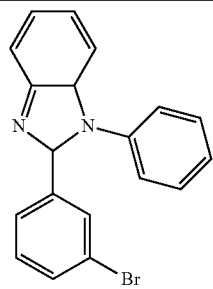
760212-40-6 | |
| 21 | 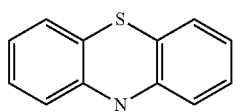
92-84-2 | 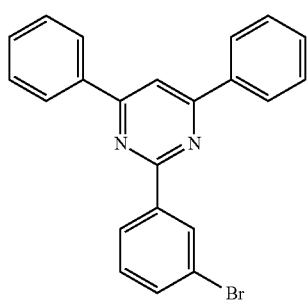 [SMILES: Brc1cccc(-c2nc(-c3ccccc3)cc(-c3ccccc3)n2)c1] | |
| 22 | 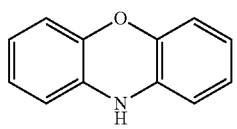
135-67-1 | 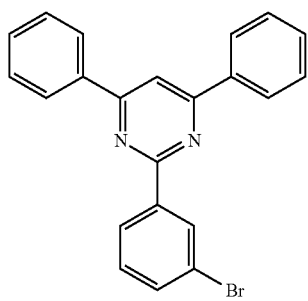 [SMILES: Brc1cccc(-c2nc(-c3ccccc3)cc(-c3ccccc3)n2)c1] | |
| 23 | 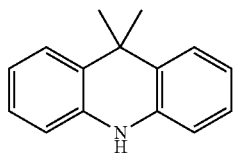 [SMILES: CC1(C)c2ccccc2Nc2ccccc21] | 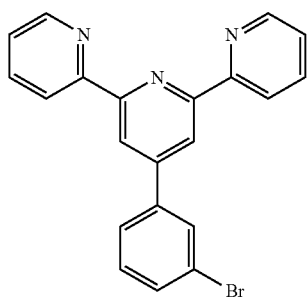
879879-65-9 | |
| 24 | 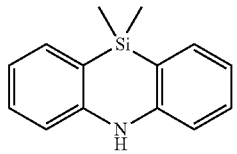
89590-57-8 | 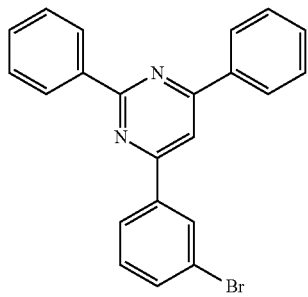
864377-28-6 | |

-continued
| Ex. | Product | Yield |
|---|---|---|
| 14 | 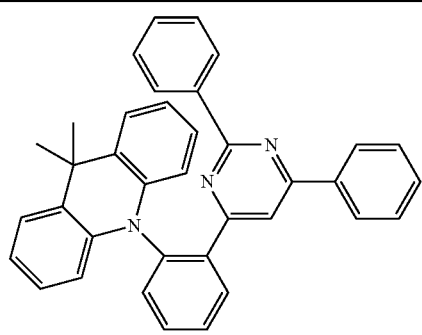 | 66% |
| 15 | 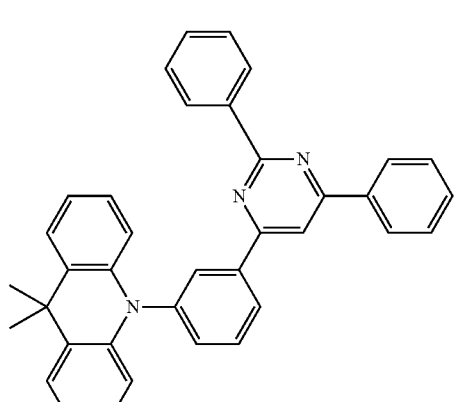 | 71% |
| 16 | 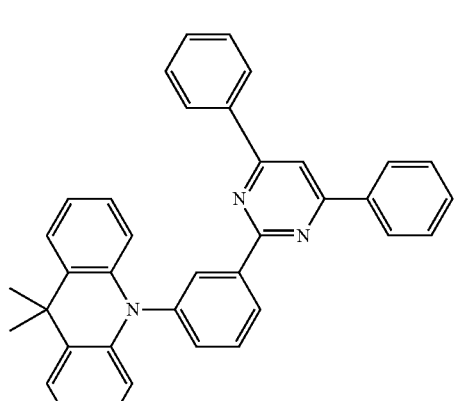 | 73% |
| 17 | 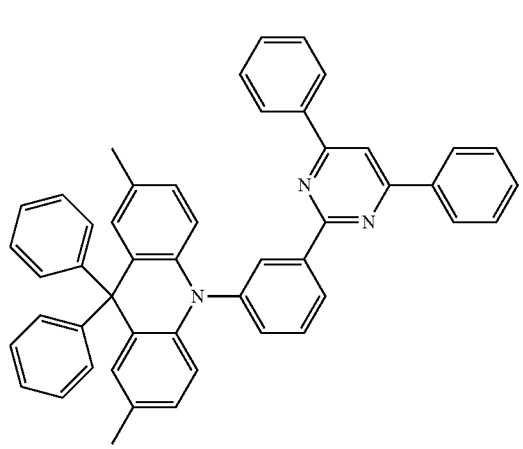 [SMILES: Cc1ccc2c(c1)C(c1ccccc1)(c1ccccc1)c1cc(C)ccc1N2c1cccc(-c2nc(-c3ccccc3)cc(-c3ccccc3)n2)c1] | 78% |

-continued
| | | |
|---|---|---|
| 18 | 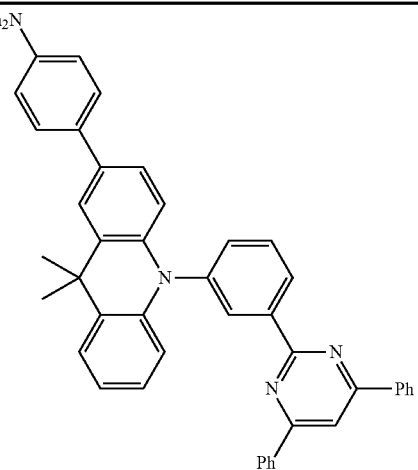 | 82% |
| 19 | 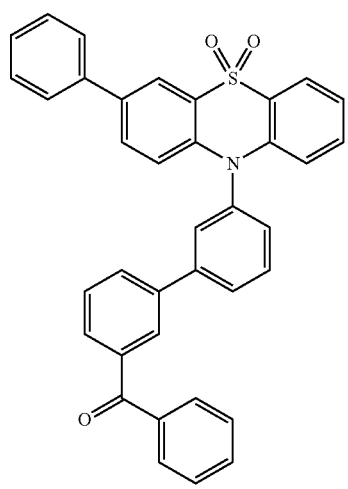 [SMILES: O=C(c1ccccc1)c1cccc(-c2cccc(N3c4ccccc4S(=O)(=O)c4cc(-c5ccccc5)ccc43)c2)c1] | 69% |
| 20 | 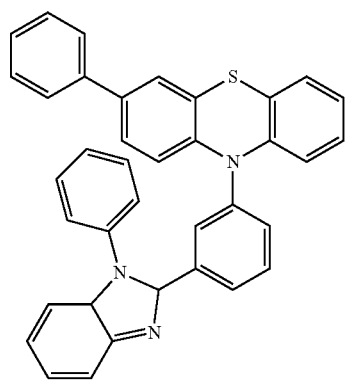 [SMILES: C1=CC2=NC(c3cccc(N4c5ccccc5Sc5cc(-c6ccccc6)ccc54)c3)N(c3ccccc3)C2C=C1] | 77% |

-continued
| 21 | 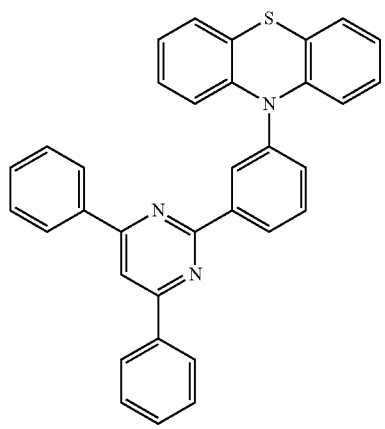 | 67% |
| 22 | 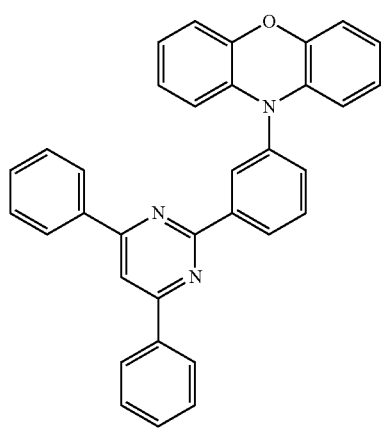 | 82% |
| 23 | 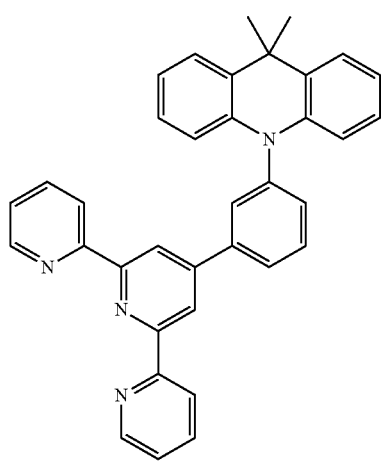 [SMILES: CC1(C)c2ccccc2N(c2cccc(-c3cc(-c4ccccn4)nc(-c4ccccn4)c3)c2)c2ccccc21] | 79% |

24          67%

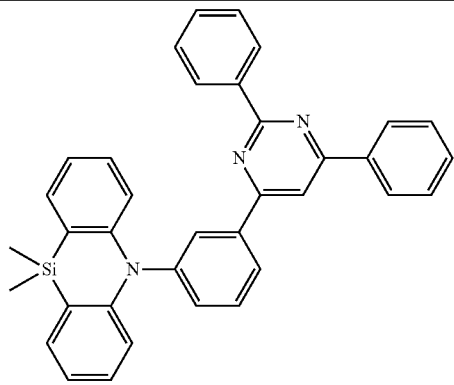

B) Device Examples

OLEDs according to the invention and OLEDs in accordance with the prior art are produced by a general process in accordance with WO 2004/058911, which is adapted to the circumstances described here (layer-thickness variation, materials).

The data for various OLEDs are presented in Examples V1 to E14 below (see Tables 1 and 2). Glass plates coated with structured ITO (indium tin oxide) in a thickness of 150 nm are coated with 20 nm of PEDOT (poly(3,4-ethylenedioxy-2,5-thiophene), applied by spin coating from water; purchased from H. C. Starck, Goslar, Germany) for improved processing. These coated glass plates form the substrates to which the OLEDs are applied. The OLEDs basically have the following layer structure: substrate/hole-transport layer (HTL)/optional interlayer (IL)/electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The precise structure of the OLEDs is shown in Table 1. The materials required for the production of the OLEDs are shown in Table 3.

All materials are applied by thermal vapour deposition in a vacuum chamber. The emission layer here always consists of at least one matrix material (host material) and an emitting dopant (emitter), to which the matrix material or matrix materials is admixed in a certain proportion by volume by co-evaporation. An expression such as ST1:H15:TEG1 (75%:15%:10%) here means that material ST1 is present in the layer in a proportion by volume of 75%, H15 is present in the layer in a proportion of 15% and TEG1 is present in the layer in a proportion of 10%. Analogously, the electron-transport layer may also consist of a mixture of two materials.

The OLEDs are characterised by standard methods. For this purpose, the electroluminescence spectra, the current efficiency (measured in cd/A), the power efficiency (measured in lm/W) and the external quantum efficiency (EQE, measured in percent) as a function of the luminous density, calculated from current/voltage/luminous density characteristic lines (IUL characteristic lines) assuming Lambert emission characteristics) are determined. The electroluminescence spectra are determined at a luminous density of 1000 cd/m², and the CIE 1931x and y colour coordinates are calculated therefrom. The expression U1000 in Table 2 denotes the voltage required for a luminous density of 1000 cd/m². CE1000 and PE1000 denote the current and power efficiency respectively which are achieved at 1000 cd/m². Finally, EQE1000 denotes the external quantum efficiency at an operating luminous density of 1000 cd/m².

The data of the various OLEDs are summarised in Table 2. Examples V1 and V2 are comparative examples with materials in accordance with the prior art, E1-E14 show data of OLEDs with materials according to the invention.

Some of the examples are explained in greater detail below in order to illustrate the advantages of the compounds according to the invention.

However, it should be pointed out that this only represents a selection of the data shown in Table 2. As can be seen from the table, good to very good performance data are also achieved on use of the compounds according to the invention that are not shown in greater detail.

Use of Compounds According to the Invention as Matrix Materials in Phosphorescent OLEDs The materials according to the invention are suitable, in particular, for use as matrix materials in phosphorescent OLEDs, either as a single material (Examples E1, E2, E8-E13) or as component in a mixed-matrix system (Examples E3-E7). Very good performance data can be achieved in this case. For example, with compound H6 in combination with dopant TEG1, a voltage of only 3.7 V, an external quantum efficiency of 15.5% and very good power efficiency of 48 lm/W are obtained (Example E11). If the corresponding OLED is operated with constant current density, the initial luminous density of 8000 cd/m² drops to 6400 cd/m² within 180 h, which corresponds to a good value.

Comparison with the Prior Art

Compared with compound H1 from the prior art, an up to 20% increased quantum efficiency is obtained on use of compounds H9 and H10. Furthermore, a significant advantage arises with respect to the lifetime: while a drop in the luminous density from 8000 cd/m² to 6400 cd/m² within about 105 h is observed on operation with constant current density for H1, this value is only achieved after about 125 h for H9 and after about 140 h for H10 (Examples V1, E1 and E2). Compared with H2 (prior art), a significant improvement in the efficiency by somewhat more than 25% is evident with material H12 according to the invention (Examples V2, E4). The lifetime with H12 is about 15% longer.

The materials according to the invention thus give rise to significant improvements compared with the prior art, especially with respect to lifetime and efficiency, on use as matrix materials in phosphorescent OLEDs.

Use of Compounds According to the Invention as Electron-Transport Materials

Furthermore, the compounds according to the invention can be employed in the electron-transport layer. For example, with compound H7 and a layer of LiQ with a thickness of 3 nm as electron-injection material, a voltage of 3.9 V and a quantum efficiency of 15.3% are obtained (Example E14). For this example, a very good lifetime is furthermore measured: on operation with constant current density, the luminous density drops from 8000 cd/m² to 6400 cd/m² within about 220 h.

TABLE 1

Structure of the OLEDs

| Ex. | HTL Thickness | IL Thickness | EBL Thickness | EML Thickness | HBL Thickness | ETL Thickness | EIL Thickness |
|---|---|---|---|---|---|---|---|
| V1 | SpA1 70 nm | HATCN 5 nm | BPA1 90 nm | H1:TEG1 (90%:10%) 30 nm | ST1 10 nm | ST2:LiQ (50%:50%) 30 nm | — |
| V2 | SpA1 70 nm | HATCN 5 nm | BPA1 90 nm | ST1:H2:TEG1 (75%:15%:10%) 30 nm | ST1 10 nm | ST2:LiQ (50%:50%) 30 nm | — |
| E1 | SpA1 70 nm | HATCN 5 nm | BPA1 90 nm | H9:TEG1 (90%:10%) 30 nm | ST1 10 nm | ST2:LiQ (50%:50%) 30 nm | — |
| E2 | SpA1 70 nm | HATCN 5 nm | BPA1 90 nm | H10:TEG1 (90%:10%) 30 nm | ST1 10 nm | ST2:LiQ (50%:50%) 30 nm | — |
| E3 | SpA1 20 nm | — | NPB 20 nm | ST1:H11:TER1 (70%:20%:10%) 30 nm | ST1 30 nm | Alq₃ 20 nm | LiF 1 nm |
| E4 | SpA1 70 nm | HATCN 5 nm | BPA1 90 nm | ST1:H12:TEG1 (75%:15%:10%) 30 nm | ST1 10 nm | ST2:LiQ (50%:50%) 30 nm | — |
| E5 | SpA1 20 nm | — | NPB 20 nm | ST1:H13:TER1 (75%:15%:10%) 30 nm | ST1 30 nm | Alq₃ 20 nm | LiF 1 nm |
| E6 | SpA1 20 nm | — | NPB 20 nm | ST1:H14:TER1 (75%:15%:10%) 30 nm | ST1 30 nm | Alq₃ 20 nm | LiF 1 nm |
| E7 | SpA1 70 nm | HATCN 5 nm | BPA1 90 nm | ST1:H15:TEG1 (75%:15%:10%) 30 nm | IC1 10 nm | ST2:LiQ (50%:50%) 30 nm | — |
| E8 | SpA1 70 nm | HATCN 5 nm | BPA1 90 nm | H3:TEG1 (90%:10%) 30 nm | IC1 10 nm | ST2:LiQ (50%:50%) 30 nm | — |
| E9 | SpA1 70 nm | HATCN 5 nm | BPA1 90 nm | H4:TEG1 (90%:10%) 30 nm | IC1 10 nm | ST2:LiQ (50%:50%) 30 nm | — |
| E10 | SpA1 70 nm | HATCN 5 nm | BPA1 90 nm | H5:TEG1 (90%:10%) 30 nm | IC1 10 nm | ST2:LiQ (50%:50%) 30 nm | — |
| E11 | SpA1 70 nm | HATCN 5 nm | BPA1 90 nm | H6:TEG1 (90%:10%) 30 nm | IC1 10 nm | ST2:LiQ (50%:50%) 30 nm | — |
| E12 | SpA1 70 nm | HATCN 5 nm | BPA1 90 nm | H7:TEG1 (90%:10%) 30 nm | IC1 10 nm | ST2:LiQ (50%:50%) 30 nm | — |
| E13 | SpA1 70 nm | HATCN 5 nm | BPA1 90 nm | H8:TEG1 (90%:10%) 30 nm | IC1 10 nm | ST2:LiQ (50%:50%) 30 nm | — |
| E14 | SpA1 70 nm | HATCN 5 nm | BPA1 90 nm | IC1:TEG1 (90%:10%) 30 nm | — | H7 40 nm | LiQ 3 nm |

TABLE 2

Data of the OLEDs

| Ex. | U1000 (V) | CE1000 (cd/A) | PE1000 (lm/W) | EQE 1000 | CIE x/y at 1000 cd/m² |
|---|---|---|---|---|---|
| V1 | 3.8 | 44 | 36 | 12.1% | 0.36/0.61 |
| V2 | 3.6 | 36 | 32 | 10.3% | 0.35/0.59 |
| E1 | 3.9 | 50 | 41 | 14.0% | 0.36/0.61 |
| E2 | 3.7 | 53 | 45 | 14.7% | 0.36/0.61 |
| E3 | 4.3 | 9.1 | 6.6 | 12.8% | 0.68/0.32 |
| E4 | 3.7 | 47 | 40 | 13.1% | 0.36/0.61 |
| E5 | 4.7 | 8.2 | 5.5 | 11.6% | 0.68/0.32 |
| E6 | 4.2 | 9.3 | 6.9 | 13.1% | 0.68/0.32 |
| E7 | 4.0 | 53 | 41 | 14.6% | 0.37/0.60 |
| E8 | 3.5 | 47 | 43 | 13.2% | 0.36/0.61 |
| E9 | 3.3 | 57 | 54 | 15.8% | 0.36/0.61 |
| E10 | 4.1 | 54 | 41 | 15.0% | 0.36/0.60 |
| E11 | 3.7 | 56 | 48 | 15.5% | 0.36/0.61 |
| E12 | 4.2 | 45 | 34 | 12.5% | 0.36/0.61 |
| E13 | 3.9 | 51 | 41 | 14.3% | 0.36/0.61 |
| E14 | 3.9 | 55 | 44 | 15.3% | 0.37/0.60 |

TABLE 3

Structural formulae of the materials for the OLEDs

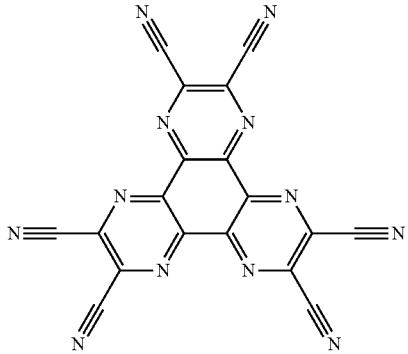 [SMILES: N#Cc1nc2c3nc(C#N)c(C#N)nc3c3nc(C#N)c(C#N)nc3c2nc1C#N]

HATCN

TABLE 3-continued
Structural formulae of the materials for the OLEDs
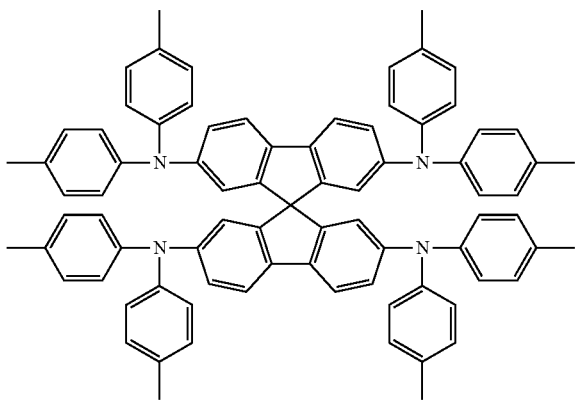
SpA1
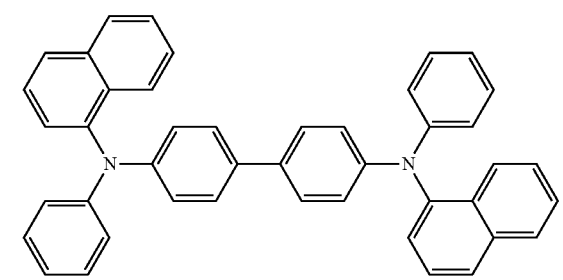 [SMILES: c1ccc(N(c2ccc(-c3ccc(N(c4ccccc4)c4cccc5ccccc45)cc3)cc2)c2cccc3ccccc23)cc1]
NPB
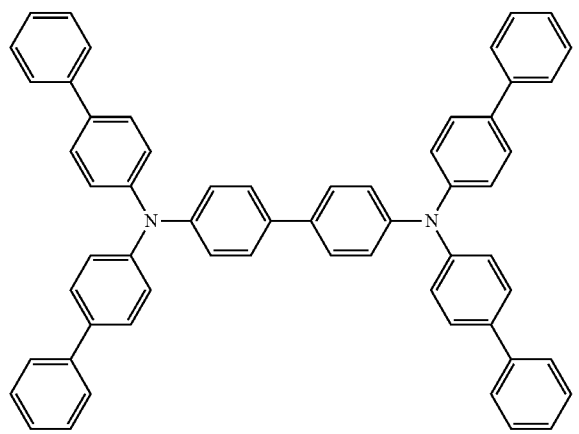 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
BPA1
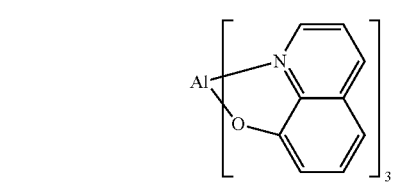
Alq₃
TABLE 3-continued
Structural formulae of the materials for the OLEDs
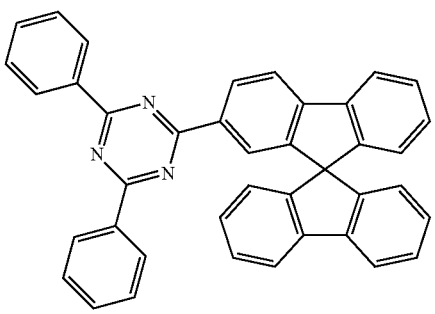 [SMILES: c1ccc(-c2nc(-c3ccccc3)nc(-c3ccc4c(c3)C3(c5ccccc5-c5ccccc53)c3ccccc3-4)n2)cc1]
ST1
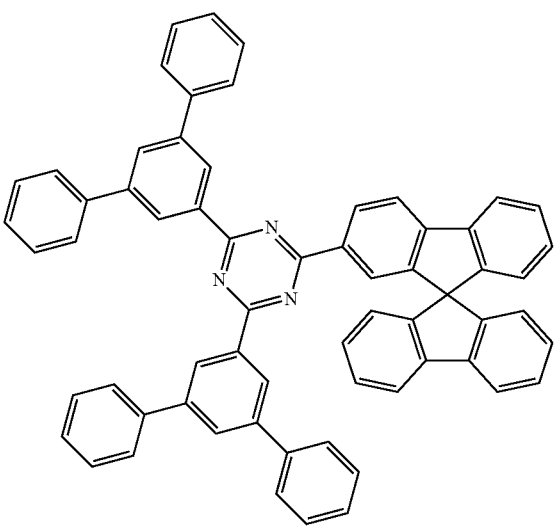 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
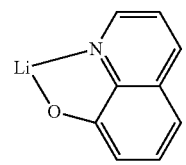
LiQ
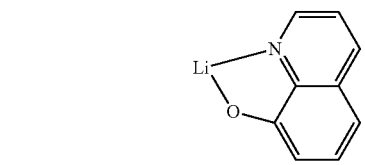
TEG1

TABLE 3-continued
Structural formulae of the materials for the OLEDs
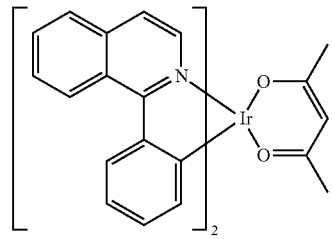
TER1
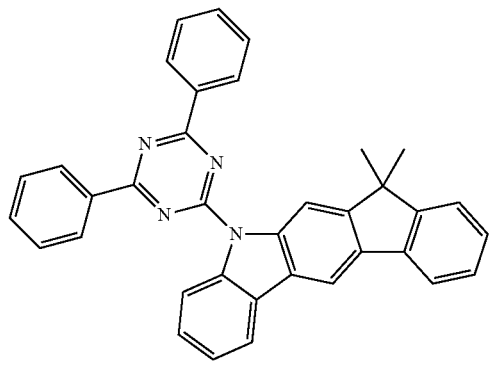 [SMILES: CC1(C)c2ccccc2-c2cc3c4ccccc4n(-c4nc(-c5ccccc5)nc(-c5ccccc5)n4)c3cc21]
IC1
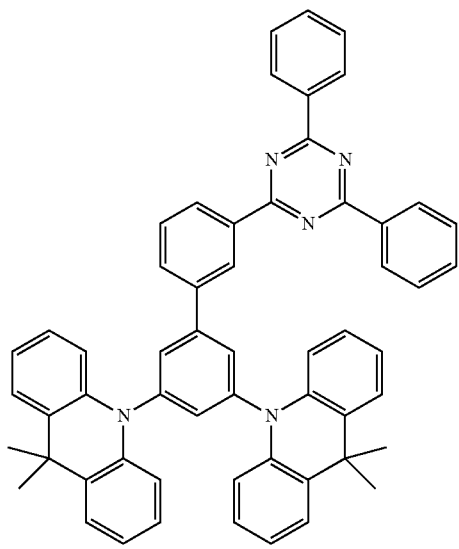 [SMILES: CC1(C)c2ccccc2N(c2cc(-c3cccc(-c4nc(-c5ccccc5)nc(-c5ccccc5)n4)c3)cc(N3c4ccccc4C(C)(C)c4ccccc43)c2)c2ccccc21]
H1 (prior art)
TABLE 3-continued
Structural formulae of the materials for the OLEDs
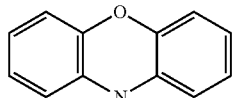
H2 (prior art)
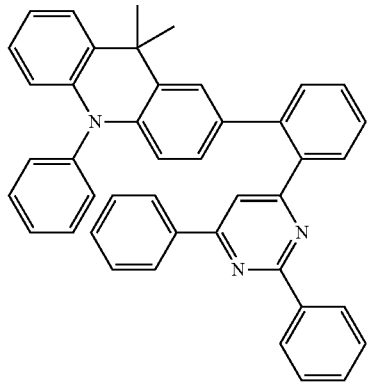 [SMILES: CC1(C)c2ccccc2N(c2ccccc2)c2ccc(-c3ccccc3-c3cc(-c4ccccc4)nc(-c4ccccc4)n3)cc21]
H3 (example compound 2)
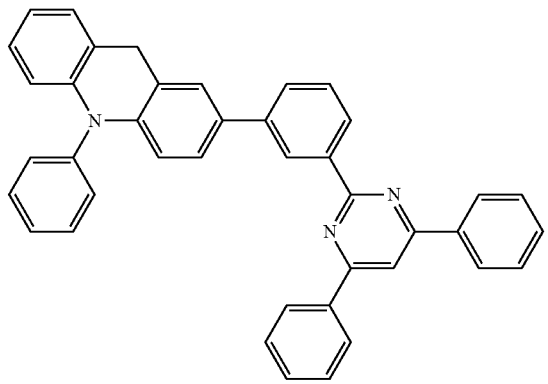 [SMILES: c1ccc(-c2cc(-c3ccccc3)nc(-c3cccc(-c4ccc5c(c4)Cc4ccccc4N5c4ccccc4)c3)n2)cc1]
H4 (example compound 6)

TABLE 3-continued
Structural formulae of the materials for the OLEDs
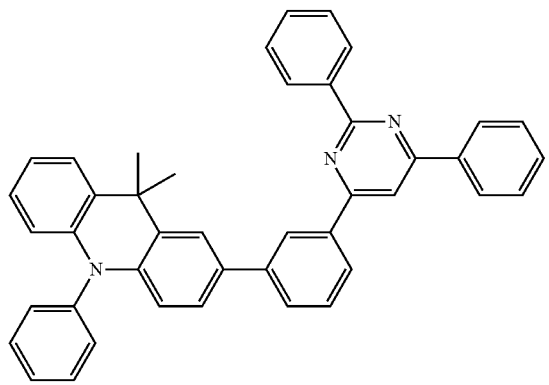 [SMILES: CC1(C)c2ccccc2N(c2ccccc2)c2ccc(-c3cccc(-c4cc(-c5ccccc5)nc(-c5ccccc5)n4)c3)cc21]
H5 (example compound 1)
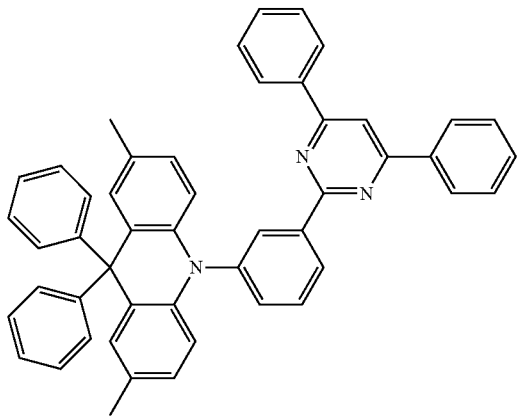
H8 (example compound 17)
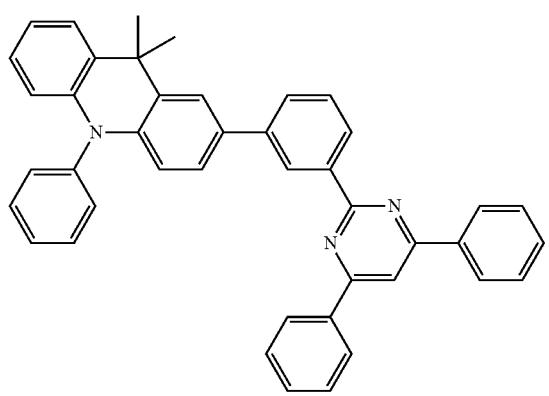 [SMILES: CC1(C)c2ccccc2N(c2ccccc2)c2ccc(-c3cccc(-c4nc(-c5ccccc5)cc(-c5ccccc5)n4)c3)cc21]
H6 (example compound 3)
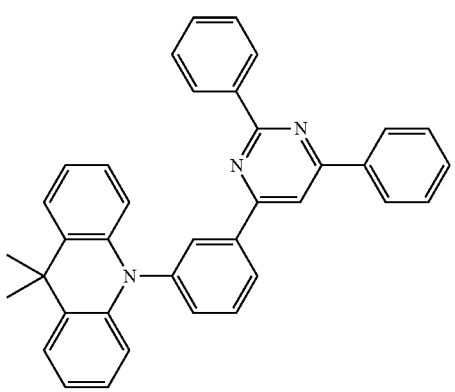
H9 (example compound 15)
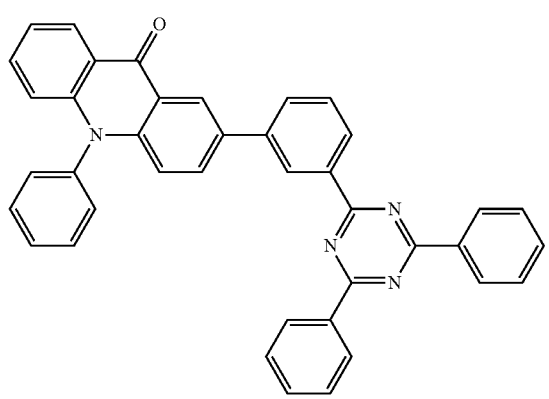 [SMILES: O=c1c2ccccc2n(-c2ccccc2)c2ccc(-c3cccc(-c4nc(-c5ccccc5)nc(-c5ccccc5)n4)c3)cc12]
H7 (example compound 11)
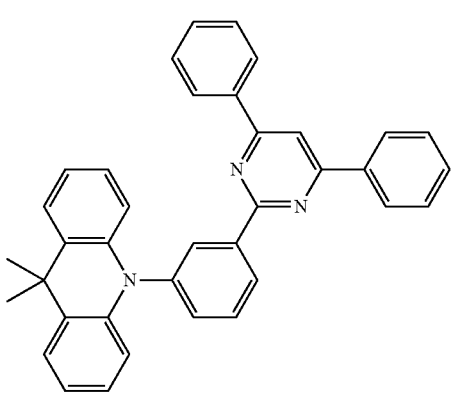 [SMILES: CC1(C)c2ccccc2N(c2cccc(-c3nc(-c4ccccc4)cc(-c4ccccc4)n3)c2)c2ccccc21]
H10 (example compound 16)

TABLE 3-continued

Structural formulae of the materials for the OLEDs

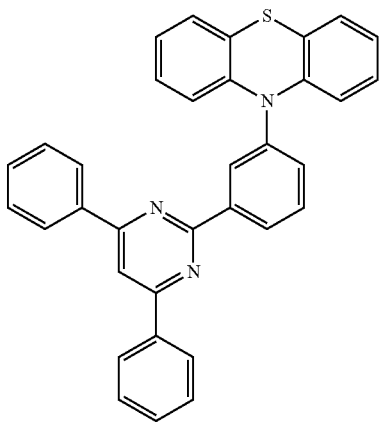 [SMILES: c1ccc(-c2cc(-c3ccccc3)nc(-c3cccc(N4c5ccccc5Sc5ccccc54)c3)n2)cc1]

H11 (example compound 21)

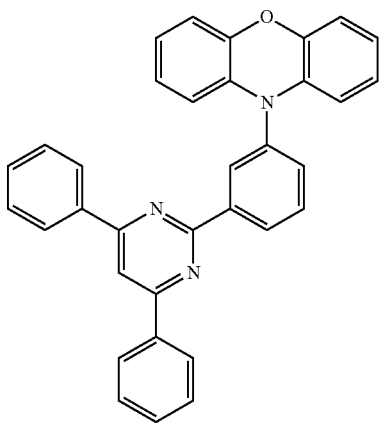 [SMILES: c1ccc(-c2cc(-c3ccccc3)nc(-c3cccc(N4c5ccccc5Oc5ccccc54)c3)n2)cc1]

H12 (example compound 22)

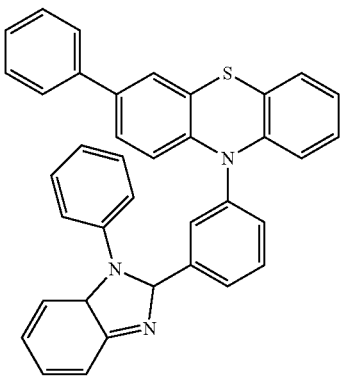 [SMILES: C1=CC2=NC(c3cccc(N4c5ccccc5Sc5cc(-c6ccccc6)ccc54)c3)N(c3ccccc3)C2C=C1]

H13 (example compound 20)

TABLE 3-continued

Structural formulae of the materials for the OLEDs

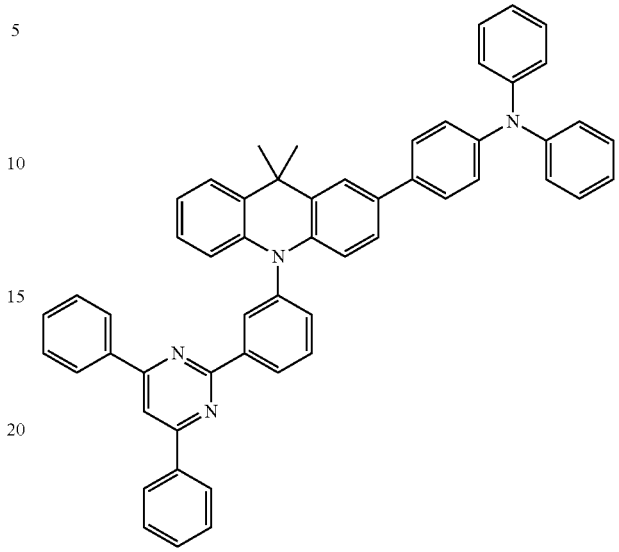

H14 (example compound 18)

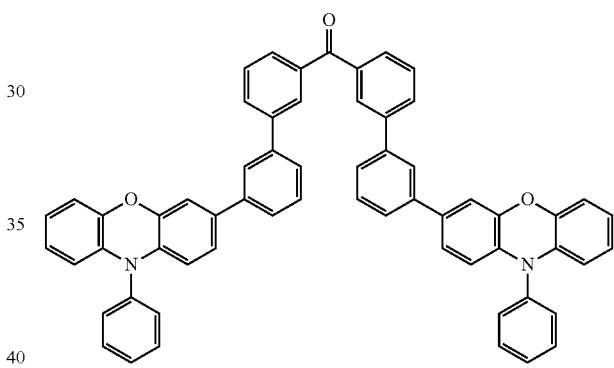

H15 (example compound 7)

The invention claimed is:
1. A compound of a formula (I)

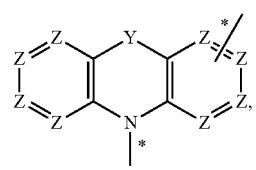

formula (I)

where a group of the formula (II)

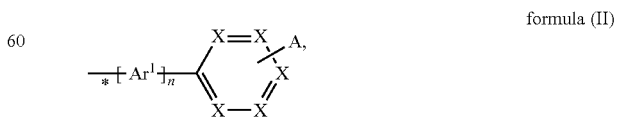

formula (II)

is bonded via at least one of the bonds denoted by *, where * in formula (II) in turn denotes the bond to the unit of the formula (I), and where, in formula (I), for the case where no group of the formula (II) is bonded to the bond denoted by *, a radical $R^2$ is bonded there,
and where the following applies to the symbols and indices occurring:
A is on each occurrence, identically or differently, represents a group of formula (A-1):

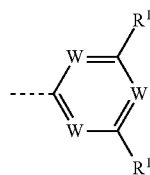

formula (A-1)

where the dashed bond represents the bond to the unit of the formula (II), W represents on each occurrence, identically or differently, $CR^1$ or N, where at least one group W is equal to N;
Y is $C(R^2)_2$;
X is on each occurrence CH or X is C when the group A bonded thereto;
Z is on each occurrence, identically or differently, $CR^2$ or N;
$Ar^1$ is an aromatic or heteroaromatic ring system having 5 to 30 aromatic ring atoms,
$R^1$ is on each occurrence, identically or differently, H, D, F, Cl, Br, I, $B(OR^3)_2$, CHO, $C(=O)R^3$, $CR^3=C(R^3)_2$, CN, $C(=O)OR^3$, $C(=O)N(R^3)_2$, $Si(R^3)_3$, $NO_2$, $P(=O)(R^3)_2$, $OSO_2R^3$, $OR^3$, $S(=O)R^3$, $S(=O)_2R^3$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^3$ and where one or more $CH_2$ groups in the above-mentioned groups is optionally replaced by $-R^3C=CR^3-$, $-C\equiv C-$, $Si(R^3)_2$, $C=O$, $C=S$, $C=NR^3$, $-C(=O)O-$, $-C(=O)NR^3-$, $NR^3$, $P(=O)(R^3)$, $-O-$, $-S-$, $SO$ or $SO_2$ and where one or more H atoms in the above-mentioned groups is optionally replaced by D, F, Cl, Br, I, CN or $NO_2$, or an aromatic ring system having 6 to 30 aromatic ring atoms, which may in each case be substituted by one or more radicals $R^3$, or an aryloxy group having 6 to 30 aromatic ring atoms, which is optionally substituted by one or more radicals $R^3$, where two or more radicals $R^1$ is optionally linked to one another and optionally forms a ring;
$R^2$ is on each occurrence, identically or differently, H, D, F, Cl, Br, I, $B(OR^3)_2$, CHO, $C(=O)R^3$, $CR^3=C(R^3)_2$, CN, $C(=O)OR^3$, $C(=O)N(R^3)_2$, $Si(R^3)_3$, $N(R^3)_2$, $NO_2$, $P(=O)(R^3)_2$, $OSO_2R^3$, $OR^3$, $S(=O)R^3$, $S(=O)_2R^3$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^3$ and where one or more $CH_2$ groups in the above-mentioned groups is optionally replaced by $-R^3C=CR^3-$, $-C\equiv C-$, $Si(R^3)_2$, $C=O$, $C=S$, $C=NR^3$, $-C(=O)O-$, $-C(=O)NR^3-$, $NR^3$, $P(=O)(R^3)$, $-O-$, $-S-$, $SO$ or $SO_2$ and where one or more H atoms in the above-mentioned groups is optionally replaced by D, F, Cl, Br, I, CN or $NO_2$, or an aromatic or heteroaromatic ring system having 5 to 30 aromatic ring atoms, which may in each case be substituted by one or more radicals $R^3$, or an aryloxy or heteroaryloxy group having 5 to 60 aromatic ring atoms, which is optionally substituted by one or more radicals $R^3$;
$R^3$ is on each occurrence, identically or differently, H, D, F, Cl, Br, I, $B(OR^4)_2$, CHO, $C(=O)R^4$, $CR^4=C(R^4)_2$, CN, $C(=O)OR_4$, $C(=O)N(R^4)_2$, $Si(R^4)_3$, $N(R^4)_2$, $NO_2$, $P(=O)(R^4)_2$, $OSO_2R^4$, $OR^4$, $S(=O)R^4$, $S(=O)_2R^4$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^4$ and where one or more $CH_2$ groups in the above-mentioned groups is optionally replaced by $-R^4C=CR^4-$, $-C\equiv C-$, $Si(R^4)_2$, $C=O$, $C=S$, $C=Se$, $C=NR^4$, $-C(=O)O-$, $-C(=O)NR^4-$, $NR^4$, $P(=O)(R^4)$, $-O-$, $-S-$, $SO$ or $SO_2$ and where one or more H atoms in the above-mentioned groups is optionally replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which is optionally substituted by one or more radicals $R^4$, where two or more radicals $R^3$ is optionally linked to one another and optionally forms a ring;
$R^4$ is on each occurrence, identically or differently, H, D, F or an aliphatic, aromatic or heteroaromatic organic radical having 1 to 20 C atoms, in which, in addition, one or more H atoms is optionally replaced by D or F; two or more substituents $R^4$ here is optionally linked to one another and optionally forms a ring;
n is on each occurrence, identically or differently, 0, 1, 2 or 3;
and
where furthermore the group A is bonded to the aromatic six-membered ring in the meta- or ortho-position if the group of formula (II) is bonded to the nitrogen atom in formula (I).

2. The compound according to claim 1, wherein the compound contains no further amino group in addition to the amino group shown in foimula (I).

3. The compound according to claim 1, wherein the group $Ar^1$ represents an aromatic ring system having 6 to 18 aromatic ring atoms or a heteroaromatic ring system having 5 to 18 aromatic ring atoms.

4. The compound according to claim 1, wherein not more than one group Z per aromatic six-membered ring is equal to N.

5. The compound according to claim 1, wherein $R^1$ is selected on each occurrence, identically or differently, from H, D, F, CN, $Si(R^3)_3$ or a straight-chain alkyl or alkoxy group having 1 to 10 C atoms or a branched or cyclic alkyl or alkoxy group having 3 to 10 C atoms, where the above-mentioned groups may each be substituted by one or more radicals $R^3$ and where one or more $CH_2$ groups in the above-mentioned groups is optionally replaced by $-C\equiv C-$, $-R^3C=CR^3-$, $Si(R^3)_2$, $C=O$, $C=NR^3$, $-NR^3-$, $-O-$, $-S-$, $-C(=O)O-$ or $-C(=O)NR^3-$, or an aromatic ring system having 6 to 24 aromatic ring atoms, which is optionally substituted by one or more radicals R³, where two or more radicals R¹ is optionally linked to one another and may form a ring.

6. The compound according to claim 1, wherein the groups R¹ which are not bonded to a group A are equal to H.

7. The compound according to claim 1, wherein the compound of the formula (I) has a structure of one of the following formula (I-1) or (I-6):

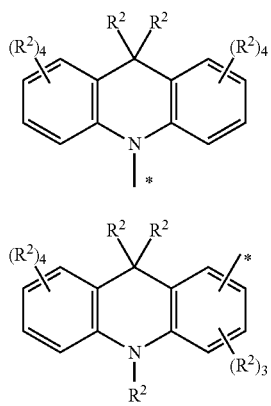

formula (I-1)

formula (I-6)

where a group of the formula (II) is bonded via the bond denoted by *, and where furthermore R² is as defined in claim 1.

8. A formulation comprising at least one compound according to claim 1 and at least one solvent.

9. A process for the preparation of the compound according to claim 1, which comprises at least one group containing a structure of the formula (II) according to claim 1 is introduced in a metal-catalysed coupling reaction.

10. An electronic device comprising at least one compound according to claim 1.

11. The electronic device as claimed in claim 10, wherein the device is selected from the group consisting of organic integrated circuit, organic field-effect transistor, organic thin-film transistor, organic light-emitting transistor, organic solar cell, organic optical detector, organic photoreceptor, organic field-quench device, light-emitting electrochemical cell, organic laser diode and organic electroluminescent device.

12. An organic electroluminescent device which comprises the compound according to claim 1 is present as matrix material in an emitting layer and/or as electron-transport material in an electron-transport or electron-injection layer and/or as hole-blocking material in a hole-blocking layer.

13. An oligomer, polymer or dendrimer containing one or more compounds according to claim 1, where the bonds) to the polymer, oligomer or dendrimer is optionally localised at any positions which are substituted by R¹, R² or R³ in formula (I).

14. A formulation comprising at least one polymer, oligomer or dendrimer according to claim 13 and at least one solvent.

15. An electronic device comprising at least one polymer, dendrimer or oligomer according to claim 13.

16. An organic electroluminescent device which comprises the oligomer according to claim 13 is present as matrix material in an emitting layer and/or as electron-transport material in an electron-transport or electron-injection layer and/or as hole-blocking material in a hole-blocking layer.

* * * * *